(12) United States Patent
Yamamoto et al.

(10) Patent No.: US 7,531,294 B2
(45) Date of Patent: May 12, 2009

(54) METHOD FOR FORMING FILM PATTERN, METHOD FOR MANUFACTURING SEMICONDUCTOR DEVICE, LIQUID CRYSTAL TELEVISION, AND EL TELEVISION

(75) Inventors: Yoshiaki Yamamoto, Kanagawa (JP);
Hiroko Yamamoto, Kanagawa (JP);
Yukie Suzuki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 533 days.

(21) Appl. No.: 11/087,829

(22) Filed: Mar. 24, 2005

(65) Prior Publication Data

US 2005/0214688 A1    Sep. 29, 2005

(30) Foreign Application Priority Data

Mar. 25, 2004    (JP)    ............................. 2004-090377

(51) Int. Cl.
*G03F 9/00*    (2006.01)
*G03F 7/00*    (2006.01)

(52) U.S. Cl. .................. 430/311; 430/328; 430/330; 430/313; 430/323

(58) Field of Classification Search ................ 430/322, 430/330, 323, 324, 313, 316, 317, 318, 328
See application file for complete search history.

(56) References Cited

U.S. PATENT DOCUMENTS

| | | | |
|---|---|---|---|
| 4,152,624 A * | 5/1979 | Knaebel | 313/499 |
| 4,689,291 A * | 8/1987 | Popovic et al. | 430/321 |
| 5,892,562 A | 4/1999 | Yamazaki et al. | |
| 6,416,583 B1 | 7/2002 | Kitano et al. | |
| 6,627,263 B2 | 9/2003 | Kitano et al. | |
| 6,633,351 B2 * | 10/2003 | Hira et al. | 349/95 |
| 6,715,871 B2 | 4/2004 | Hashimoto et al. | |
| 7,176,069 B2 | 2/2007 | Yamazaki et al. | |
| 2002/0136829 A1 | 9/2002 | Kitano et al. | |
| 2002/0146893 A1 | 10/2002 | Shimoda et al. | |

(Continued)

FOREIGN PATENT DOCUMENTS

EP    0691688    * 10/1996

(Continued)

OTHER PUBLICATIONS

D. A. Fletcher et al.; Near-field Infrared Imaging with a Microfabricated Solid Immersion Lens,"Applied Physics Letters," vol. 77, No. 14; Oct. 2, 2000; pp. all.*

(Continued)

*Primary Examiner*—Mark F Huff
*Assistant Examiner*—Caleen O Sullivan
(74) *Attorney, Agent, or Firm*—Nixon Peabody LLP; Jeffrey L. Costellia

(57) ABSTRACT

An object of the invention is to provide a method for manufacturing a semiconductor device having a semiconductor element with a minute structure, which can reduce a cost and improve throughput due to a small number of steps and reduction in a material. One feature of the invention is to form a first film pattern over a substrate, form a second film pattern which is curved on the surface of the first film pattern or the substrate, and form a film pattern by irradiating the first film pattern with light with the second film pattern therebetween and modifying part of the second film pattern.

48 Claims, 43 Drawing Sheets

U.S. PATENT DOCUMENTS

| | | |
|---|---|---|
| 2003/0030689 A1 | 2/2003 | Hashimoto et al. |
| 2003/0054295 A1* | 3/2003 | Li ............................ 430/321 |
| 2003/0083203 A1 | 5/2003 | Hashimoto et al. |
| 2003/0108365 A1* | 6/2003 | Kabai ........................ 399/297 |
| 2003/0215634 A1 | 11/2003 | Hattori et al. |
| 2004/0027675 A1* | 2/2004 | Wu et al. .................... 359/619 |
| 2004/0234678 A1* | 11/2004 | Hirai et al. ................... 427/58 |
| 2005/0196711 A1 | 9/2005 | Shiroguchi et al. |
| 2006/0141619 A1 | 6/2006 | Hattori et al. |

FOREIGN PATENT DOCUMENTS

| | | |
|---|---|---|
| EP | 1 087 428 | 3/2001 |
| JP | 06-095386 * | 4/1994 |
| JP | 2000-188251 | 7/2000 |
| JP | 2001-179167 | 7/2001 |

OTHER PUBLICATIONS

English translation of JP 06-095386 (Apr. 1994).*

* cited by examiner

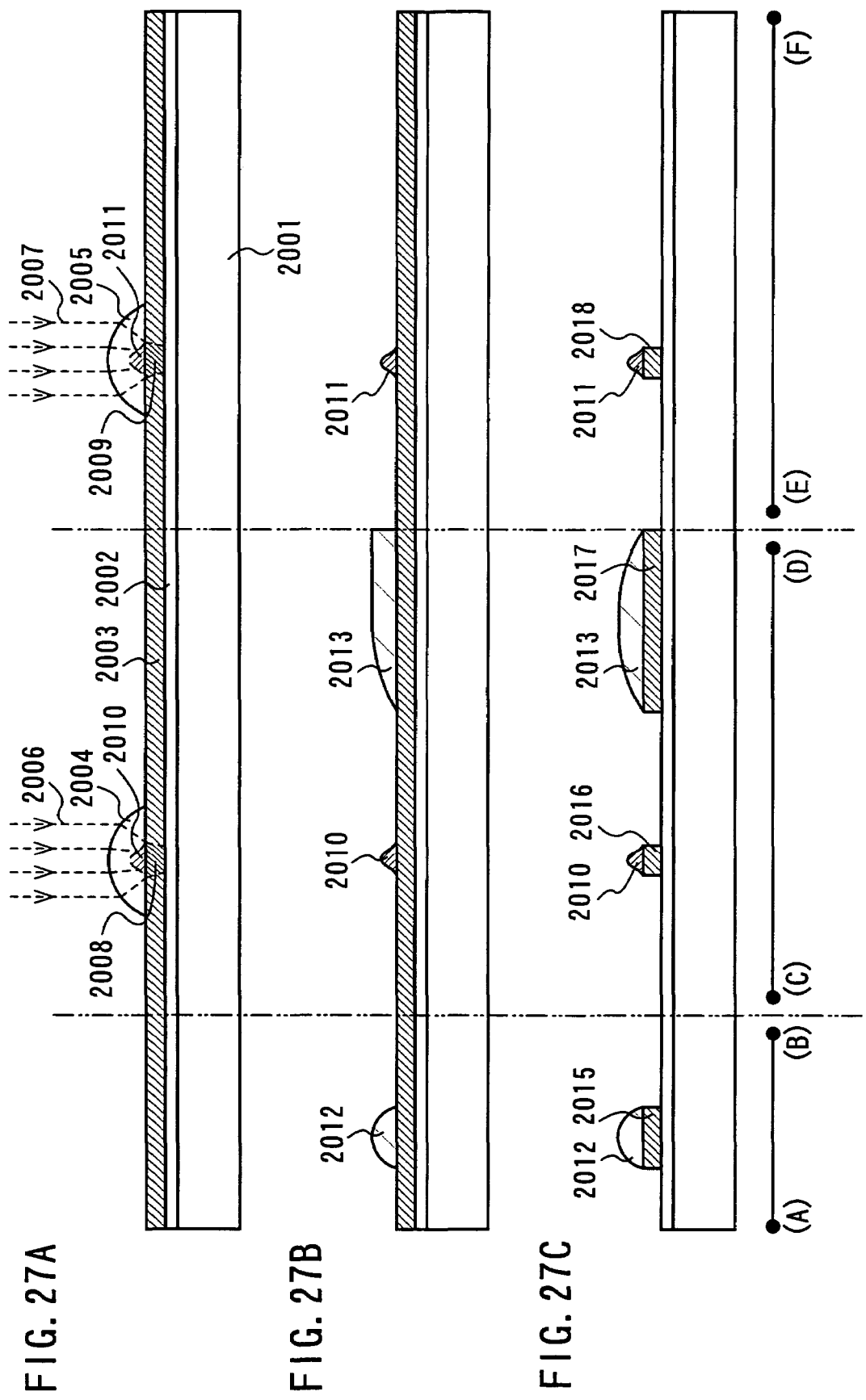

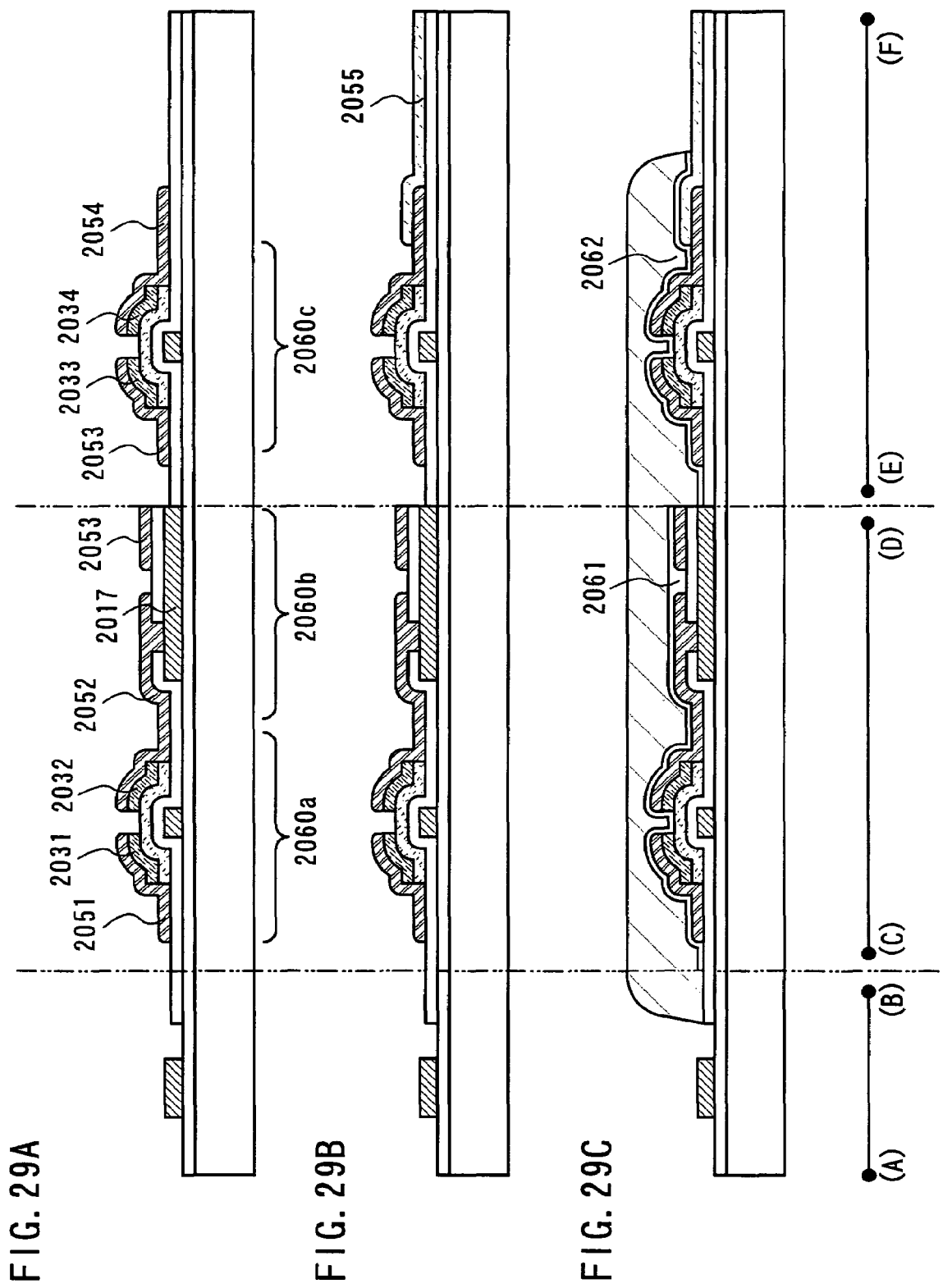

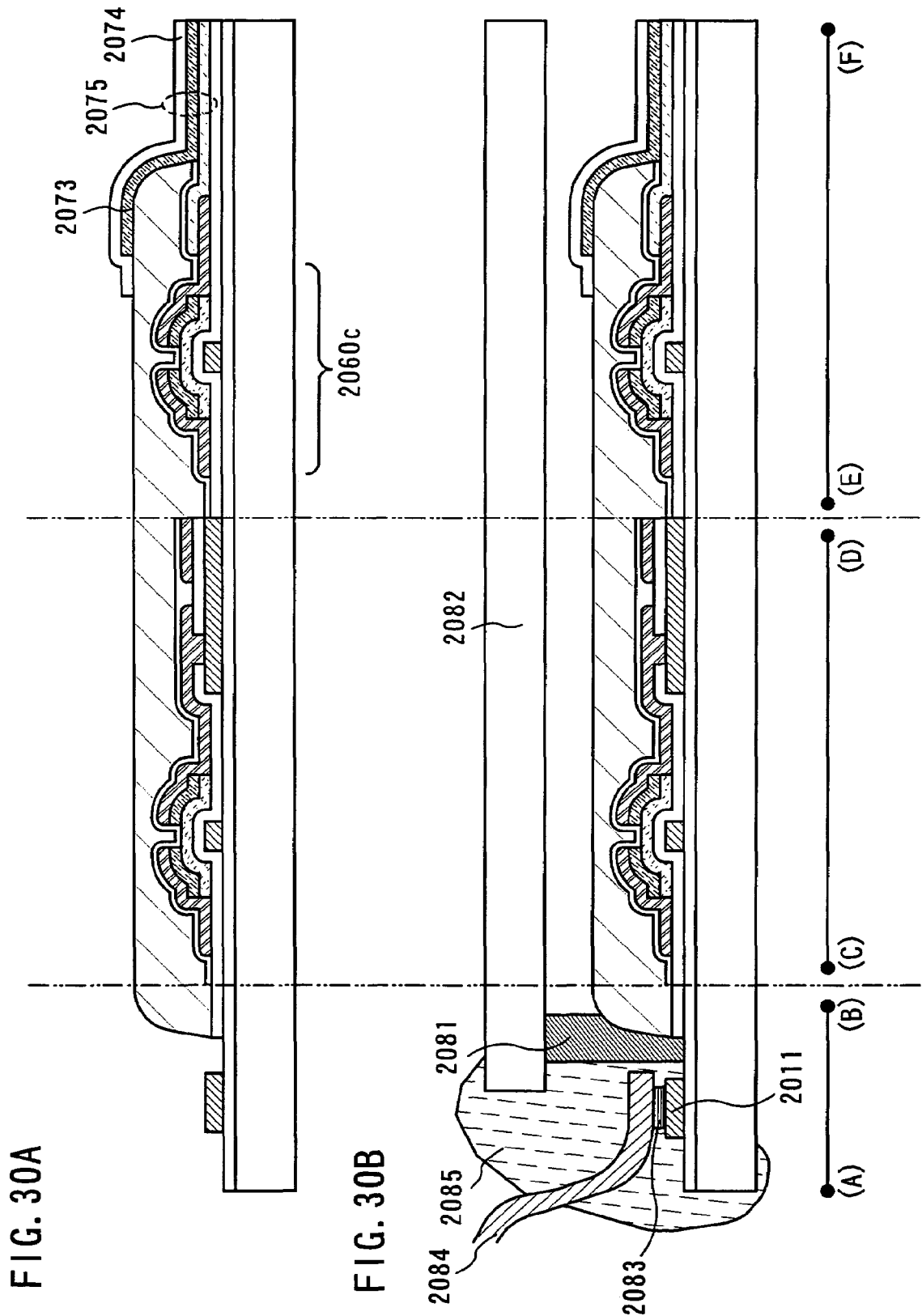

METHOD FOR FORMING FILM PATTERN, METHOD FOR MANUFACTURING SEMICONDUCTOR DEVICE, LIQUID CRYSTAL TELEVISION, AND EL TELEVISION

BACKGROUND OF THE INVENTION

1. Field of the Invention

The present invention relates to a method for forming a film pattern by using a droplet discharge method typified by an ink-jet method, and a method for manufacturing a semiconductor device.

2. Description of the Related Art

A so-called active matrix drive display panel including a semiconductor element typified by a thin film transistor (hereinafter, also referred to as a "TFT") over a glass substrate, or a semiconductor integrated circuit is manufactured by patterning various thin films according to a light exposure step using a photomask (hereinafter, referred to as a photolithography step).

In the photolithography step, a resist pattern is formed by applying a resist to an entire surface of a substrate, prebaking, irradiating with ultraviolet light or the like with a photomask therebetween, and then developing. Then, a film pattern is formed by etching and removing a thin film (a film formed of a semiconductor material, an insulating material, or a conductive material) in a portion not to be a film pattern using the resist pattern as a mask pattern to perform patterning on the thin film.

Reference 1 discloses a technique for forming a film over a semiconductor wafer by using an apparatus which can continuously discharge a resist from a nozzle to be a linear shape with a fine diameter in order to reduce the loss of a material required for film formation (Reference 1: Japanese Patent Laid-Open No. 2000-188251).

However, a conventional step of forming a film pattern using a photolithography step has a problem of reducing throughput due to a number of steps of forming a mask pattern, as well as wasting most of the material of a film pattern and a resist.

A photolithography apparatus used for the photolithography step has difficulty in performing light exposure treatment on a large-sized substrate at a time. Therefore, a method for manufacturing a semiconductor device using a large-sized substrate has a problem of needing to perform light exposure plural times and generating unconformity among adjacent patterns, thereby reducing a yield.

It is necessary to discharge a solution with a small droplet diameter in order to form a minute semiconductor element which occupies small area by a droplet discharge method. A diameter of a discharge opening is made small for this purpose. However, in that case, a composition of a discharge solution may be attached to the discharge opening, dried, and solidified; accordingly, a clogged opening or the like may be caused. Thus, it is difficult to continuously and stably discharge a certain amount of discharge solution. Consequently, there is a problem of causing a decrease in a throughput or a yield of a semiconductor device formed with the semiconductor element.

SUMMARY OF THE INVENTION

The present invention is made in view of the foregoing problems, and it is an object of the invention to provide a new method for forming a film pattern, by which a large-sized substrate can be treated in a small number of steps.

In addition, it is another object of the invention to provide a method for manufacturing a semiconductor device having a semiconductor element with a minute structure, which can reduce a cost and improve throughput due to a small number of steps and reduction in a material, and a liquid crystal television and an EL television.

One main point of the invention is to form a second film pattern which is curved and transmits light on the surface of a light absorbing first film pattern and to form a third film pattern by irradiating the second film pattern with light and modifying part of the first film pattern or the second film pattern.

Another main point of the invention is to provide a convex optical system which condenses light to the surface of a light absorbing first film pattern and to form a second film pattern by irradiating the first film pattern with the light condensed by the optical system and modifying part of the first film pattern or the convex optical system.

One feature of the invention is to form a first film pattern over a substrate, form a second film pattern which is curved on the surface of the first film pattern or the substrate, irradiate the second film pattern to condense the light, generate heat by irradiating the first film pattern with the condensed light, modify the second film pattern by the heat, form a third film pattern by removing an unmodified region of the second film pattern, and form a fourth film pattern by etching the first film pattern using the third film pattern. Note that the second film pattern is formed of a thermosetting material.

Another feature of the invention is to form a first film pattern over a substrate, form a second film pattern which is curved on the surface of the first film pattern or the substrate, irradiate the second film pattern with light to condense the light, generate heat by irradiating the first film pattern with the condensed light, modify the second film pattern by the heat, form a third film pattern by removing the modified region, and form a fourth film pattern by etching the first film pattern using the third film pattern. Note that the second film pattern is formed of a thermoplastic material.

The first film pattern preferably has higher band gap energy than energy per photon of light to be emitted thereto. In other words, the first film pattern preferably absorbs light. The second film pattern preferably has lower band gap energy than energy per photon of light to be emitted thereto. In other words, the second film pattern preferably transmits light.

Light transmitted through the second film pattern is absorbed by the first film pattern. Energy per photon of the light absorbed by the first film pattern is converted into heat energy by the first film pattern. When the second film pattern is formed of a thermoplastic or thermosetting resin, the third film pattern is formed by modifying (plasticizing or curing) part of the second film pattern using the heat and the fourth film pattern is formed by etching the first film pattern making the third film pattern function as a mask pattern.

Light energy per photon can be converted into heat in a region having an arbitrary shape by appropriately controlling the spot size and light intensity of the light emitted to the first film pattern, and the film thickness, absorption coefficient, and thermal conductivity of the first film pattern. Typically, in the case where the first film pattern has low thermal conductivity, light energy per photon can be converted into heat in a narrower region than a light spot on the irradiation surface. In the case where the light absorbing layer has high thermal conductivity, light energy per photon can be converted into heat in a wider region than a light spot. Accordingly, part of the second film pattern which is curved and formed in contact with the first film pattern can be modified by the heat. In other words, plasticizing or curing of the second film pattern can be promoted. Thus, a film pattern having an arbitrary shape, typically, a minute film pattern beyond the light diffraction limit can be formed without using a photomask.

The surface of the second film pattern is curved. Therefore, light transmitted through the film pattern is condensed to be light having a small spot diameter. Thus, the first film pattern can be irradiated with light having a smaller spot.

Another feature of the invention is to form a first film pattern over a substrate, form a second film pattern over the first film pattern, form a third film pattern which is curved on the surface of the second film pattern, irradiate the third film pattern with light to condense the light, expose part of the second film pattern to light by irradiating the second film pattern with the condensed light, remove the third film pattern, form a fourth film pattern by removing a light unexposed region of the second film pattern, and form a fifth film pattern by etching the first film pattern using the fourth film pattern. Note that the second film pattern is formed of a negative-type photosensitive material.

Another feature of the invention is to form a first film pattern over a substrate, form a second film pattern over the first film pattern, form a third film pattern which is curved on the surface of the second film pattern, irradiate the third film pattern with light to condense the light, expose part of the second film pattern to light by irradiating the second film pattern with the condensed light, remove the third film pattern, form a fourth film pattern by removing the light exposed region of the second film pattern, and form a fifth film pattern by etching the first film pattern using the fourth film pattern. Note that the second film pattern is formed of a positive-type photosensitive material.

The second film pattern is preferably formed of a photosensitive material and preferably absorbs light. The third film pattern preferably transmits light. Light transmitted through the third film pattern is absorbed by the second film pattern. Since the second film pattern is formed of a photosensitive material, part of the second film pattern is modified (cured or plasticized) by the absorbed light and the fourth film pattern is formed.

The surface of the third film pattern is curved. Therefore, light transmitted through the film pattern is condensed to be light having a small spot diameter. Thus, the second film pattern can be irradiated with light having a smaller spot.

Light having any wavelength of ultraviolet light, visible light, infrared light, and the like is used in the invention. Light emitted from a halogen lamp, a metal halide lamp, a xenon arc lamp, a carbon arc lamp, a high pressure sodium lamp, a high pressure mercury lamp, an incandescent lamp, a fluorescent lamp, an ultraviolet lamp, or an infrared lamp, light emitted from a laser oscillator, or the like can be used as such light.

An excimer laser oscillator of KrF, ArF, XeCl, Xe, or the like, a gas laser oscillator of He, He—Cd, Ar, He—Ne, HF, or the like, a solid laser oscillator using crystal such as YAG, $GdVO_4$, $YVO_4$, YLF, or $YAlO_3$ doped with Cr, Nd, Er, Ho, Ce, Co, Ti, or Tm, a semiconductor laser oscillator of GaN, GaAs, GaAlAs, InGaAsP, or the like can be used as a typical laser oscillator.

According to the invention, in a semiconductor device in which at least one or more of necessary patterns for manufacturing a semiconductor device such as a conductive layer for forming a wiring layer or an electrode, a semiconductor region, and a mask layer for forming a predetermined pattern is/are formed by a method which can selectively form a pattern, the gate electrode has a width of 0.1 μm to 10 μm.

As the method which can selectively form a pattern, the first film pattern having predetermined light transmitting property and curvature is formed by selectively discharging a solution of a composition mixed for a specific purpose over a light absorbing layer by a droplet discharge method (also referred to an ink-jet method, depending on its mode), heat is generated by irradiating the light absorbing layer with light transmitted through the film pattern, and the second film pattern is formed by heating part of the first film pattern using the heat.

As another method which can selectively form a pattern, a layer formed of a photosensitive material over the first film pattern, the second film pattern having predetermined light transmitting property and curvature is formed by selectively discharging a solution of a composition mixed for a specific purpose thereover, and the third film pattern is formed by irradiating the layer formed of a photosensitive material with light transmitted through the second film pattern to perform light exposure.

In the invention, a semiconductor device includes an integrated circuit, a display device, an RFID tag, an IC tag, and the like having a semiconductor element. The display device typically includes a liquid crystal display device, a light-emitting display device, a DMD (Digital Micromirror Device), a PDP (Plasma Display Panel), a FED (Field Emission Display), an electrophoretic display device (electronic paper), and the like. Note that a TFT includes a staggered TFT and an inversely staggered TFT (a channel etch TFT or a channel protective TFT).

In the invention, the display device means a device with a display element, that is, an image display device. Further, the display device includes: a module having a display panel attached with a connector such as an FPC (Flexible Printed Circuit), a TAB (Tape Automated Bonding) tape, or a TCP (Tape Carrier Package); a module having a TAB tape or a TCP provided with a printed wiring board at the end thereof; and a module having a display element directly mounted with an IC (Integrated Circuit) or a CPU by a COG (Chip On Glass) method.

When a droplet discharge method is employed to form a film pattern such as a conductive layer for forming a wiring layer or an electrode of a semiconductor element, a semiconductor region, or a mask layer for forming a predetermined pattern, a droplet can be discharged to an arbitrary position by changing a relative position of a discharge opening of a droplet including a material of the film pattern and a substrate. In addition, a thickness and a width of a pattern to be formed can be adjusted depending on a discharge opening diameter, the discharge amount of droplets, and a relative relationship between movement speed of a discharge opening and that of a substrate. Accordingly, a film pattern can be discharged to a desired portion with high accuracy even over a large-sized substrate having a side of 1 m to 2 m or more.

A light absorbing film pattern is irradiated with light condensed by a light transmitting curved film pattern, energy per photon of the light is converted into heat energy, and a mask pattern is formed using the heat energy. Thus, a film pattern having a desired shape can be formed without using a photomask.

Since a light transmitting film pattern has a higher refractive index than air, light transmitted through the film pattern is condensed. When light is transmitted through a curved film pattern, the light is condensed to the center of the film pattern. Accordingly, light having an extremely minute spot beyond the diffraction limit in the air can be formed. In other words, a minute film pattern can be formed by using energy per photon of the light. In the case of using laser light as the light, light intensity becomes high in a smaller region than a light spot. Therefore, the smaller region than a light spot can be locally irradiated with the light. Thus, fine processing of a film pattern can be performed without narrowing a light spot diameter with the use of a complex optical system, and a semiconductor element having a minute structure can be formed. A semiconductor element having a minute structure and increased W/L can be formed. Therefore, a semiconductor device having high drive capacity can be manufactured at low cost with high throughput and yield. Further, a semiconductor device such as a highly integrated circuit or a display device having a high aperture ratio, or a liquid crystal television or an EL television including the same can be manufactured at low cost with high throughput and yield by using a minute semiconductor element.

BRIEF DESCRIPTION OF DRAWINGS

FIGS. 27A to 27C are cross-sectional views showing a step of manufacturing a semiconductor device according to the present invention.

FIGS. 29A to 29C are cross-sectional views showing a step of manufacturing a semiconductor device according to the present invention.

FIGS. 30A and 30B are cross-sectional views showing a step of manufacturing a semiconductor device according to the present invention.

DETAILED DESCRIPTION OF THE INVENTION

Figure 1A:
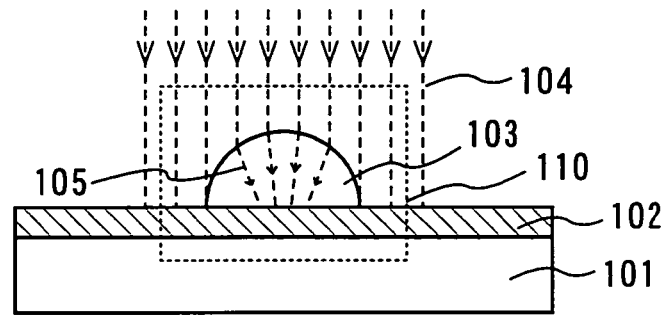
FIGS. 1A to 1E are cross-sectional views showing a step of manufacturing a film pattern according to the present invention.

Hereinafter, the best mode for carrying out the invention is described with reference to drawings. However, the present invention is not limited to the following description. As is easily known to a person skilled in the art, the mode and the detail of the invention can be variously changed without departing from the purpose and the scope of the present invention. The present invention is not interpreted while limiting to the following description of the embodiment mode. In addition, the same reference numeral is given to a common portion in each drawing, and detailed description is omitted.

Embodiment Mode 1

A step of forming a film pattern by heat which is generated by absorption of light energy per photon into a light absorbing film pattern is described in this embodiment mode with reference to FIGS. 1A to 1E and FIG. 8.

As shown in FIG. 1A, a first film pattern 102 is formed over a substrate 101, and a second film pattern 103 which is curved is formed over the first film pattern 102. Then, the first film pattern 102 and the second film pattern 103 are irradiated with light 104.

The second film pattern is curved at least at a top portion and in its vicinity, and the whole second film pattern is preferably hemispherical like a convex lens. The second film pattern is preferably highly curved in order to increase the condensing ratio of light to be emitted thereto and form a smaller spot. Note that a region of the first film pattern 102 where the second film pattern 103 is formed is irradiated with light 105 transmitted through the second film pattern.

A glass substrate, a quartz substrate, a substrate formed of an insulating material such as ceramic, for example, alumina or the like, a heat-resistant plastic substrate which can withstand a processing temperature of a later step, a silicon wafer, a metal plate, or the like can be used as the substrate 101. In addition, a large-sized substrate of 320 mm×400 mm, 370 mm×470 mm, 550 mm×650 mm, 600 mm×720 mm, 680 mm×880 mm, 1000 mm×1200 mm, 1100 mm×1250 mm, 1150 mm×1300 mm, or the like can be used as the substrate 101.

In the case of using the plastic substrate as the substrate 101, it is preferable to use a substrate having a relatively high glass transition point, such as a PC (polycarbonate) substrate, a PES (polyethylene sulfone) substrate, a PET (polyethylene terephthalate) substrate, or a PEN (polyethylene naphthalate) substrate. In addition, it is preferable to thickly form the first film pattern in order to prevent the first film pattern from conducting heat generated by laser light irradiation to the substrate side and prevent the substrate from being deformed due to the heat.

The first film pattern 102 is formed of a material which can absorb light to be emitted thereto. Typically, the first film pattern 102 is formed of an insulating material, a conductive material, or a semiconductor material which can absorb any of ultraviolet light, visible light, and infrared light.

Absorption of light is a phenomenon which occurs when light energy per photon (hv) is higher than band gap energy (Eg) of a light absorbing material. Letting light energy per photon be hv and band gap energy of the first film pattern be Eg1 here, the first film pattern is preferably formed of a material having lower band gap energy than light energy per photon (Eg1<hv). Here, the first film pattern is to be irradiated with ultraviolet light, visible light, or infrared light; therefore, the first film pattern is preferably formed of a material having lower band gap energy than light energy per photon which corresponds to the light.

The first film pattern 102 can be typically formed of a single layer of the following: an element of titanium (Ti), aluminum (Al), tantalum (Ta), tungsten (W), molybdenum (Mo), copper (Cu), chromium (Cr), neodymium (Nd), iron (Fe), nickel (Ni), cobalt (Co), ruthenium (Ru), rhodium (Rh), palladium (Pd), osmium (Os), iridium (Ir), silver (Ag), gold (Au), platinum (Pt), cadmium (Cd), zinc (Zn), silicon (Si), germanium (Ge), zirconium (Zr), and barium (Ba); or an alloy material, a nitrogen compound, an oxygen compound, a carbon compound, or a halogen compound containing the element as its main component. A laminated layer thereof can also be used. Alternatively, an insulating film dispersed with particles capable of absorbing light, typically, a silicon oxide film dispersed with silicon microcrystal can be used. Still alternatively, an insulating film in which pigments are dissolved or dispersed in an insulator can also be used. The first film pattern 102 can be formed of a semiconductor material such as amorphous silicon, polysilicon, or silicon containing gallium. In this case, energy of light is preferably controlled so as to prevent the first film pattern from being peeled when the first film pattern is irradiated with the light.

A conductive layer to be a wiring, an electrode, or the like can be formed by using a conductive material for the first film pattern 102. An insulating layer to be a protective film, an interlayer insulating film, a gate insulating film, or the like can be formed by using an insulating material for the first film pattern. Further, an active region of a semiconductor element can be formed by using a semiconductor material for the first film pattern.

Note that the first film pattern 102 may have the shape of a film as well as a pattern. Thus, a droplet discharge method, a printing method, an electrolytic plating method, a PVD (Physical Vapor Deposition) method, or a CVD (Chemical Vapor Deposition) method is used to form the first film pattern 102. In the case of using a droplet discharge method, a droplet is preferably discharged under a reduced pressure or while being irradiated with laser light, thereby evaporating a solvent. After discharging a droplet, the droplet is preferably dried and baked, thereby evaporating a solvent.

The second film pattern 103 is formed of a light transmitting material, in other words, a material which can transmit light to be emitted thereto. Typically, the second film pattern is formed of an insulating material, a conductive material, or a semiconductor material which can transmit any of ultraviolet light, visible light, and infrared light. The higher a refractive index of the material of the second film pattern is, the more the second film pattern condenses light. Therefore, the second film pattern is preferably formed of a material having a high refractive index.

Transmission of light is a phenomenon which occurs when light energy per photon (hv) is lower than band gap energy (Eg) of a light absorbing material. Letting light energy per photon be hv and band gap energy of the second film pattern be Eg2 here, the second film pattern is preferably formed of a material having higher band gap energy than light energy per photon (Eg2>hv). Here, the second film pattern is to be irradiated with ultraviolet light, visible light, or infrared light; therefore, the second film pattern is preferably formed of a material having higher band gap energy than light energy per photon which corresponds to the light.

Polyimide, acrylic, a vinyl acetate resin, polyvinyl acetal, polystyrene, an AS resin, a methacrylic resin, polypropylene, polycarbonate, celluloid, acetyl cellulose plastic, polyethylene, a methyl pentene resin, a vinyl chloride resin, a polyester resin, or a urea resin can be used as a typical material of the second film pattern. PSG (phosphosilicate glass), BPSG (borophosphosilicate glass), silicate-based SOG (Spin on Glass), polysilazane-based SOG, alkoxy silicate-based SOG, or $SiO_2$ having a Si—$CH_3$ bond typified by polymethylsiloxane can also be used. In this embodiment mode, thermosetting polyimide is used.

The second film pattern can be formed by discharging the material by a droplet discharge method and then drying or baking it. Since the second film pattern is convex, it serves as a lens. The higher the curvature of the second film pattern is, the more the second film pattern condenses light. A highly curved film pattern can be formed by discharging a solution having high viscosity by a droplet discharge method. The viscosity of the solution used for a droplet discharge method is preferably in the range of from 5 mPa·s to 20 mPa·s. This is so that the solution can be prevented from drying and smoothly discharged from a discharge opening. The surface tension of the solution is preferably 40 mN/m or less. Note that the viscosity of the solution and the like may be appropriately adjusted in accordance with a solvent to be used and intended use.

The step of discharging a solution may be performed under reduced pressure. This is because the solvent of the solution is evaporated during a period from the point of discharge to the point of landing on an object to be treated, and thus, later steps of drying and baking of the solution can be omitted or shortened. The discharge atmosphere is preferably an oxygen atmosphere, a nitrogen atmosphere, or an atmospheric air.

Note that a layer having a liquid repellent surface is preferably formed over the first film pattern 102 before forming the second film pattern 103. The layer having a liquid repellent surface repels the material of the second film pattern on the surface, and a more highly curved film pattern can be formed. A highly curved film pattern tends to condense light more and is suitable to form a narrower film pattern.

Subsequently, the first film pattern 102 and the second film pattern 103 are irradiated with the light 104. The light is emitted from a halogen lamp, a metal halide lamp, a xenon arc lamp, a carbon arc lamp, a high pressure sodium lamp, a high pressure mercury lamp, an incandescent lamp, a fluorescent lamp, an ultraviolet lamp, or an infrared lamp. Typically, ultraviolet light, visible light, or infrared light, preferably, light having a wavelength of 400 nm to 700 nm can be used.

Since band gap energy of the second film pattern is higher than light energy per photon, the light 104 is not absorbed by the second film pattern and the first film pattern is irradiated with the light. Since the second film pattern 103 is curved and convex, the light 105 transmitted through the second film pattern is condensed. Therefore, a region of the first film pattern where the second film pattern is formed can be selectively irradiated with high-intensity light, even when the substrate is entirely irradiated with the light.

A relation between a refractive index, light transmittance, and intensity reflectance (reflectance relative to light having a certain degree of intensity) of the second film pattern is described hereinafter.

Figure 42:
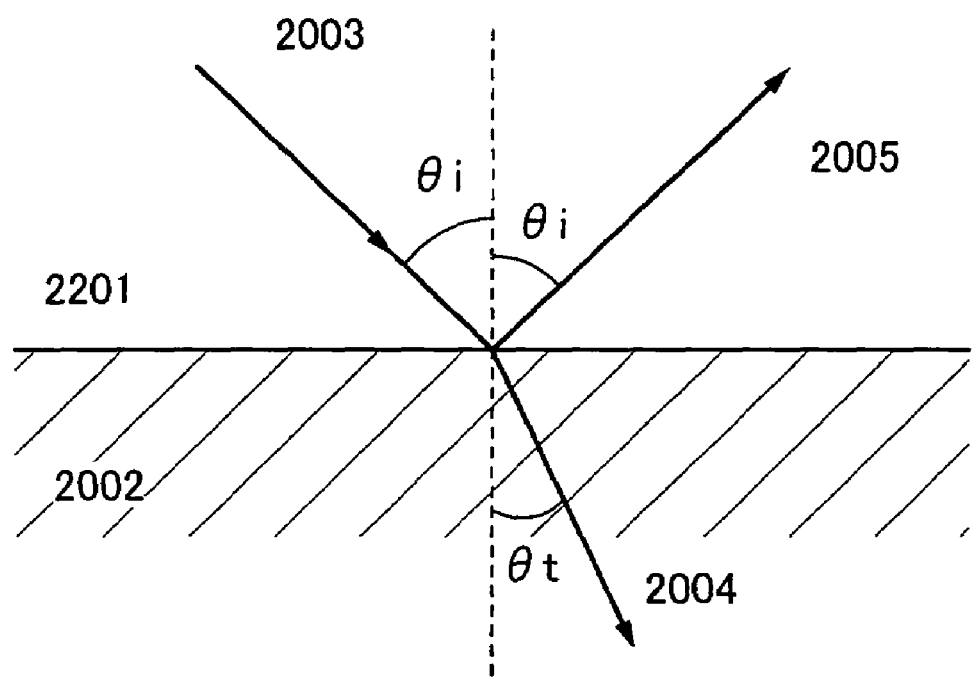
FIG. 42 is a diagram for explaining Snell's law.

According to Snell's law, Formula 1 holds where a refractive index of a first medium 2201 is $n_i$; a refractive index of a second medium 2202, $n_t$; and an incident angle and a refractive angle of light 2203 propagated from the first medium 2201 to the second medium 2202, $\theta_i$ and $\theta_t$ respectively, as shown in FIG. 42.

$$n_i \sin \theta_i = n_t \sin \theta_t \quad \text{(Formula 1)}$$

At this time, according to Stokes's theorem, Formula 2 holds as to P-wave intensity reflectance $R_p$, and Formula 3 holds as to S-wave intensity reflectance $R_s$.

$$R_P = \frac{\tan^2(\theta_i - \theta_t)}{\tan^2(\theta_i + \theta_t)} \quad \text{(Formula 2)}$$

$$R_s = \frac{\sin^2(\theta_i - \theta_t)}{\sin^2(\theta_i + \theta_t)} \quad \text{(Formula 3)}$$

In addition, intensity reflectance R relative to randomly polarized light is an average value of P-wave and S-wave intensity reflectance; therefore, Formula 4 holds.

$$R = \frac{R_p + R_s}{2} \quad \text{(Formula 4)}$$

It is found that the intensity reflectance R depends on the incidence angle $\theta_i$, the refractive index $n_i$ of the first medium 2201, and the refractive index $n_t$ of the second medium, by substitution of Formula 5 obtained from Formula 1 into Formulas 2 to 4.

$$\theta_t = \arcsin\left(\frac{n_i \sin \theta_i}{n_t}\right) \quad \text{(Formula 5)}$$

Figure 43:
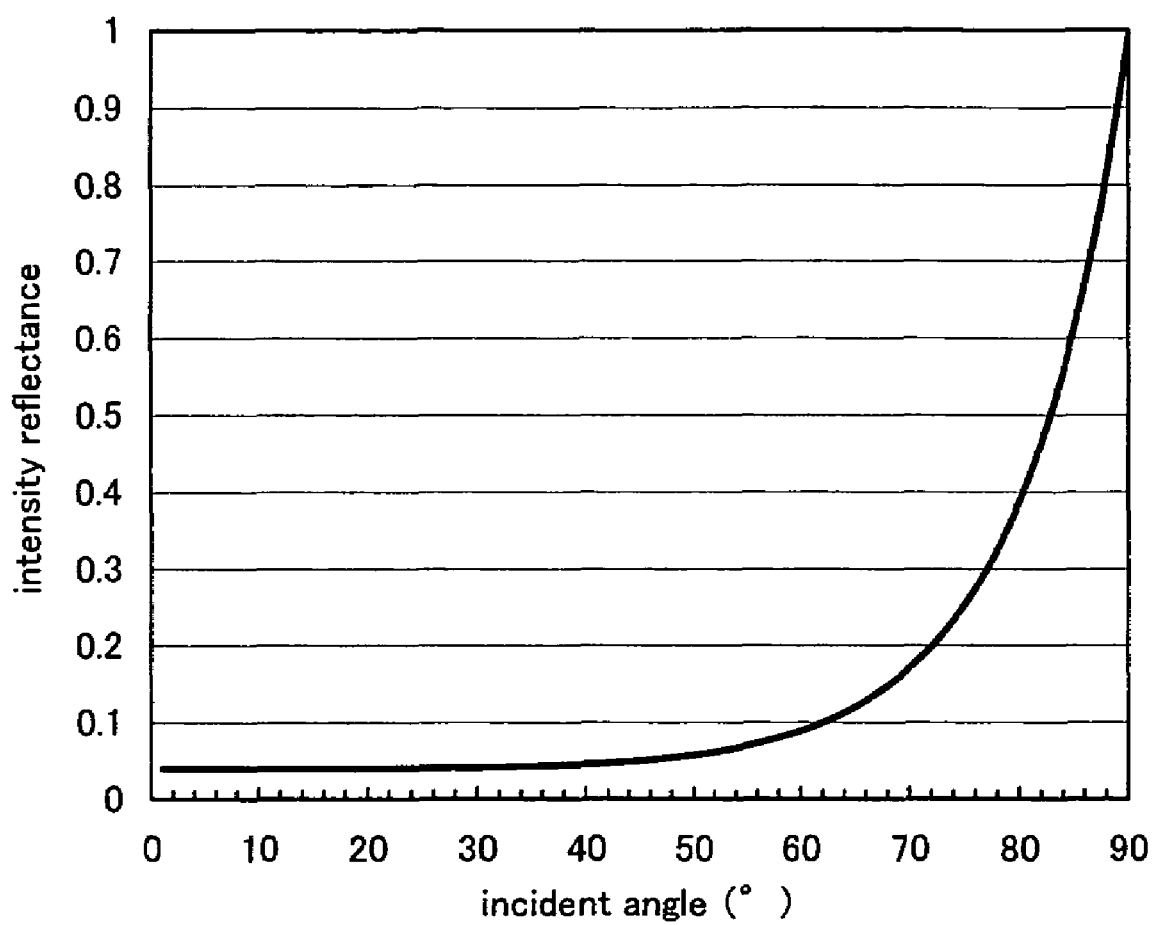
FIG. 43 shows simulation result of light intensity reflectivity.

When light enters the second film pattern, the first medium 2201 is air and the second medium 2202 is the second film pattern. FIG. 43 shows a simulation result of intensity reflectance relative to randomly polarized light at the time of using light having a wavelength of 266 nm and setting the refractive index $n_i$ at 1, and the refractive index $n_t$ at 1.5. FIG. 43 shows that intensity reflectance exponentially increases as the incident angle increases. When intensity reflectance is low, light tends to be more easily transmitted through the second film pattern. Therefore, light having a smaller incident angle tends to be more easily transmitted through the second film pattern. Note that the intensity reflectance also depends on refractive index of the second film pattern and light absorptance of the first film pattern. When the intensity reflectance is preferably 0.4 or less, the incident angle is preferably less than 80°. When the intensity reflectance is preferably 0.3 or less, the incident angle is preferably less than 77°. Further, when the intensity reflectance is preferably 0.2 or less, the incident angle is preferably less than 72°.

In the case of forming a minuter light spot, a light condensing rate is more important than light intensity transmittance for the second film pattern. Therefore, the second film pattern is preferably highly curved. In other words, a contact angle of the second film pattern is preferably large.

Figure 8:
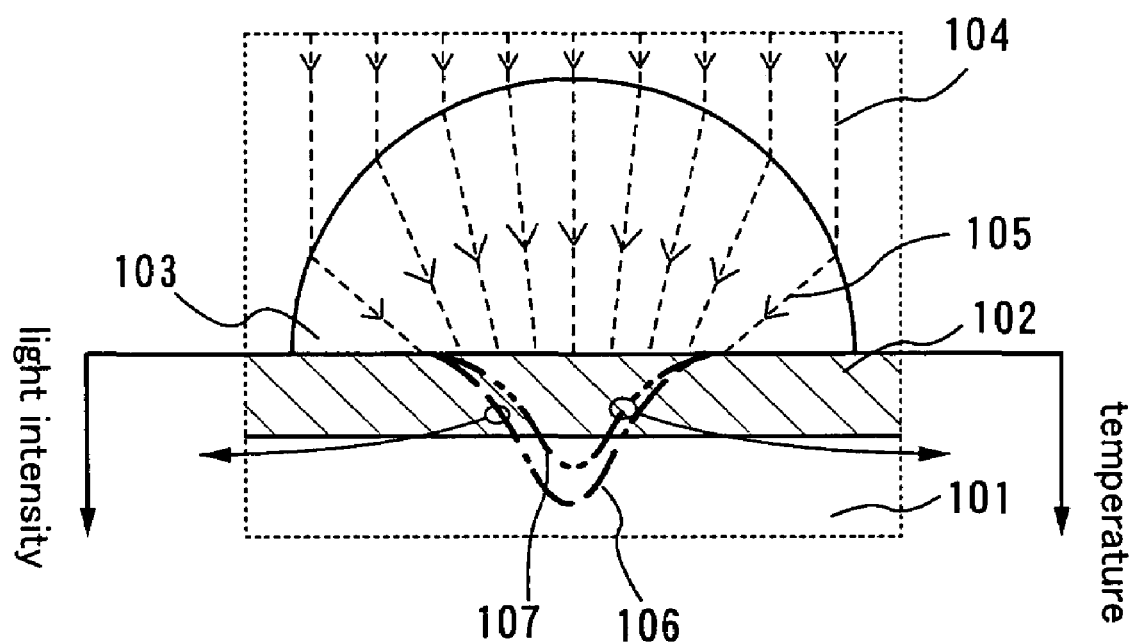
FIG. 8 is a cross-sectional view showing a step of manufacturing a semiconductor device according to the present invention.

An enlarged diagram of a region 110 in FIG. 1A where the first film pattern 102 and the second film pattern 103 are formed is shown in FIG. 8. Since the second film pattern 103 is curved, the light 105 transmitted through the second film pattern 103 is condensed to part of the first film pattern 102. In other words, a conducting direction of light having an incident angle of more than 0° is refracted when it is transmitted through the second film pattern, and the light is conducted to a central portion of the first film pattern 102. Consequently, light intensity 106 on the surface of the first film pattern (at the interface between the first film pattern and the second film pattern) becomes the highest in a region irradiated with the light condensed by the second film pattern.

The condensed light is absorbed by the first film pattern and then converted into heat. In FIG. 8, a surface temperature 107 of the first film pattern is higher in a region having higher light intensity 106. In other words, the surface temperature of the first film pattern is higher in a region where the light 104 is more highly condensed.

Figure 1B:
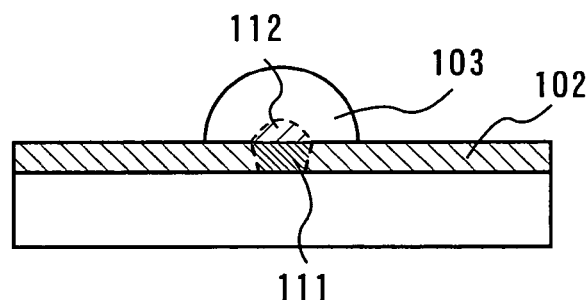

Accordingly, a region 111 irradiated with the condensed light in the first film pattern is heated as shown in FIG. 1B. In addition, the heat is conducted to the second film pattern, and a portion 112 of the second film pattern is heated and modified. Typically, the second film pattern 103 is plasticized or cured.

Figure 1C:
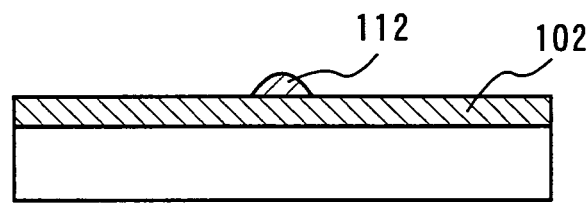

Subsequently, an unmodified region of the second film pattern 103 is removed to expose the modified portion 112 of the second film pattern as shown in FIG. 1C. The region is referred to as a third film pattern 112. A region of the first film pattern to reach a higher temperature than a certain temperature at which the third film pattern can be formed is narrower than a light spot diameter. Thus, the third film pattern has a width of 0.1 μm to 10 μm.

Figure 1D:
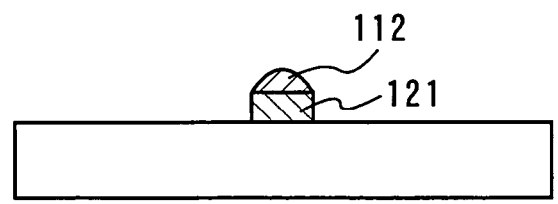

The first film pattern is etched using the third film pattern 112 as a mask to form a fourth film pattern 121 as shown in FIG. 1D. Since the fourth film pattern is formed by etching using the third film pattern as a mask, it has a width of 0.1 μm to 10 μm.

Figure 1E:
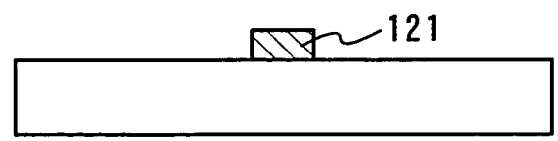

Thereafter, the third film pattern 112 may be removed as shown in FIG. 1E.

An insulating film may be formed before forming the first film pattern 102 over the substrate 101. The insulating film is used as an etching stopper at the time of etching the first film pattern; therefore, a metal film or a metal oxide film, typically, a film formed of silicon oxide, silicon nitride, titanium oxide, or the like is used.

According to the above steps, a film pattern having a desired shape can be formed without using a photomask. Since light is condensed by using a curved film pattern, a narrow film pattern can be formed without using light condensed by a complex optical system.

Embodiment Mode 2

An example of using laser light as a typical example of the light 104 in Embodiment Mode 1 is described in this embodiment mode with reference to FIGS. 2A to 2E.

Figure 2A:
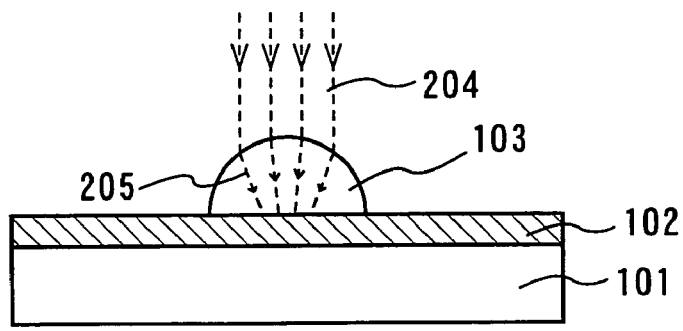
FIGS. 2A to 2E are cross-sectional views showing a step of manufacturing a film pattern according to the present invention.
Figure 2B:
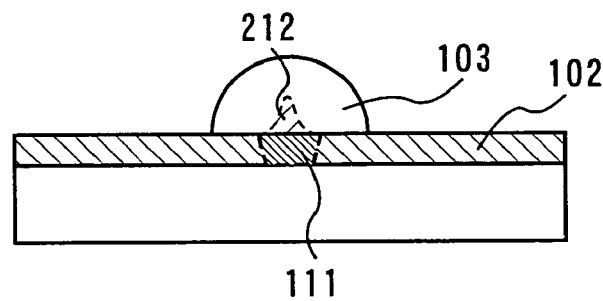

After forming a second film pattern 103 over a first film pattern 102 as in Embodiment Mode 1, the second film pattern 103 is irradiated with laser light 204 by using a laser direct drawing apparatus as shown in FIG. 2A.

Figure 39:
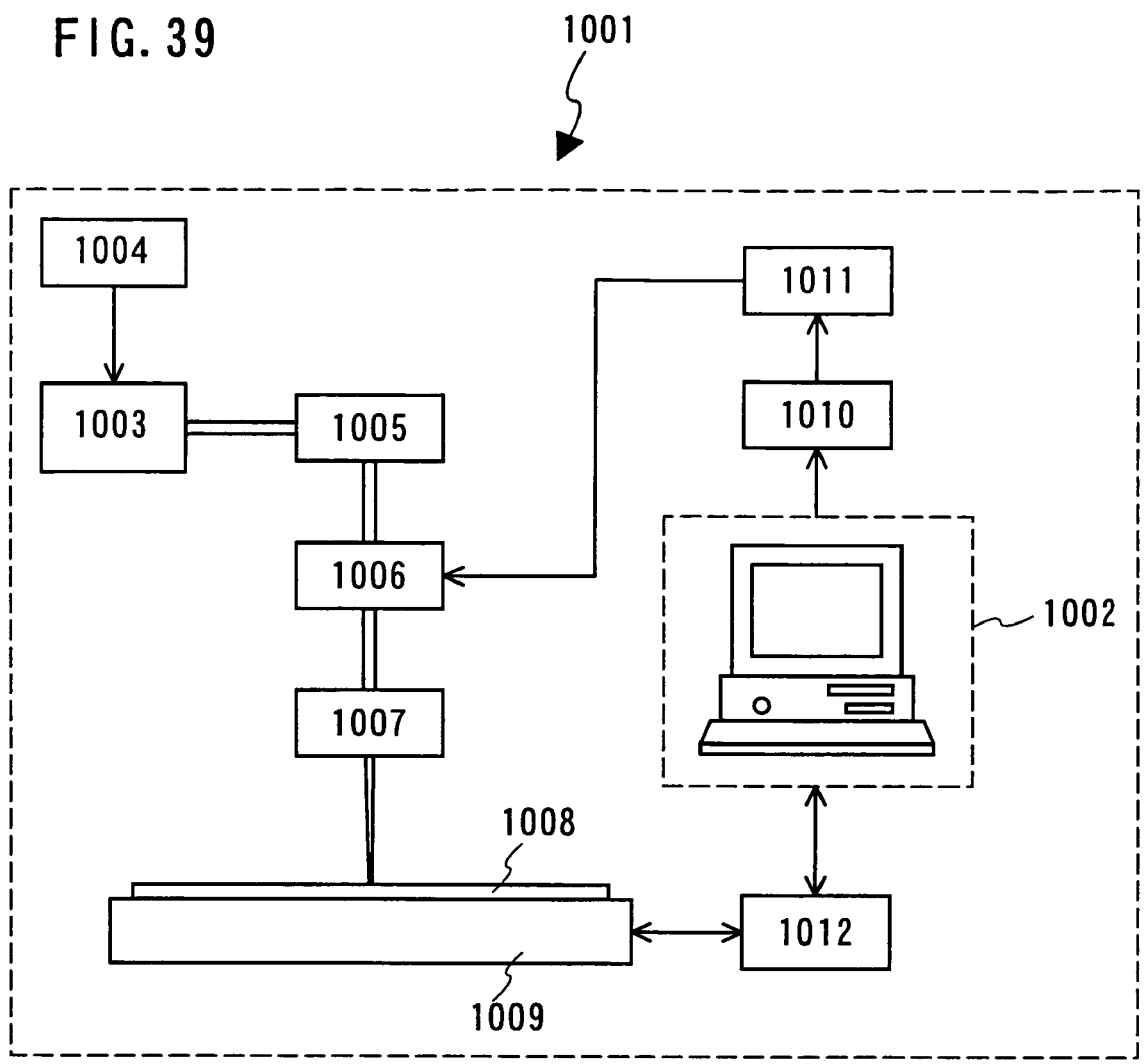
FIG. 39 is a schematic diagram showing a laser direct drawing apparatus according to the present invention.

Here, the laser direct drawing apparatus is described with reference to FIG. 39. As shown in FIG. 39, a laser direct drawing apparatus 1001 includes: a personal computer (hereinafter referred to as a PC) 1002 for conducting various types of control in emitting laser light; a laser oscillator 1003 for outputting the laser light; a power source 1004 of the laser oscillator 1003; an optical system (ND filter) 1005 for attenuating the laser light; an acousto-optic modulator (AOM) 1006 for modulating intensity of the laser light; an optical system 1007 having a lens for reducing the size of a cross section of the laser light, a mirror for changing a light path, and the like; a substrate movement mechanism 1009 having an X stage and a Y stage; a D/A converter 1010 for converting control data outputted from the PC from digital into analog; a driver 1011 for controlling the acousto-optic modulator 1006 in accordance with an analog voltage outputted from the D/A converter; and a driver 1012 for outputting a driving signal for driving the substrate movement mechanism 1009.

A laser oscillator that can oscillate ultraviolet light, visible light, or infrared light can be used as the laser oscillator 1003. An excimer laser oscillator of ArF, KrF, XeCl, Xe, or the like, a gas laser oscillator of He, He—Cd, Ar, He—Ne, HF, or the like, a solid laser oscillator using crystal such as YAG, $GdVO_4$, $YVO_4$, YLF, or $YAlO_3$ doped with Cr, Nd, Er, Ho, Ce, Co, Ti, or Tm, a semiconductor laser oscillator of GaN, GaAs, GaAlAs, InGaAsP, or the like can be used as the laser oscillator. Note that it is preferable to apply any of second to fifth harmonics of a fundamental wave to the solid laser oscillator.

Subsequently, an irradiation method with the use of the laser direct drawing apparatus is described. When a substrate 1008 is mounted on the substrate movement mechanism 1009, the PC 1002 detects a position of a marker marked on the substrate with a camera which is not shown in the diagram. Next, the PC 1002 generates movement data for moving the substrate movement mechanism 1009 based on position data of the detected marker and preliminarily inputted drawing pattern data. Thereafter, the PC 1002 controls the amount of output light from the acousto-optic modulator 1006 through the driver 1011. Accordingly, after the laser light outputted from the laser oscillator 1003 is attenuated by the optical system 1005, the amount of the laser light is controlled by the acousto-optic modulator 1006 to be the predetermined amount. On the other hand, a light path and a beam spot shape of the laser light outputted from the acousto-optic modulator 1006 is changed by the optical system 1007 and the laser light is condensed by a lens. Thereafter, a light absorbing layer formed over the substrate is irradiated with the laser light. At this time, movement of the substrate movement mechanism 1009 in an X direction and a Y direction is controlled in accordance with the movement data generated by the PC 1002. Consequently, a predetermined position is irradiated with the laser light, and light energy of the laser light is converted into heat energy by the light absorbing layer.

As shown in FIG. 1B, part of the second film pattern 103 is modified by the heat energy converted by the light absorbing layer. Since laser light having a shorter wavelength can be condensed to have a smaller beam diameter, the second film pattern is preferably irradiated with laser light having a shorter wavelength in order to form a film pattern having a minute width.

The laser light is processed by the optical system so as to have a beam spot in the shape of a spot, a circle, an ellipse, a rectangle, a line (precisely, an elongated rectangle), or a plane (with a large area) on the surface of the light absorbing layer.

The apparatus shown in FIG. 39 is an example in which the substrate is placed so that its surface faces the substrate movement mechanism and the reverse side of the substrate is regarded as a top surface, and then the laser light is emitted from the surface side of the substrate movement mechanism. However, the optical system or the substrate movement mechanism may be appropriately changed. A laser direct drawing apparatus may be used in which the substrate is placed so that its reverse side faces the substrate movement mechanism and the laser light is emitted from the reverse surface side of the substrate movement mechanism.

Here, the substrate is moved to be selectively irradiated with a laser beam; however, the invention is not limited thereto. The laser beam can be moved in an X-Y direction to selectively irradiate the substrate therewith. In this case, a polygon mirror, a galvanometer mirror, an acousto-optic deflector (AOD), or the like, which has favorable beam spot linearity on the irradiation surface and high controllability of an irradiation position, is preferably used in the optical system 1007. Further, more highly precise laser light irradiation can be performed using the substrate movement mechanism 1009 which can be moved in one axis direction and the laser beam which can be moved in one axis direction.

The laser light 204 is condensed by the second film pattern 103. The condensed laser light 205 is emitted to the surface of the first film pattern. Note that the laser light 204 is preferably narrower than the second film pattern 103. When such laser light is emitted to the second film pattern 103, the condensed laser light 205 becomes narrower.

Laser light intensity has a so-called Gaussian distribution, in which the intensity reaches the highest value at the center of the beam spot. Since the laser light is condensed by the second film pattern 103, the laser light has higher intensity than that in Embodiment Mode 1. Therefore, the surface of the first film pattern has a higher temperature at the center than that in the Embodiment Mode 1.

When a wavefront conversion optical element is used in the optical system 1005 of the laser direct drawing apparatus shown in FIG. 39, laser light intensity has a trapezoidal shape (a top flat type), and a temperature distribution also has a trapezoidal shape. Therefore, the laser light can be condensed and emitted to the first film pattern. A diffractive optical element, a refractive optical element, a reflective optical element, an optical waveguide, or the like can be typically used as the wavefront conversion optical element. A holographic optical element, a binary optical element, or the like can be typically used as the diffractive optical element.

Consequently, the laser light is absorbed by the first film pattern 102. In addition, generated heat is conducted to part of the second film pattern, and the part of the second film pattern 103 is modified. Accordingly, laser light energy per photon can be converted into heat and a minute film pattern can be formed in a narrower region than a beam spot of the laser light on an irradiation surface by appropriately controlling the size of the beam spot, the curvature of the second film pattern, intensity of the laser light, or a film thickness, an absorption coefficient, and thermal conductivity of the first film pattern, without condensing the laser light by using a complex optical system. Further, the beam spot of the laser light can be made smaller without using a number of optical systems. Accordingly, the optical system can be designed easily, and the cost can be reduced.

Figure 2C:
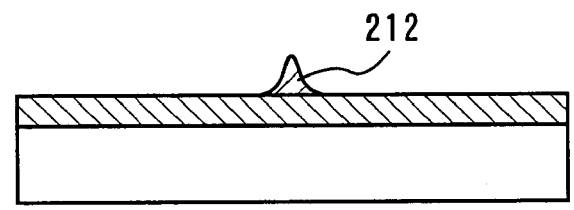

Subsequently, an unmodified region of the second film pattern is removed to expose a modified region 212 as shown in FIG. 2C. The region serves as a third film pattern 212.

Figure 2D:
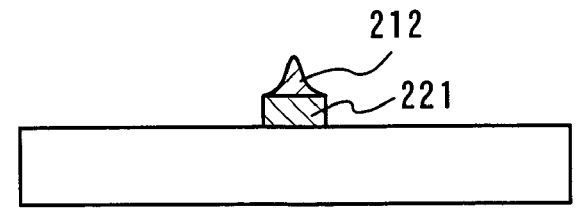

The first film pattern is etched using the third film pattern 212 as a mask to form a fourth film pattern 221 as shown in FIG. 2D.

Figure 2E:
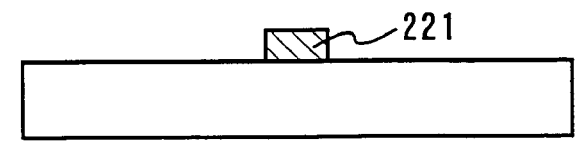

Thereafter, the third film pattern 212 may be removed as shown in FIG. 2E.

An insulating film may be formed before forming the first film pattern 102 over the substrate 101. The insulating film is used as an etching stopper at the time of etching the first film pattern. Thus, a metal film or a metal oxide film, typically, a film formed of silicon oxide, silicon nitride, titanium oxide, or the like is used.

According to the above steps, a film pattern having a desired shape can be formed without using a photomask. In addition, a film pattern narrower than a light beam spot can be formed. Further, a narrow film pattern can be formed without condensing laser light by using a complex optical system.

Embodiment Mode 3

A step of forming a film pattern by forming a second film pattern on the surface of a substrate and irradiating a first film pattern with light transmitted through the second film pattern and the substrate is described in this embodiment mode with reference to FIGS. 3A to 3E.

Figure 3A:
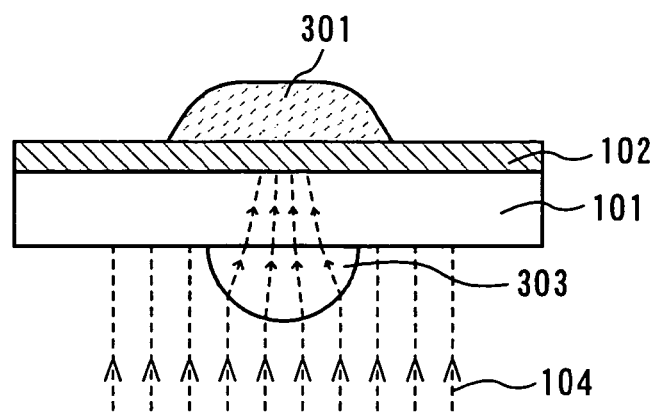
FIGS. 3A to 3E are cross-sectional views showing a step of manufacturing a film pattern according to the present invention.

A first film pattern 102 is formed over a substrate 101 as shown in FIG. 3A. A second film pattern 303 is formed opposite to the first film pattern 102 with the substrate 101 therebetween. The second film pattern 103 is formed of a similar material to that of the second film pattern 103 as in Embodiment Mode 1.

By forming a layer having a liquid repellent surface on the substrate before forming the second film pattern 303, a material of the second film pattern is repelled by the repellent surface, and a highly curved film pattern can be formed. A highly curved film pattern tends to condense light more and is suitable to form a narrow film pattern.

Subsequently, a third film pattern 301 is formed on the first film pattern 102. A thermoplastic material or a thermosetting material is used for the third film pattern.

A solution including polyimide, acrylic, a novolac resin, a melamine resin, a phenol resin, an epoxy resin, a silicone resin, a furan resin, a diallyl phthalate resin, a vinyl chloride resin, a vinyl acetate resin, polyvinyl alcohol, a polystyrene, a methacrylic resin, a polyethylene resin, polypropylene, polycarbonate, polyester, polyamide (nylon), or the like can be used as a typical thermoplastic material or thermosetting material. PSG (phosphosilicate glass), BPSG (borophosphosilicate glass), silicate-based SOG (Spin on Glass), polysilazane-based SOG, alkoxy silicate-based SOG, or $SiO_2$ having a Si—$CH_3$ bond typified by polymethylsiloxane can also be used.

Here, the third film pattern 301 is formed after forming the second film pattern 303. However, without limiting thereto, the second film pattern 303 may be formed after forming the third film pattern 301.

Subsequently, the first film pattern is irradiated with light 104 from the side of the substrate 101 and the second film pattern 303. In other words, the first film pattern 102 is irradiated with light transmitted through the substrate 101 and the second film pattern 303. The light 104 is condensed by the second film pattern which is curved. Then, the light is transmitted through the substrate and emitted to the first film pattern. Consequently, a light condensation distance is longer than those in Embodiment Modes 1 and 2. Therefore, light having a narrow spot diameter can be emitted to the first film pattern 102.

Note that laser light may be used as the light 104 as in Embodiment Mode 2.

Figure 3B:
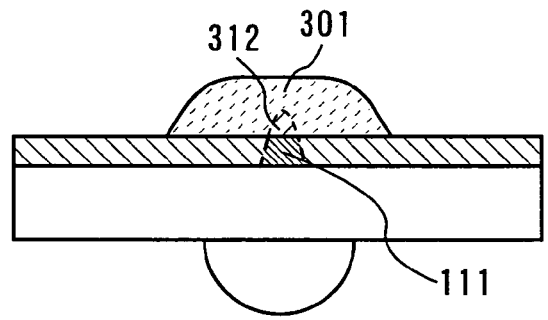

As shown in FIG. 3B, a region of the first film pattern irradiated with the light is heated, and the heat of the heated region 111 is conducted to the third film pattern 301. The third film pattern is partly plasticized, cured, or the like and is modified, thereby forming a fourth film pattern 312.

Figure 3C:
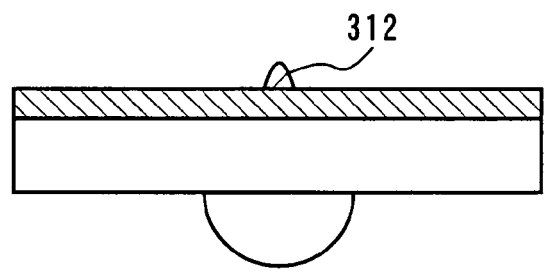

As shown in FIG. 3C, an unmodified region of the third film pattern 301 is removed to expose the fourth film pattern 312.

Figure 3D:
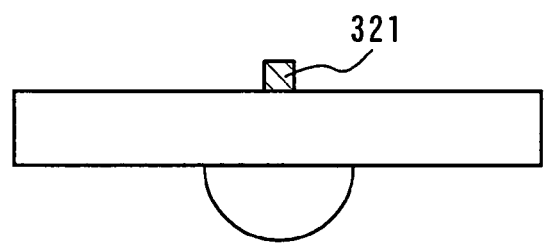

The first film pattern is etched using the fourth film pattern 312 to form a fifth film pattern 321 as shown in FIG. 3D. The fifth film pattern 321 has a desired shape and has a width of 0.1 μm to 10 μm. Thereafter, the fourth film pattern is removed.

Figure 3E:
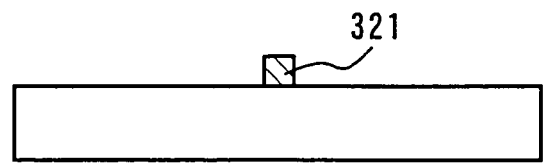

Note that the second film pattern may be removed as shown in FIG. 3E.

An insulating film may be formed before forming the first film pattern 102 over the substrate 101. The insulating film is used as an etching stopper at the time of etching the first film pattern. Thus, a metal film or a metal oxide film, typically, a film formed of silicon oxide, silicon nitride, titanium oxide, or the like is used as the insulating film.

According to the above steps, a film pattern having a desired shape can be formed without using a photomask. In addition, since light is condensed by using a curved film pattern, a minute film pattern can be formed without using light condensed by a complex optical system. When the light is transmitted through the substrate, the condensed light is further condensed to have a small spot diameter. Since the light is emitted to the first film pattern, a more minute film pattern can be formed.

Embodiment Mode 4

An example of forming a film pattern by exposing a photosensitive material to light using a light transmitting curved film pattern is described in this embodiment mode with reference to FIGS. 4A to 4E.

A first film pattern 102 is formed over a substrate 101, and a second film pattern 401 is formed thereover. The second film pattern 401 is formed of a positive type or negative type photosensitive material such as acrylic, polyimide, styrene, vinyl chloride, a diazo resin, an azide compound, a novolac resin, or polyvinyl cinnamate. Note that a sensitizer may be added to the photosensitive material. A third film pattern 403 which is curved and transmits light is formed over the second film pattern 401. The third film pattern is formed of a similar material by a similar manufacturing method to those of the second film pattern 103 in Embodiment Mode 1.

By forming a layer having a liquid repellent surface over the second film pattern 401 before forming the third film pattern 403, a material of the third film pattern is repelled by the repellent surface, and a highly curved film pattern can be formed. A highly curved film pattern tends to condense light more and is suitable to form a narrow film pattern.

Figure 4A:
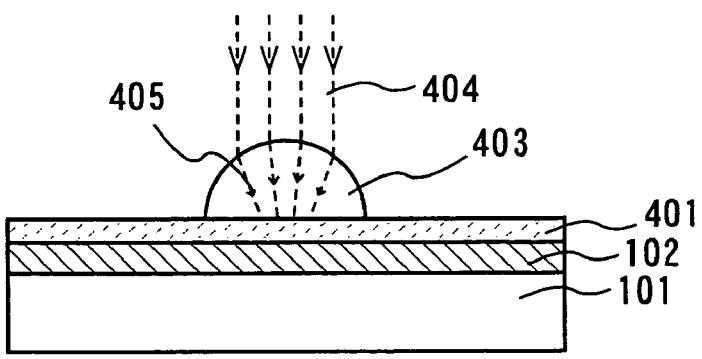
FIGS. 4A to 4E are cross-sectional views showing a step of manufacturing a film pattern according to the present invention.
Figure 4B:
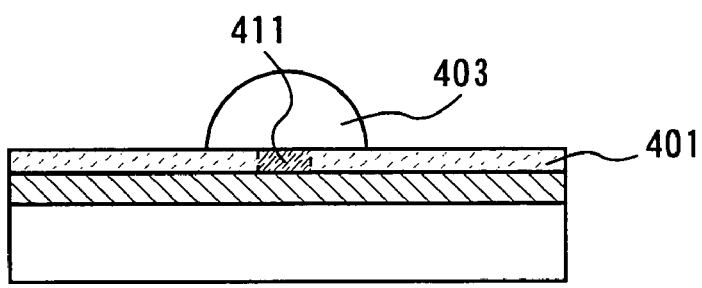

When light 404 is emitted, light 405 condensed by the third film pattern 403 is emitted to the second film pattern 401. Since the second film pattern 401 is formed of a photosensitive material, a region 411 irradiated with the light is exposed to light as shown in FIG. 4B. In this embodiment mode, the second film pattern 401 is formed of a negative type photosensitive resin. Therefore, the region 411 exposed to light by light irradiation is cured. In the case of using a positive type photosensitive resin for the second film pattern 401, the region 411 exposed to light by light irradiation is plasticized.

Figure 4C:
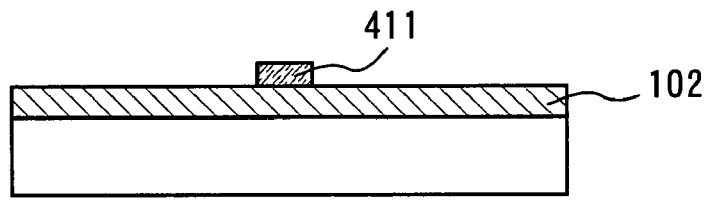

After removing the third film pattern 403, the second film pattern is developed and a light unexposed region is removed as shown in FIG. 4C. Consequently, the light exposed region 411 is exposed. The light exposed region 411 serves as a fourth film pattern 411.

Figure 4D:
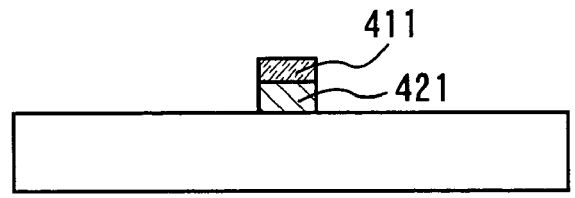

Subsequently, the first film pattern 102 is etched using the fourth film pattern 411 as a mask to form a fifth film pattern 421 as shown in FIG. 4D.

Figure 4E:
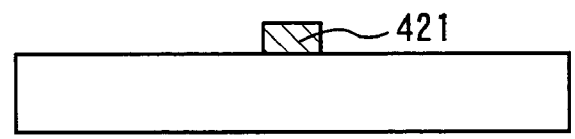

Thereafter, the fourth film pattern 411 is removed as shown in FIG. 4E.

An insulating film may be formed before forming the first film pattern 102 over the substrate 101. The insulating film is used as an etching stopper at the time of etching the first film pattern. Thus, a metal film or a metal oxide film, typically, a film formed of silicon oxide, silicon nitride, titanium oxide, or the like is used.

According to the above steps, without using a photomask, a mask pattern can be formed by exposing a photosensitive material to light, and a film pattern having a desired shape can be formed using the mask pattern. A narrower film pattern than a light spot diameter can also be formed. Further, a narrow film pattern can be formed without condensing laser light using a complex optical system.

Embodiment Mode 5

A step of manufacturing a TFT having a narrow gate electrode layer is described in this embodiment mode with reference to FIGS. 5A to 5E. Note that this embodiment mode is described using a channel etch TFT as a TFT. A gate electrode layer is formed using the fourth film pattern formed in Embodiment Mode 1, but the invention is not limited thereto. Any of Embodiment Modes 2 to 4 can be appropriately used.

Figure 5A:
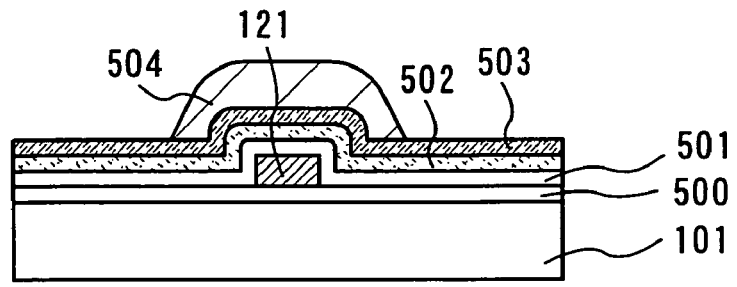
FIGS. 5A to 5E are cross-sectional views showing a step of manufacturing a semiconductor device according to the present invention.

As shown in FIG. 5A, a first insulating film 500 is formed over a substrate 101, and a gate electrode layer 121 is formed thereover according to a similar step to that of the fourth film pattern in Embodiment Mode 1. The gate electrode layer has a width of 0.1 μm to 10 μm.

Subsequently, a second insulating film 501 serving as a gate insulating film, a first semiconductor film 502, and a conductive second semiconductor film 503 are sequentially formed over the substrate and the gate electrode layer.

The second insulating film 501 is formed by a thin film formation method such as a plasma CVD method or a sputtering method to be a single layer of an insulating film containing silicon such as a silicon nitride film or a silicon oxide film or to have a laminated structure thereof. The second insulating film preferably has a sequentially laminated structure of a silicon nitride film (silicon nitride oxide film), a silicon oxide film, and a silicon nitride film (silicon nitride oxide film) over the gate electrode layer. Since the gate electrode layer is in contact with the silicon nitride film in this structure, deterioration due to oxidation can be prevented.

Alternatively, the second insulating film 501 may be formed using an insulating solution by a droplet discharge method, an application method, a sol-gel method, or the like. As a typical example of the insulating solution, a solution dispersed with inorganic oxide particles, polyimide, polyamide, polyester, acrylic, PSG (phosphosilicate glass), BPSG (borophosphosilicate glass), silicate-based SOG (Spin on Glass), polysilazane-based SOG, alkoxy silicate-based SOG, or $SiO_2$ having a Si—$CH_3$ bond typified by polymethylsiloxane is appropriately used.

The first semiconductor film 502 is formed using a film having any state of semiconductors selected from an amorphous semiconductor, a semi-amorphous semiconductor in which an amorphous state and a crystalline state are mixed (also referred to as a SAS), a microcrystalline semiconductor in which a crystal grain of 0.5 nm to 20 nm can be observed within an amorphous semiconductor, and a crystalline semiconductor. Specifically, a microcrystalline state in which a crystal grain of 0.5 nm to 20 nm can be observed is referred to as microcrystal (μc). In any case, a semiconductor film mainly containing silicon, silicon germanium (SiGe), or the like with a thickness of 10 nm to 60 nm can be used.

The SAS means a semiconductor having an intermediate structure between an amorphous structure and a crystalline structure (including a single crystal and a polycrystal) and having a third state which is stable in terms of free energy. The SAS includes a crystalline region having short-range order and lattice distortion. A crystalline region of 0.5 nm to 20 nm can be observed in at least part of a region in the film. When silicon is contained as the main component, a Raman spectrum is shifted to a lower frequency side than 520 $cm^{-1}$. A diffraction peak of (111) or (220) to be caused by a crystal lattice of silicon is observed in X-ray diffraction. In addition, the SAS contains hydrogen or halogen of 1 atomic % or more to terminate a dangling bond.

The SAS is formed by performing glow discharge decomposition on a silicide gas. $SiH_4$ is given as a typical silicide gas. In addition, $Si_2H_6$, $SiH_2Cl_2$, $SiHCl_3$, $SiCl_4$, $SiF_4$, or the like can also be used as the silicide gas. The silicide gas may be diluted with hydrogen or fluorine, or hydrogen or fluorine and one or more rare gas elements of helium, argon, krypton, and neon, thereby making formation of the SAS easy. At this time, it is preferable to dilute the silicide gas so that a dilution ratio thereof ranges from 10 times to 1000 times. Alternatively, the SAS can be formed using $Si_2H_6$ and $GeF_4$ and using a method for diluting with a helium gas. Formation of a film by glow discharge decomposition is preferably performed under reduced pressure and may be performed with pressures in the range of approximately 0.1 Pa to 133 Pa. High-frequency powers of 1 MHz to 120 MHz, preferably, 13 MHz to 60 MHz may be supplied to perform glow discharge. A substrate heating temperature is preferably 300° C. or less, and a recommended substrate heating temperature is 100° C. to 250° C.

A crystalline semiconductor film is formed by crystallizing an amorphous semiconductor film or a SAS by heating or laser irradiation. Alternatively, a crystalline semiconductor film may be directly formed. In this case, a crystalline semiconductor film is directly formed using a fluorine-based gas such as $GeF_4$ or $F_2$ and a silane-based gas such as $SiH_4$ or $Si_2H_6$ and utilizing heat or plasma.

The second semiconductor film 503 is conductive, and an element belonging to Group 15 of the periodic table, typically, phosphorus or arsenic is added to the second semiconductor film in the case of forming an n-channel TFT. An element belonging to Group 13, typically, boron is added in the case of forming a p-channel TFT. The second semiconductor film is formed by a plasma CVD method using a silicide gas mixed with a gas including an element belonging to Group 13 or 15 such as boron, phosphorus, or arsenic. Alternatively, the conductive second semiconductor film may be formed by forming a semiconductor film, applying a solution including an element belonging to Group 13 or 15 to the semiconductor film, and being irradiated with a laser beam. A laser beam emitted from a known pulsed wave laser or continuous wave laser is appropriately used as the laser beam.

Subsequently, a first mask pattern 504 is formed over the second semiconductor film. The first mask pattern is preferably formed of a heat resistant high molecular weight material. It is preferably formed by discharging a high molecular weight material which has an aromatic ring or a heterocyclic ring as a main chain and includes at least a highly polar heteroatom group in an aliphatic moiety by a droplet discharge method. As a typical example of such a high molecular weight material, polyimide, polybenzimidazole, or the like can be used. In the case of using polyimide, the first mask pattern can be formed by discharging a solution including polyimide from a discharge opening to the second semiconductor film 503 and then baking at 200° C. for 30 minutes.

Alternatively, the first mask pattern may be formed by forming a mask pattern having a liquid repellent surface in advance and applying or discharging the above described high molecular weight material to a region not covered with a liquid repellent surface.

Figure 5B:
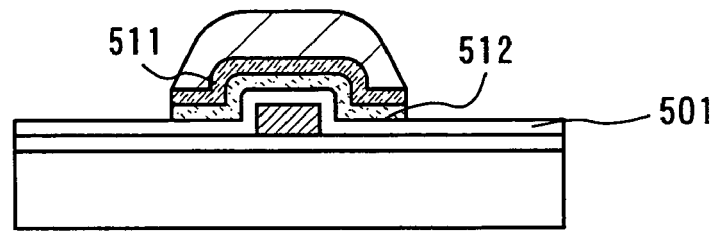

Subsequently, as shown in FIG. 5B, the second semiconductor film 503 and the first semiconductor film 502 is etched using the first mask pattern 504 to form a first semiconductor region 512 and a second semiconductor region 511, respectively. Thereafter, the first mask pattern is removed.

The first semiconductor film and the second semiconductor film are etched using a chlorine-based gas typified by $Cl_2$, $BCl_3$, $SiCl_4$, $CCl_4$, or the like, a fluorine-based gas typified by $CF_4$, $SF_6$, $NF_3$, $CHF_3$, or the like, or $O_2$.

Note that the first semiconductor region 512 may be formed of an organic semiconductor material by a printing method, a spraying method, a spin coating method, a droplet discharge method, or the like. In this case, the etching step is not required; therefore, the number of steps can be decreased. As the organic semiconductor material used in the invention, it is preferable to use a π-conjugated high molecular weight material whose skeleton is formed by a conjugated double bond. Typically, a soluble high molecular weight material such as polythiophene, poly(3-alkylthiophene), a polythiophene derivative, or pentacene can be used.

In addition, there is another material capable of forming the first semiconductor region by forming and then treating a soluble precursor. As such an organic semiconductor material formed by using a precursor, polythienylene vinylene, poly (2,5-thienylene vinylene), polyacetyrene, a polyacetylene derivative, polyallylene vinylene, or the like can be used.

In the treatment of converting a precursor into an organic semiconductor, a reactive catalyst such as a hydrogen chloride gas is added in addition to performing heat treatment. Toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran), or the like can be used as a typical solvent for dissolving such a soluble organic semiconductor material.

Figure 5C:
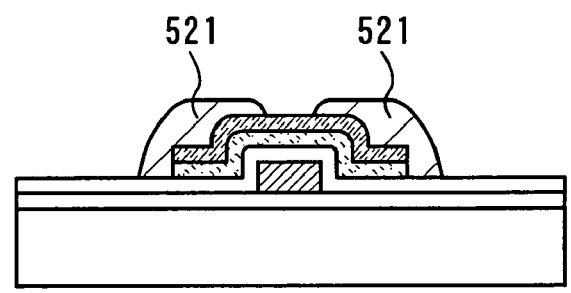

Subsequently, a second mask pattern 521 is formed over the substrate as shown in FIG. 5C. The second mask pattern can be formed of a similar material to that of the first mask pattern.

Figure 5D:
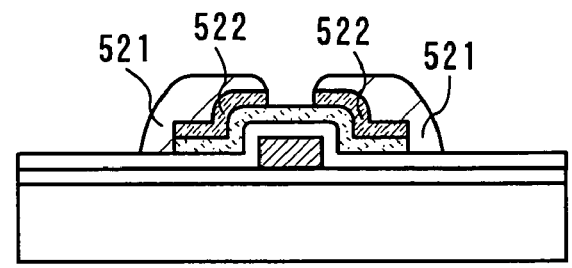

Next, the second semiconductor region 511 is etched using the second mask pattern 521 as a mask to form a third semiconductor region (also referred to as a source region and a drain region, or a contact layer) 522 as shown in FIG. 5D. Thereafter, the second mask pattern is removed by treatment using a removing solution, ashing treatment using oxygen, or the like.

In the case of using an organic semiconductor for the first semiconductor region, a conductive layer formed of an organic conductive material such as polyacetylene, polyaniline, PEDOT (poly-ethylenedioxythiophen), or PSS (polystyrenesulphonate) may be formed instead of the third semiconductor region 522. The conductive layer serves as a contact layer, or a source electrode and a drain electrode.

Alternatively, a conductive layer formed of a metal element may be used for the third semiconductor region 522. In this case, an organic semiconductor material is often a p-type semiconductor which transports a hole as a carrier. Therefore, it is preferable to use metal having high work function so as to have an ohmic contact with the semiconductor layer.

Specifically, it is preferable to use metal such as gold, platinum, chromium, palladium, aluminum, indium, molybdenum, nickel, or an alloy thereof or the like. The conductive layer is formed using conducting paste including such metal or an alloy material by a printing method, a roll coating method, or a droplet discharge method.

Further, the first semiconductor layer formed of an organic semiconductor material, a conductive layer formed of an organic conductive material, and a conductive layer formed of a metal element may be laminated.

In the case where the first semiconductor region is formed of a SAS, a structure having the source region and the drain region overlapping a gate electrode can be employed as in this embodiment. In place of the structure, a so-called self alignment structure having edge portions of a source region and a drain region aligned with an edge portion of a gate electrode can also be employed. Further, a structure having a source region and a drain region formed at a certain distance from a gate electrode without covering it can be employed. This structure can reduce off-current. Thus, in the case of using the TFT as a switching element of a display device, contrast can be enhanced.

Figure 5E:
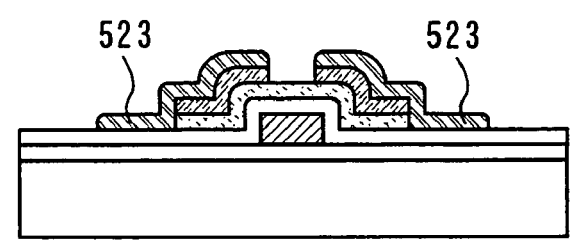

Then, a conductive material is discharged to the source region and the drain region by a droplet discharge method and is dried and baked to form a source electrode and a drain electrode 523 as shown in FIG. 5E. A solution of a conductor dissolved or dispersed in a solvent is used as an organic material.

As the solution of a conductor dissolved or dispersed in a solvent, a metal particle, a fine particle of halide metal, or a dispersant metal nanoparticle of Ag, Au, Cu, Ni, Pt, Pd, Ir, Rh, W, Al, Ta, Mo, Cd, Zn, Fe, Ti, Si, Ge, Zr, or Ba can be used. Alternatively, indium tin oxide (ITO), zinc oxide (ZnO), indium zinc oxide (IZO), gallium-added zinc oxide (GZO), indium tin oxide containing silicon oxide, organic indium, organic tin, or the like, which is used as a transparent conductive film, can be used as the solution of a conductor dissolved or dispersed in a solvent. In addition, a first conductive layer may be formed by laminating a conductive layer formed of the material.

As for the solvent, an organic solvent of esters such as butyl acetate and ethyl acetate, alcohols such as isopropyl alcohol and ethyl alcohol, methyl ethyl ketone, or acetone or the like is used.

As for the solution to be discharged from a discharge opening, it is preferable to use any material of gold, silver, and copper dissolved or dispersed in a solvent, taking a specific resistance value into consideration. It is more preferable to use silver or copper which has low resistance and is inexpensive. When copper is used, a barrier film may be additionally provided as a countermeasure to an impurity.

In the case of using copper as a wiring, an insulating or conductive material containing nitrogen such as silicon nitride, silicon oxynitride, aluminum nitride, titanium nitride, or tantalum nitride is preferably used as the barrier film. The insulating or conductive material may be formed by a droplet discharge method.

The diameter of a particle of the conductor is preferably made as small as possible for the purpose of preventing a clogged nozzle and for manufacturing a high-definition pattern, although it depends on the diameter of each nozzle, a desired shape of a pattern, and the like. Preferably, the diameter of the particle of the conductive material is 0.1 μm or less. The particle is formed by a known method such as an electrolyzing method, an atomizing method, a wet reducing method, or the like, and the particle size thereof is typically approximately 0.5 μm to 10 μm. However, when a gas evaporation method is employed, a nanomolecule protected by a dispersant is minute, approximately 7 nm. When each surface of nanoparticles is covered with a coating, the nanoparticles do not cohere in the solvent and are uniformly dispersed in the solvent at room temperature, and show a property similar to that of liquid. Accordingly, it is preferable to use a coating.

In this embodiment mode, a conductive layer which mainly contains silver is formed as the source electrode and the drain electrode 523. Note that the conductive layer is formed of conductor particles which irregularly overlap one another in three dimensions. In other words, the conductive layer is formed of three-dimensional aggregate particles. Consequently, the surface thereof has slight irregularity. In addition, the particles melt into a particle aggregate, depending on the temperature of the conductive layer and heating time thereof. The size of the aggregate at this time increases depending on the temperature of the conductive layer and heating time thereof. Therefore, a difference in surface height of the conductive layer becomes large. Note that a region in which particles are melted may have a polycrystalline structure in some cases. A binder formed of an organic material remains in the conductive layer depending on the heating temperature, atmosphere, or time.

Subsequently, a passivation film is preferably formed over the source electrode and the drain electrode 523. The passivation film is formed of silicon nitride, silicon oxide, silicon nitride oxide, silicon oxynitride, aluminum oxynitride, aluminum oxide, diamond like carbon (DLC), carbon nitride (CN), or another insulating material by a thin film formation method such as a plasma CVD method or a sputtering method.

According to the above steps, a channel etch TFT having a narrow gate width, in other words, having a short channel length is manufactured without using a photomask.

Embodiment Mode 6

A step of manufacturing a TFT having a narrow gate electrode layer is described in this embodiment mode with reference to FIGS. 6A to 6D. Note that this embodiment mode is described using a channel protective TFT as a TFT. A gate electrode layer is formed in this embodiment mode by using the fourth film pattern formed as in Embodiment Mode 1, but the invention is not limited thereto. Any of Embodiment Modes 2 to 4 can be appropriately used.

Figure 6A:
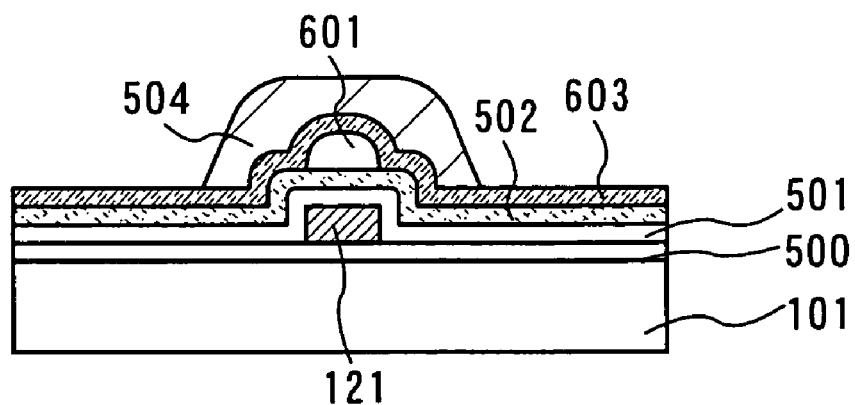
FIGS. 6A to 6D are cross-sectional views showing a step of manufacturing a semiconductor device according to the present invention.

As shown in FIG. 6A, a first insulating film 500 is formed over a substrate 101 according to Embodiment Mode 1, and a gate electrode layer 121 is then formed according to a similar step to that of the fourth film pattern as in Embodiment Mode 1.

Subsequently, a second insulating film 501 and a first semiconductor film 502 are formed over the substrate and the gate electrode layer. A protective film 601 is formed over a region of the first semiconductor film, directly above the gate electrode layer 121. A similar method and a similar material to those of the first mask pattern 504 described in Embodiment Mode 5 are employed to form the protective film.

As in Embodiment Mode 5, a second semiconductor film (a conductive semiconductor film) 603 is formed. A first mask pattern 504 is also formed as in Embodiment Mode 5.

Figure 6B:
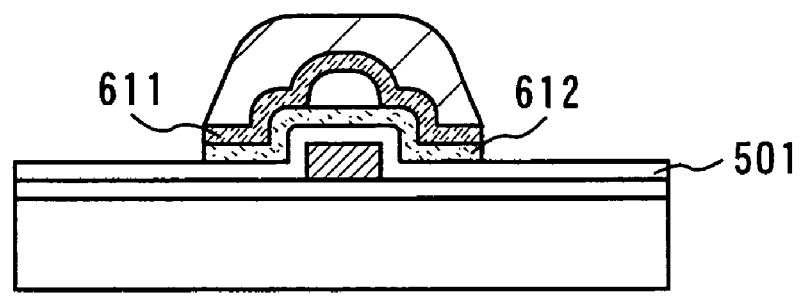

The first semiconductor film and the second semiconductor film are etched using the first mask pattern to form a first semiconductor region 612 and a second semiconductor region 611 as shown in FIG. 6B. Thereafter, the first mask pattern is removed.

Figure 6C:
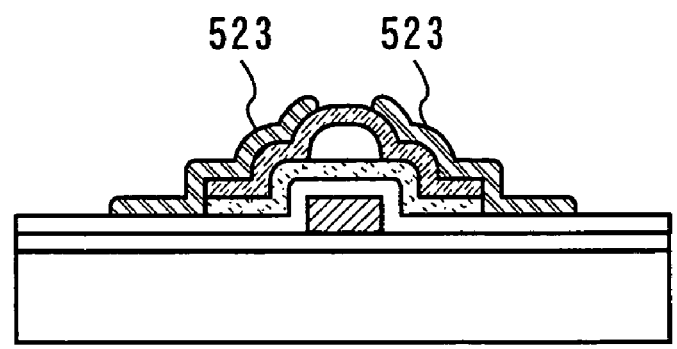

A source electrode and a drain electrode 523 are formed over the second semiconductor region 611 as shown in FIG. 6C.

Figure 6D:
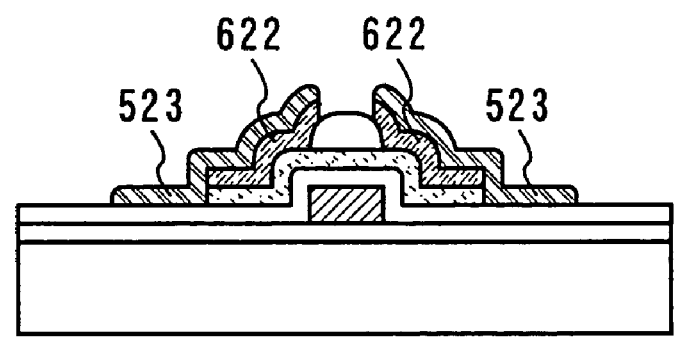

An exposed portion of the second semiconductor region 611 is etched using the source electrode and the drain electrode 523 as a mask and is divided to form a source region and a drain region 622 as shown in FIG. 6D. According to this step, the protective film 601 is exposed.

Note that a method for forming the source region and the drain region is not limited to this embodiment mode. The step described in Embodiment Mode 5 may also be employed. Likewise, the step of forming the source region and the drain region in this embodiment mode may be applied to Embodiment Mode 5.

A channel protective TFT having a narrow gate width, in other words, having a short channel length can be manufactured without using a photomask.

Embodiment Mode 7

A step of manufacturing a staggered TFT having a short channel length is described in this embodiment mode with reference to FIGS. 7A to 7D. In this embodiment mode, the fourth film pattern formed as in Embodiment Mode 1 is used as a source region and a drain region. However, any of Embodiment Modes 2 to 4 can be appropriately applied without limiting the step.

Figure 7A:
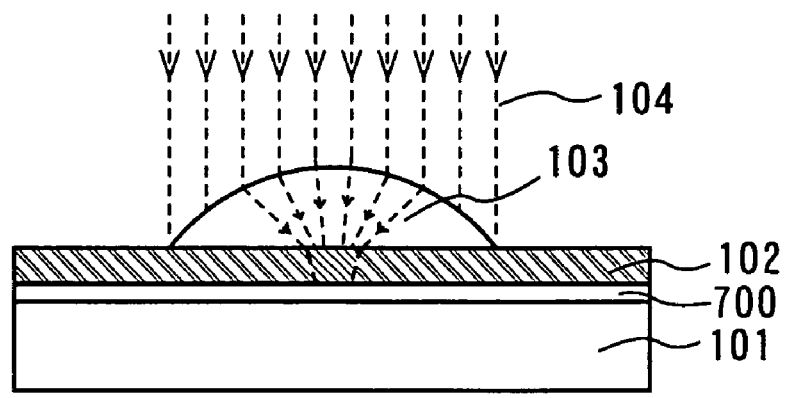
FIGS. 7A to 7D are cross-sectional views showing a step of manufacturing a semiconductor device according to the present invention.

A first insulating film 700 is formed over a substrate 101, and a first film pattern 102 is formed thereover as shown in FIG. 7A. The first film pattern serves as a source electrode and a drain electrode; therefore, it is formed of a conductive material. A similar material and a similar manufacturing method to those of the first film pattern 102 as in Embodiment Mode 1 are appropriately employed to form the first film pattern. A second film pattern 103 is formed over the first film pattern 102. Light 104 is emitted to the second film pattern 103.

Figure 7B:
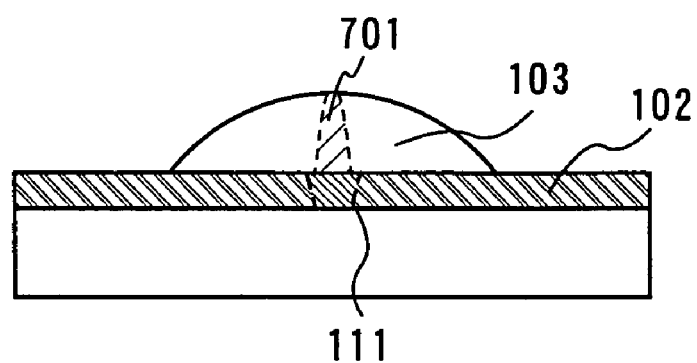

Also in the first film pattern 102, a region 111 irradiated with the light is heated as shown in FIG. 7B. In addition, the heat is conducted to the second film pattern, and part of the second film pattern 103 is modified. Since the second film pattern 103 is formed of a thermoplastic material in this embodiment mode, it is partly plasticized.

Figure 7C:
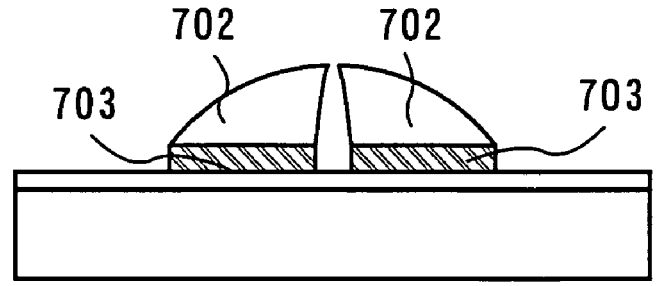

A thermally modified and plasticized region 701 of the second film pattern is removed by a removing solution or the like to form a third film pattern 702 as shown in FIG. 7C. The third film pattern 702 serves as a mask pattern.

The first film pattern 102 is etched using the third film pattern 702 to form a first conductive layer 703 as shown in FIG. 7C. The first conductive layer 703 serves as a source electrode and a drain electrode. Note that a plurality of film patterns having a space narrower than a laser beam diameter therebetween can be formed according to the invention. Consequently, a distance between the conductive layers formed by using the film pattern is minute; thus, a channel length of a TFT to be formed can be shortened.

Figure 7D:
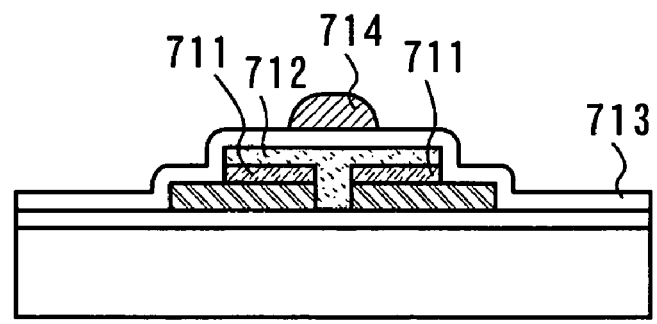

As shown in FIG. 7D, a conductive first semiconductor region 711, a second semiconductor region 712, a second insulating 713 film serving as a gate insulating film, and a gate electrode 714 are formed, thereby forming a staggered TFT. Note that the first semiconductor region serves as a source region and a drain region and the second semiconductor region serves as a channel formation region.

According to the above steps, a staggered TFT having a short channel length is manufactured without using a photomask.

Embodiment Mode 8

A step of manufacturing a top gate TFT having a short channel length is described in this embodiment mode with reference to FIGS. 40A to 40D. This embodiment mode is described using Embodiment Mode 3 as a method for forming a gate electrode layer. However, any of Embodiment Modes 1 to 4 can be appropriately applied without limiting to the step.

Figure 40A:
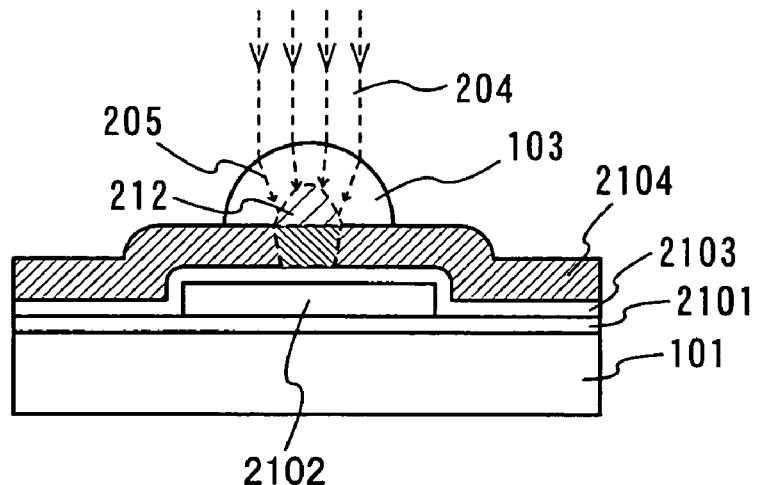
FIGS. 40A to 40D are cross-sectional views showing a step of manufacturing a semiconductor device according to the present invention.

A first insulating film 2101 is formed over a substrate 101 as shown in FIG. 40A. Since the first insulating film serves as a film for blocking contaminant or an element included in the substrate 101, a silicon oxide film, a silicon nitride film, a silicon oxynitride film, or the like is appropriately used.

A semiconductor region 2102 is formed over the first insulating film 2101. The semiconductor region can be formed by etching an amorphous semiconductor film, a SAS, or a crystalline semiconductor film into a desired shape. Note that the crystalline semiconductor film is formed by appropriately using a solid-phase growth method, a solid-phase growth method with the use of a metal element, a laser crystallization method, or the like. It is formed of such an organic semiconductor material as cited in Embodiment Mode 5.

A second insulating film 2103 serving as a gate insulating layer and a first film pattern 2104 are formed. Since the first film pattern 2104 serves as the first film pattern 102 in Embodiment Mode 1, the first film pattern is formed of a light absorbing conductive film. A second film pattern 103 is formed over the first film pattern and is irradiated with light. Here, laser light 204 is used as the light. Accordingly, light transmitted through the second film pattern is condensed and emitted to the first film pattern. Part of the first film pattern is heated. In addition, the heat is conducted to the second film pattern, and part of the second film pattern is modified. Since the second film pattern is formed of a thermosetting material here, a part 212 of the second film pattern is cured. The cured region serves as a third film pattern 212.

Figure 40B:
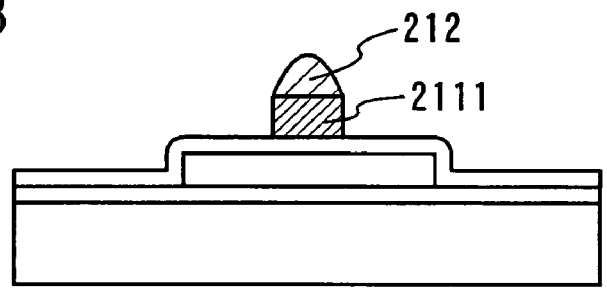

An unmodified region of the second film pattern is removed to expose the third film pattern 212 as shown in FIG. 40B. The first film pattern 2104 is etched using the third film pattern 212 to form a fourth film pattern 2111. The fourth film pattern 2111 serves as a gate electrode.

Figure 40C:
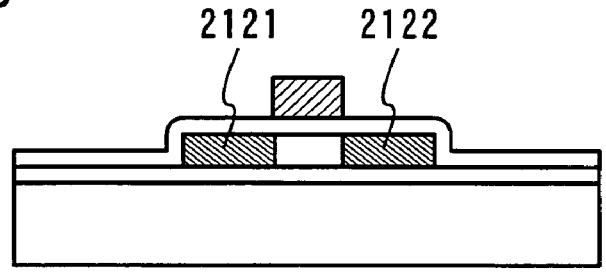

Impurities which impart n-type or p-type conductivity is added to the semiconductor region 2102, using the fourth film pattern 2111 as a mask, to form impurity regions (a source region and a drain region) 2121 and 2122 as shown in FIG. 40C. Accordingly, a p-channel TFT or an n-channel TFT is formed.

Figure 40D:
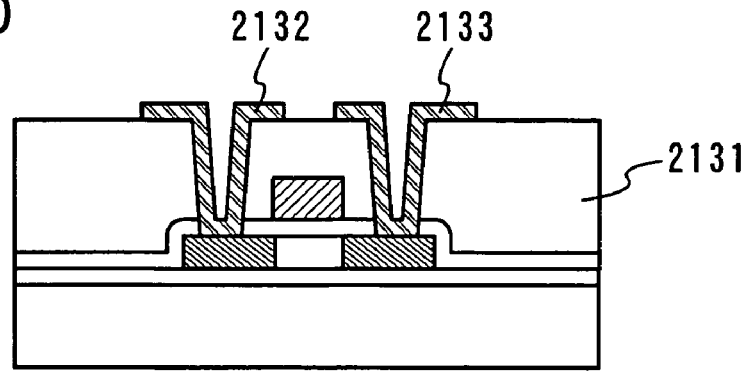

A third insulating film 2131 to serve as an interlayer insulating film is formed as shown in FIG. 40D. The third insulating film and the second insulating film are partly etched to form a contact hole so as to expose part of the semiconductor region. Second conductive layers 2132 and 2133 to serve as a source electrode and a drain electrode are formed in the contact hole.

According to the above steps, a top gate TFT having a short channel length can be manufactured.

Embodiment Mode 9

A method for forming a contact hole of a TFT is described in this embodiment mode with reference to FIGS. 41A to 41E.

Figure 41A:
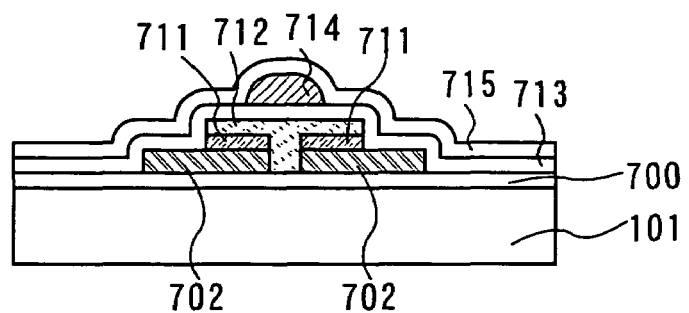
FIGS. 41A to 41E are cross-sectional views showing a step of manufacturing a semiconductor device according to the present invention.

According to Embodiment Mode 7, a staggered TFT is formed as shown in FIG. 41A. Here, a first insulating film 700, a first conductive layer 702, a conductive first semiconductor region 711, a second semiconductor region 712, a second insulating film 713 serving as a gate insulating film, and a gate electrode 714 are formed over a substrate 101. Thereafter, a protective film 715 is formed to cover the TFT. Note that the first semiconductor region serves as a source region and a drain region, and the second semiconductor region serves as a channel formation region.

Figure 41B:
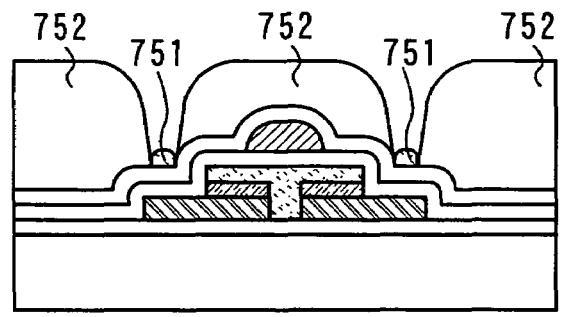

A solution which forms a liquid repellent surface is discharged to a region where the first conductive layer 702, the second insulating film 713, and the protective film 715 are overlapped with each other to form a first mask pattern 751 as shown in FIG. 41B.

A region having a liquid repellent surface refers to a region having a large contact angle between the surface and liquid. The liquid is repelled in a hemispherical shape by the surface. On the other hand, a region having a lyophilic surface refers to a region having a small contact angle between the surface and liquid. The liquid is spread over the surface.

When two regions having different contact angles are in contact with each other, a region having a comparatively higher contact angle is a region having a liquid repellent surface, and a region having a comparatively lower contact angle is a region having a lyophilic surface. When a solution is applied or discharged to the two regions, the solution is spread over the surface of the region having a lyophilic surface and is repelled in a hemispherical shape at the interface between the region having a lyophilic surface and the region having a liquid repellent surface. In the invention, a difference in a contact angle between two regions having different contact angles is preferably 30° or more, more preferably, 40° or more.

When the surface has irregularity, the region having a liquid repellent surface has a much higher contact angle. In other words, the surface becomes more liquid repellent. On the other hand, the region having a lyophilic surface has a much lower contact angle. In other words, the surface becomes more lyophilic. Therefore, a layer having a uniform edge portion can be formed by applying or discharging a solution having a composition to each surface having irregularity and by baking it.

Here, a material which forms a liquid repellent surface is applied or discharged to form a region having a liquid repellent surface. For example, a silane coupling agent expressed in a chemical formula $R_n$—Si—$X_{(4-n)}$ (n=1, 2, or 3) is used as an example of a composition of the solution which forms a liquid repellent surface. Here, R denotes a substance which contains a comparatively inert group such as an alkyl group. X is formed with a hydrolytic group that can be bonded by condensation with a hydroxyl group or absorbed water on the surface of the substrate, such as halogen, a methoxy group, an ethoxy group, or an acetoxy group.

Liquid repellency can be further enhanced by using a fluorine-based silane coupling agent including a fluoroalkyl group as R (fluoroalkyl silane (hereinafter, referred to as FAS)), which is given as a typical example of the silane coupling agent. R of FAS has a structure expressed by $(CF_3)(CF_2)_x(CH_2)_y$ (x: an integer in the range of from 0 to 10, and y: an integer in the range of from 0 to 4). When a plurality of Rs or Xs are bonded to Si, the Rs or Xs may be all the same or different from each othel Heptadecafluoro tetrahydro decyl triethoxysilane, heptadecafluoro tetrahydro decyl trichlorosilane, tridecafluoro tetrahydro octyl trichlorosilan, trifluoropropyl trimethoxysilane, or the like is typically used as FAS.

A solvent which forms a liquid repellent surface, for example, a hydrocarbon-based solvent or tetrahydrofuran such as n-pentane, n-hexane, n-heptane, n-octane, n-decane, dicyclopentane, benzene, toluene, xylene, durene, indene, tetrahydronaphthalene, decahydronaphthalene, or squalane is used as a solvent of the solution which forms a liquid repellent surface.

In addition, a material having a fluorocarbon chain (fluorine-based resin) can be used as an example of the composition of the solution which forms a liquid repellent surface. Polytetrafluoroethylene (PTTE; tetrafluoroethylene resin), perfluoroalkoxy alkane (PFA; tetrafluoroethylene perfluoroalkyl vinylether copolymer resin), perfluoroethylene-propylene copolymer (PFEP; tetrafluoroethylene-hexafluoride propylene copolymer resin), ethylene-tetrafluoroethylene copolymer (ETFE; tetrafluoroethylene-ethylene copolymer resin), polyvinylidene fluoride (PVDF; vinylidene fluoride resin), polychlorotrifluoroethylene (PCTFE; ethylene chloride trifluoride resin), ethylene-chlorotrifluoroethylene copolymer (ECTFE; ethylene chloride trifluoride-ethylene copolymer resin), polytetra-fluoroethylene-perfluoro dioxole copolymer (TFE/PDD), polyvinyl fluoride (PVF; vinyl fluoride resin), or the like can be used as the fluorine-based resin.

When a surface with the solution which forms a liquid repellent surface attached is washed with ethanol, an extremely thin liquid repellent surface can be formed.

The liquid repellent surface may be formed by using an organic material which does not form a liquid repellent surface (in other words, which forms a lyophilic surface) as a mask pattern and then treating the organic material with $CF_4$ plasma or the like. For example, a material in which a water soluble resin such as polyvinyl alcohol (PVA) is mixed into a solvent such as $H_2O$ may be used. Further, PVA and another water soluble resin may be used in combination. Even in the case where the mask pattern has a liquid repellent surface, the liquid repellency can be further enhanced by performing the plasma treatment or the like.

In addition, an electrode provided with a dielectric is prepared, and plasma treatment can be performed by generating plasma so as to expose the dielectric to the plasma using air, oxygen, or nitrogen. In this case, the dielectric need not cover the entire surface of the electrode. A fluorine-based resin can be used as the dielectric. In the case of using a fluorine-based resin, the surface is modified by forming a $CF_2$ bond over a surface to be formed, and thus, the surface can be made liquid repellent. In addition, plasma treatment is performed.

Subsequently, a solution which forms a lyophilic surface is applied or discharged to form a second mask pattern 752. An organic resin such as an acrylic resin, a polyimide resin, a melamine resin, a polyester resin, a polycarbonate resin, a phenol resin, an epoxy resin, polyacetal, polyether, polyurethane, polyamide (nylon), a furan resin, or a diallyl phthalate resin, siloxane, or polysilazane can be used as a typical example of the solution which forms a lyophilic surface. Further, a solution using a polar solvent such as water, alcohols, ethers, dimethylformamide, dimethylacetamide, dimethylsulfoxide, N-methylpyrrolidone, hexamethylphosphamide, chloroform, or methylene chloride can be used. A droplet discharge method, an ink-jet method, a spin coating method, a roll coating method, a slot coating method, or the like can be employed as a method for forming the second mask pattern.

Since the first mask pattern 751 has a liquid repellent surface, the second mask pattern 752 is formed in the outer periphery of the first mask pattern, that is, in a region where the first mask pattern is not formed.

Instead of the above steps, the second mask pattern may be formed by applying the solution which forms a lyophilic surface after drying the solvent of the first mask pattern. A surface of the first mask pattern may be washed with ethanol. According to the above steps, an extremely thin liquid repellent surface can be formed. In addition, a composition of the first mask pattern remains on the surface of the protective film 715 or penetrates into the film.

Figure 41C:
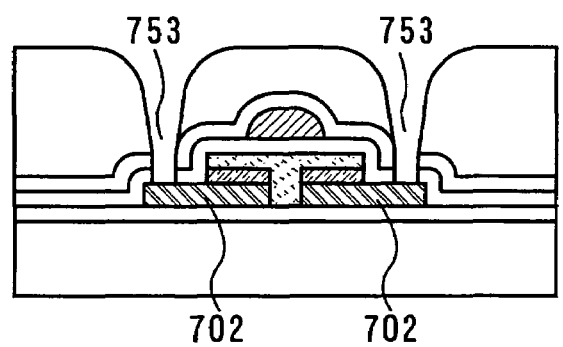

Subsequently, the first mask pattern 751, the protective film 715, and the second insulating film 713 are etched using the second mask pattern 752 as a mask to partially expose the first conductive film 702 as shown in FIG. 41C.

Figure 41D:
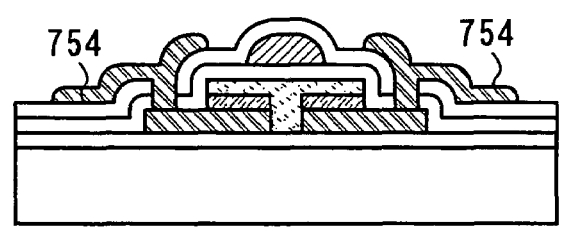

A third conductive layer 754 is formed as shown in FIG. 41D. The third conductive layer 754 serves as a source wiring layer and a drain wiring layer.

Figure 41E:
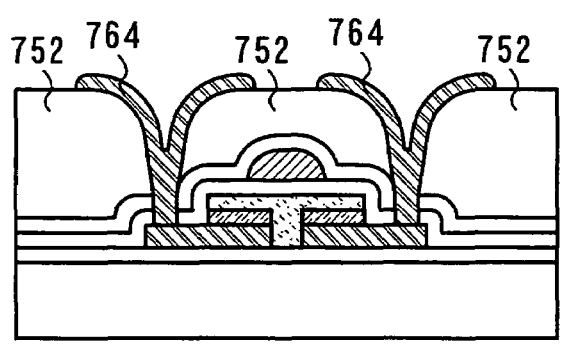

Note that the second mask pattern 752 may be used as an interlayer insulating film without being removed, and then, the third conductive layer 764 may be formed as shown in FIG. 41E.

According to the above steps, a contact hole can be formed without using a photomask.

Embodiment Mode 10

Figure 24:
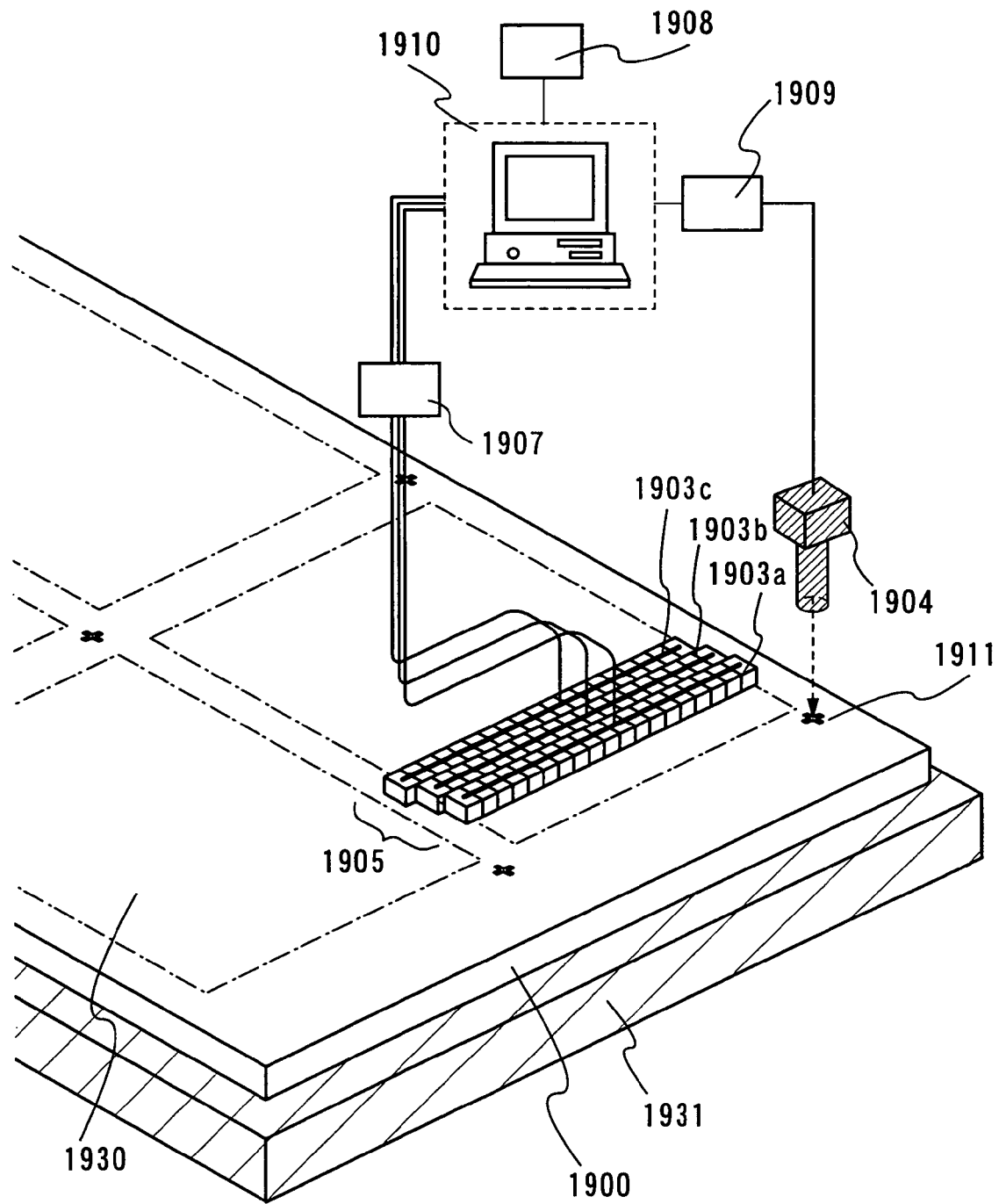
FIG. 24 shows a structure of a droplet discharge apparatus which can be applied to the present invention.

A droplet discharge apparatus which can be used for pattern formation in the above embodiment mode is described in this embodiment mode. In FIG. 24, a region 1930 where one panel is to be formed is shown in dashed line over a substrate 1900.

FIG. 24 shows one mode of a droplet discharge apparatus used to form a pattern such as a wiring. A droplet discharge means 1905 has a head, and the head has a plurality of nozzles. The case of having three heads (1903a, 1903b, and 1903c) each provided with ten nozzles is described in this embodiment mode. However, the number of nozzles and heads can be set in accordance with treatment area, steps, or the like.

The heads are connected to a control means 1907, and the control means controls the heads by a computer 1910, so that a preset pattern can be drawn. A position of drawing may be determined by, for example, using a marker 1911 that is formed over the substrate 1900 or the like fixed to a stage 1931 as a reference point. Alternatively, the position of drawing may be determined by using an edge of the substrate 1900 as a reference point. The reference point is detected by an imaging means 1904 such as a CCD, and changed into a digital signal by an image processing means 1909. Then, the digital signal is recognized by the computer 1910, and a control signal is generated and transmitted to the control means 1907. When the pattern is drawn in this manner, a distance between a pattern formation face and a tip of the nozzle may be set 0.1 cm to 5 cm, preferably, 0.1 cm to 2 cm, more preferably, approximately 0.1 cm. Landing accuracy of a droplet is improved by making the distance short as described above.

At this time, information on a pattern to be formed over the substrate 1900 is stored in a storage medium 1908, and a control signal is transmitted to the control means 1907 based on the information, so that the heads 1903a, 1903b, and 1903c can be individually controlled. In other words, droplets including different compositions can be discharged from each nozzle of the heads 1903a, 1903b, and 1903c. For example, the nozzles of the heads 1903a and 1903b can discharge a droplet including a composition including an insulating film material and the nozzles of the head 1903c can discharge a droplet including a composition including a conductive film material.

Further, the nozzles of the head can also be individually controlled. Since the nozzles can be individually controlled, droplets including different compositions can be discharged from a specific nozzle. For example, one head 1903a can be provided with a nozzle which discharges a droplet including a composition including a conductive film material and a nozzle which discharges a droplet including a composition including an insulating film material.

Note that nozzles are connected to a tank filled with compositions.

In the case of performing droplet discharge treatment on large area, such as a formation step of an interlayer insulating film, a composition including an interlayer insulating film material is preferably discharged from all nozzles. Further, a composition including an interlayer insulating film material is preferably discharged from all nozzles of a plurality of heads. Accordingly, throughput can be improved. Naturally, in the interlayer insulating film formation step, droplet discharge treatment may be performed on large area by discharging a composition including an interlayer insulating film material from one nozzle and by moving the nozzle over the substrate a plurality of times.

Pattern formation on large mother glass can be performed by moving the head in zigzag or shuttling the head. At this time, the head may be moved relative to the substrate a plurality of times. When the head is moved over the substrate, the head is preferably inclined toward a moving direction.

When a plurality of panels is formed out of a large mother glass, the head preferably has a width equal to that of one panel. This is because a pattern can be formed in the region 1930 where one panel is formed by moving the head once; thus, high throughput can be expected.

The head may have a width narrower than that of the panel. At this time, a plurality of heads having a narrow width may be arranged in series to have a width equal to that of one panel. Bending of the heads, which is concerned as a width of the head becomes broader, can be prevented from occurring by arranging a plurality of heads having a narrow width in series. Naturally, a pattern may be formed by moving a head having a narrow width a plurality of times.

A step of discharging a droplet of a composition by a droplet discharge method as described above is preferably performed under reduced pressure. This is because a solvent of the composition is evaporated during a period from the point of discharge to the point of landing on an object to be treated, and thus, both steps of drying and baking of the composition can be omitted. It is preferable to perform the step under reduced pressure, since an oxide film or the like is not formed on the surface of a conductor. In addition, the step of dropping the composition may be performed in a nitrogen atmosphere or an organic gas atmosphere.

A piezo method can be employed as a droplet discharge method. The piezo method is utilized also for an inkjet printer since it has superior droplet controllability and a high degree of freedom for ink selection. Note that the piezo method includes a bender type (typically, a Multi Layer Piezo type), a piston type (typically, a Multi Layer Ceramic Hyper Integrated Piezo segments type), a side wall type, and a roof wall type. Alternatively, a droplet discharge method using a so-called thermal method which makes a heating element generate heat to generate bubbles, thereby pushing out a solution may be employed depending on a solvent of the solution.

Embodiment 1

A method for manufacturing an active matrix substrate and a display panel having the active matrix substrate is described with reference to FIGS. 17A to 23. This embodiment is described using a liquid crystal display panel as a display panel. FIGS. 17A to 17F, FIGS. 18A to 18E, and FIGS. 19A to 19C schematically show a longitudinal section structure of a pixel portion and a connection terminal portion. A plane structure corresponding to line A-B and line C-D is shown in FIGS. 20 to 23. In this embodiment, a step of forming a gate electrode layer is described with reference to Embodiment Mode 1.

Figure 17A:
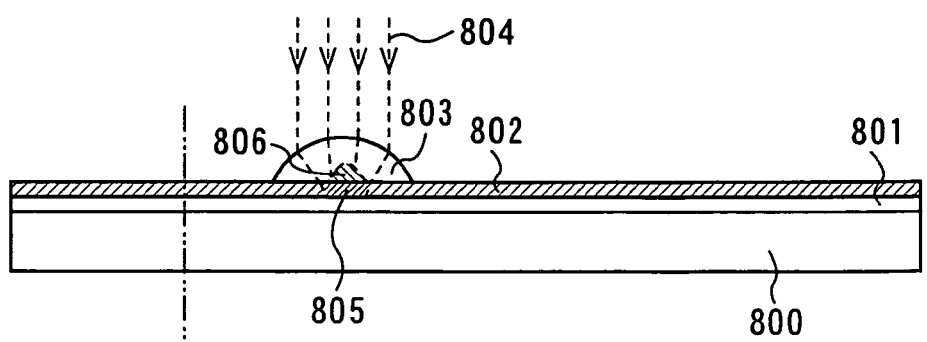
FIGS. 17A to 17F are cross-sectional views showing a step of manufacturing a semiconductor device according to the present invention.

The surface of a substrate 800 is oxidized at a temperature of 400° C. to form an insulating film 801 having a thickness of 100 nm as shown in FIG. 17A. The insulating film serves as an etching stopper film of a conductive film to be formed. Subsequently, a first conductive layer 802 is formed over the insulating film 801. A light transmitting material is discharged by a droplet discharge method to a region over the first conductive layer where a gate electrode layer is to be formed, and then dried or baked to form a first film pattern 803 which is curved. An AN100 glass substrate manufactured by Asahi Glass Co., Ltd. is used as the substrate 800. A tungsten film having a thickness of 100 nm is formed as the first conductive layer 802 by a sputtering method using a tungsten target and an argon gas. Polyimide is used for the first film pattern.

Note that by forming a layer having a liquid repellent surface over the first conductive layer 802 before forming the first film pattern 803, a material of the first film pattern is repelled by the surface and a highly curved film pattern is formed. The layer having a liquid repellent surface is formed according to the method described in Embodiment Mode 9.

Subsequently, light 804 is emitted to the first conductive layer 802 through the first film pattern 803. Laser light emitted from a Nd:YVO$_4$ laser is used as the light. Since the first film pattern is curved here, the laser light is condensed and emitted to the first conductive layer 802. In the first conductive layer, a region irradiated with the laser light is heated. Heat of a heated region 805 is conducted to the first film pattern, and part of the first film pattern is cured to form a first mask pattern 806. Thereafter, an uncured portion of the first film pattern is removed using a removing solution. Here, the first film pattern is heated by the light condensed by the first film pattern; thus, a minute mask pattern can be formed.

Figure 17B:
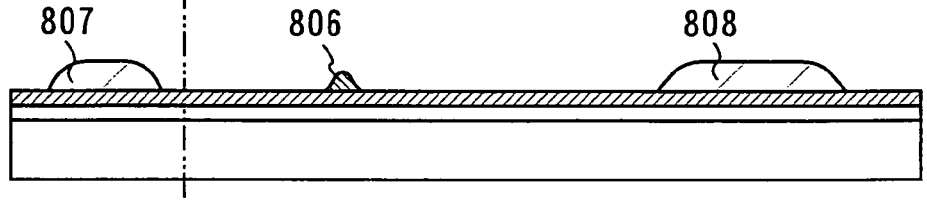

Second mask patterns 807 and 808 are formed as shown in FIG. 17B. Here, polyimide is discharged to a region where a gate wiring layer and a connection conductive layer are to be formed, and then heated at 200° C. for 30 minutes to form the second mask patterns. The gate wiring layer and the connection conductive layer require margins for decreasing resistance and for forming a contact hole, respectively. Therefore, they need not be particularly miniaturized. Accordingly, a step of miniaturizing the second mask patterns by laser light irradiation is omitted. However, the second mask patterns may be formed in a similar manner to the first mask pattern. In this case, a pixel aperture ratio can be improved.

Figure 17C:
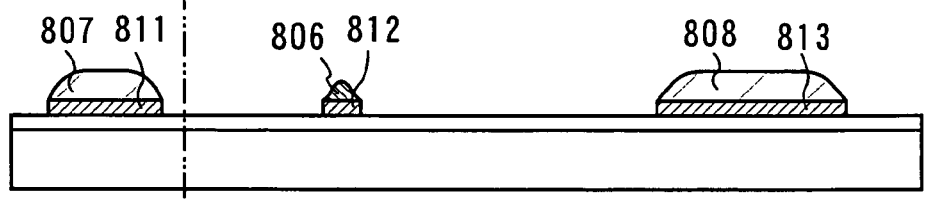
Figure 20:
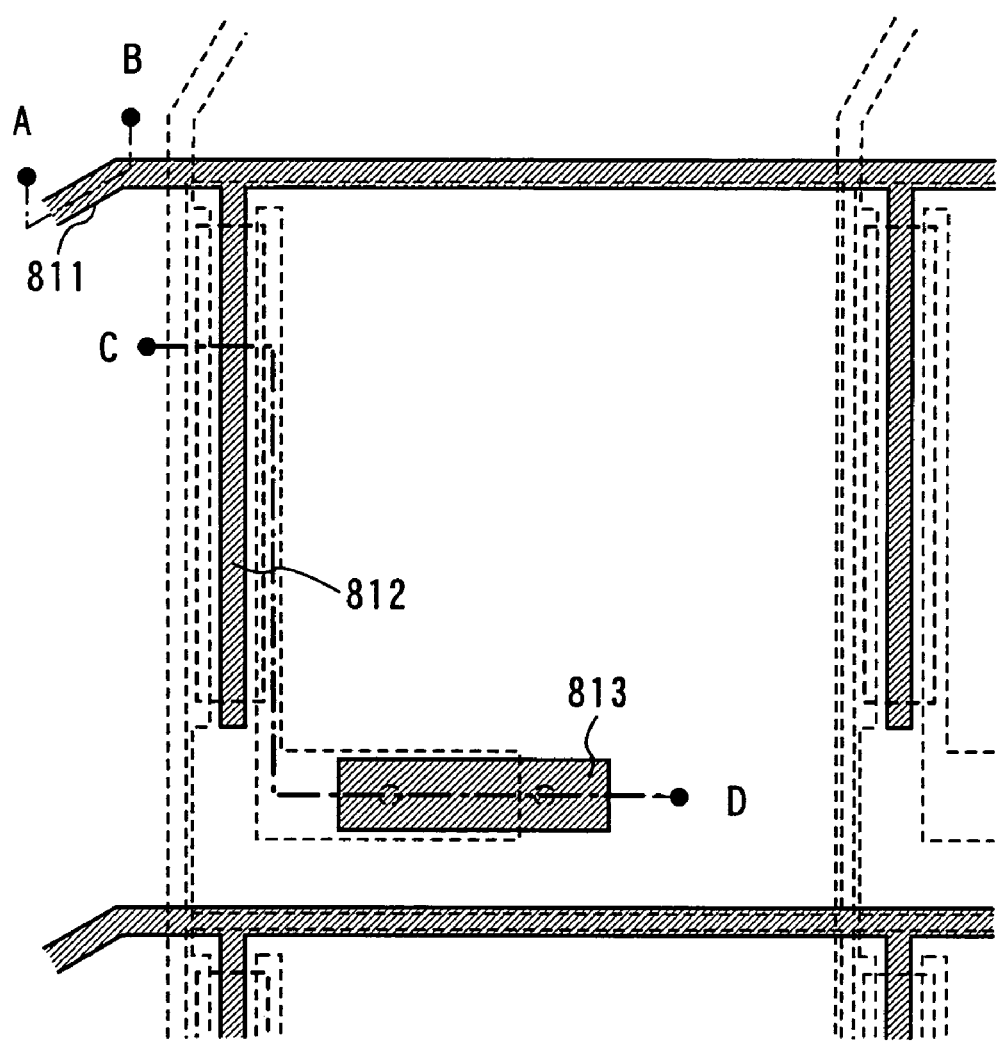
FIG. 20 is a top view showing a step of manufacturing a semiconductor device according to the present invention.

The first conductive layer is partly etched using the first mask pattern 806 and the second mask patterns 807 and 808 to form a gate wiring layer 811, a gate electrode layer 812, and a connection conductive layer 813 as shown in FIG. 17C. Thereafter, the first mask pattern 806 and the second mask patterns 807 and 808 are removed using a removing solution. Note that FIG. 17C schematically shows a longitudinal section structure and a plane structure corresponding to line A-B and line C-D after removing the first mask pattern and the second mask patterns is shown in FIG. 20, so it may be referred to as well.

Figure 17D:
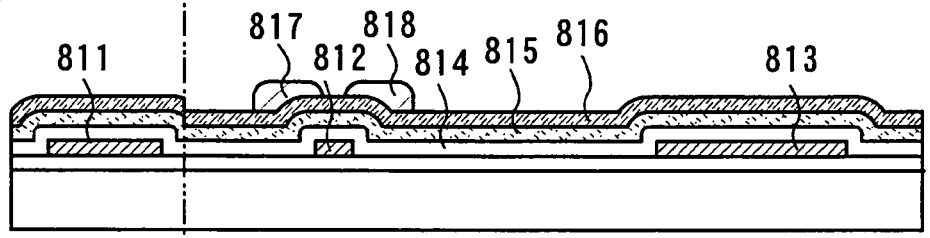

A gate insulating film 814 is formed by a plasma CVD method as shown in FIG. 17D. A silicon oxynitride film (H: 1.8%, N: 2.6%, O: 63.9%, Si: 31.7%) having a thickness of 110 nm is formed as the gate insulating film 814 by a plasma CVD method with the use of SiH$_4$ and N$_2$O (a flow ratio of SiH$_4$:N$_2$O=1:200) in a chamber heated at 400° C.

A first semiconductor film 815 and a second semiconductor film 816 which shows n-type conductivity are formed. An amorphous silicon film is formed as the first semiconductor film 815 to have a thickness of 150 nm by a plasma CVD method. After removing an oxide film on the surface of the amorphous silicon film, a semi-amorphous silicon film is formed as the second semiconductor film 816 to have a thickness of 50 nm by using a silane gas and a phosphine gas.

Third mask patterns 817 and 818 are formed over the second semiconductor film. Polyimide is discharged to the second semiconductor film by a droplet discharge method and heated at 200° C. for 30 minutes to form the third mask patterns. The third mask patterns 817 and 818 are formed over a region where a first semiconductor region is to be formed.

Figure 17E:
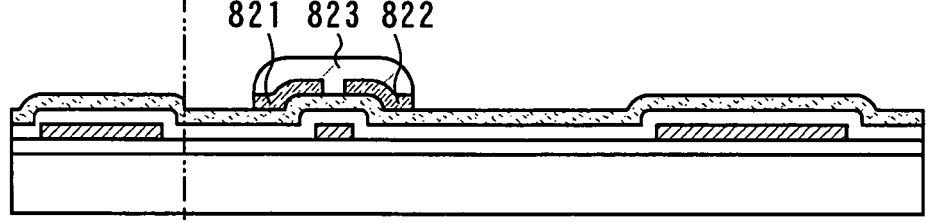

Subsequently, the second semiconductor film 816 is etched using the third mask patterns to form first semiconductor regions (source and drain regions and a contact layer) 821 and 822 as shown in FIG. 17E. The second semiconductor film is etched using a mixed gas with a flow ratio of CF$_4$:O$_2$=10:9. Thereafter, the third mask patterns 817 and 818 are removed using a removing solution.

Figure 17F:
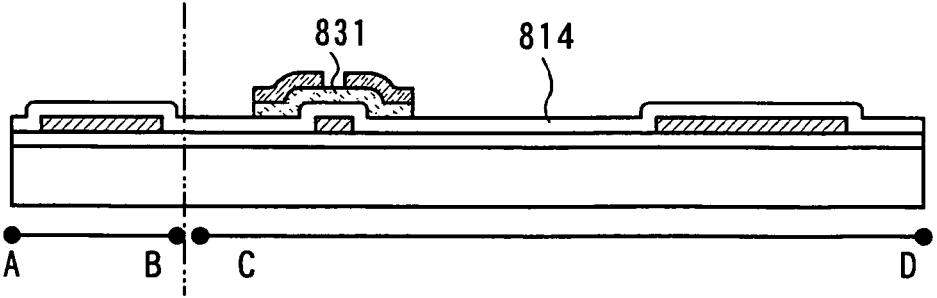
Figure 21:
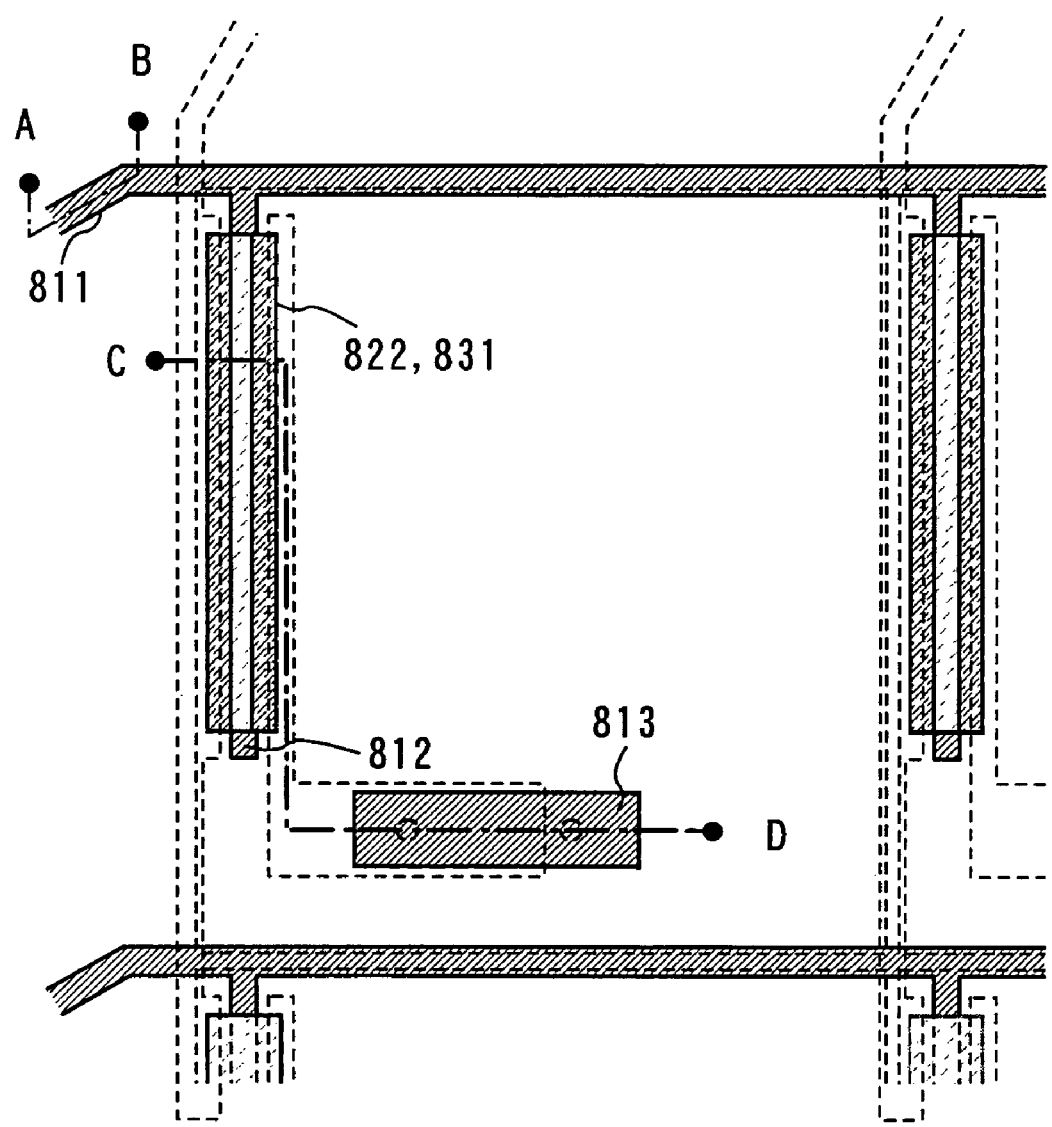
FIG. 21 is a top view showing a step of manufacturing a semiconductor device according to the present invention.

A fourth mask pattern 823 is formed to cover the first semiconductor regions 821 and 822 and the first semiconductor film 815 formed therebetween. The fourth mask pattern is formed of a similar material by a similar method to those of the third mask pattern. The first semiconductor film 815 is etched using the fourth mask pattern to form a second semiconductor region 831 and to expose the gate insulating film 814 as shown in FIG. 17F. The first semiconductor film is etched using a mixed gas with a flow ratio of CF$_4$:O$_2$=10:9, and then, ashing using oxygen is performed. Thereafter, the fourth mask pattern 823 is removed using a removing solution. Note that a plane structure corresponding to a longitudinal section structure taken along line A-B and line C-D shown in FIG. 17F is shown in FIG. 21, so it may be referred to as well.

Figure 18A:
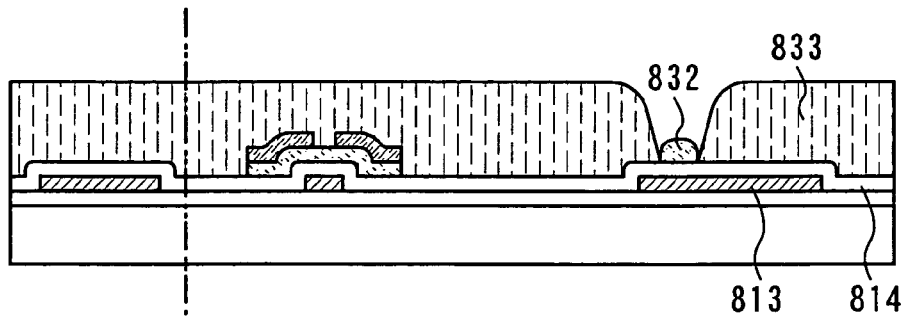
FIGS. 18A to 18E are cross-sectional views showing a step of manufacturing a semiconductor device according to the present invention.

A fifth mask pattern 832 is formed as shown in FIG. 18A. A solution which forms a liquid repellent surface is discharged by a droplet discharge method to a region where the gate insulating film 814 and the connection conductive layer 813 are overlapped with each other to form the fifth mask pattern. Here, a solution of a fluorine-based silane coupling agent dissolved in an alcohol solvent is used as the solution which forms a liquid repellent surface. The fifth mask pattern 832 is a protective film for forming a sixth mask pattern 833 used to form a contact hole in a region where a drain electrode is to be connected to the connection conductive layer 813.

The sixth mask pattern 833 is formed. The sixth mask pattern is a mask for forming a first contact hole and is formed by discharging polyimide by a droplet discharge method and heating at 200° C. for 30 minutes. At this time, the fifth mask pattern 832 is liquid repellent and the sixth mask pattern 833 is lyophilic. Therefore, the sixth mask pattern 833 is not formed in a region where the fifth mask pattern is formed.

The fifth mask pattern 832 is removed by oxygen ashing to expose part of the gate insulating film 814. The exposed part of the gate insulating film is etched using the sixth mask pattern 833. The gate insulating film is etched using CHF$_3$. Thereafter, the sixth mask pattern is removed by oxygen ashing and etching using a removing solution.

Figure 18B:
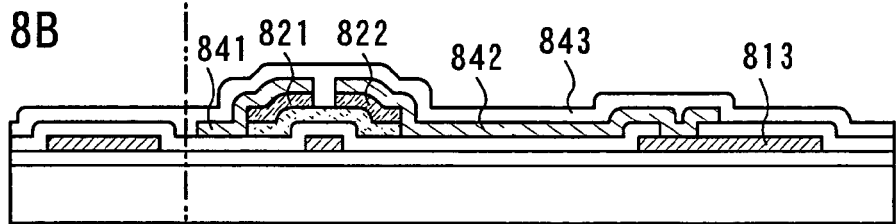
Figure 22:
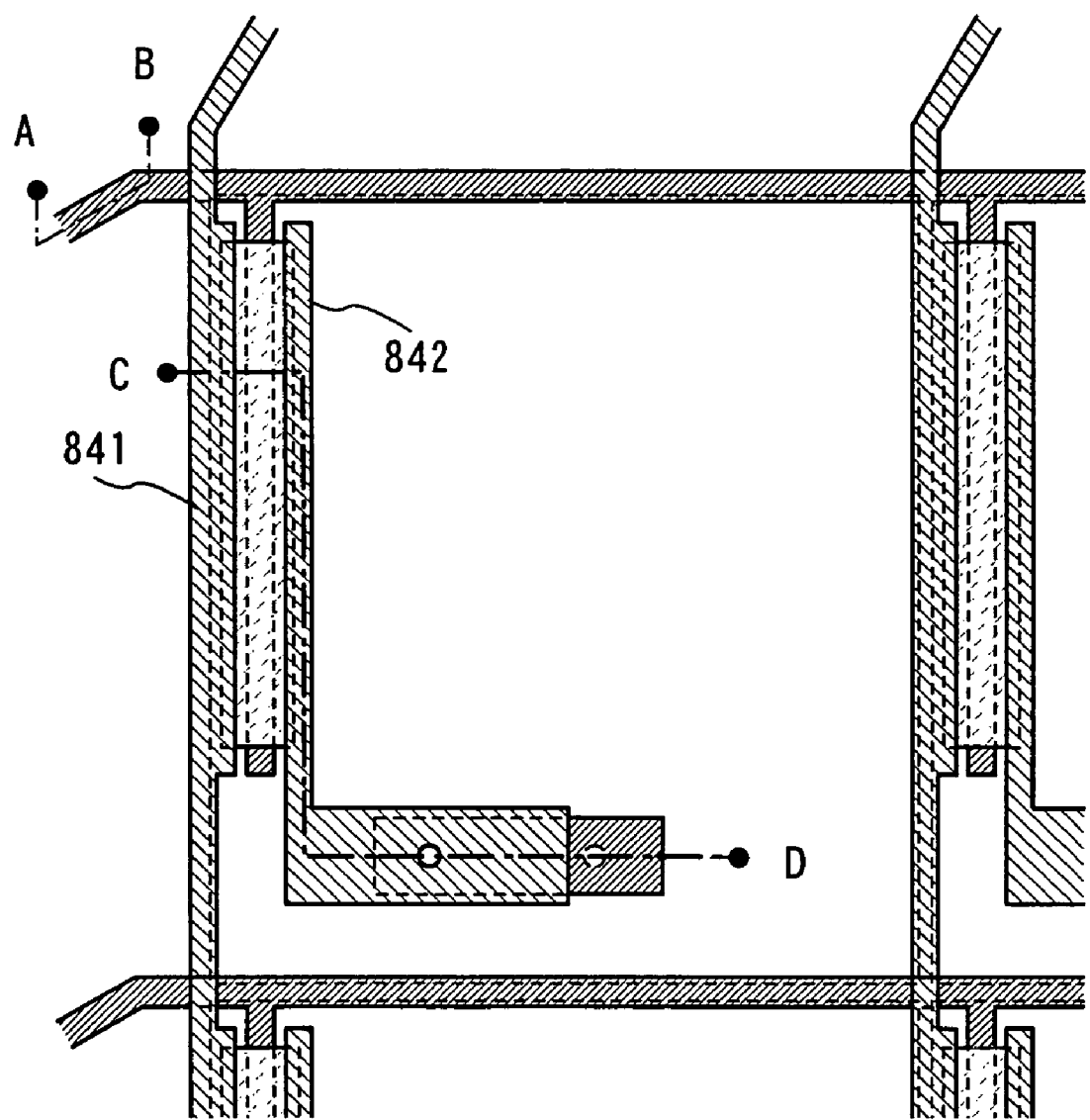
FIG. 22 is a top view showing a step of manufacturing a semiconductor device according to the present invention.

Second conductive layers 841 and 842 are formed by a droplet discharge method as shown in FIG. 18B. The second conductive layers serve as source and drain wiring layers. Here, the second conductive layer 841 is formed to connect to the first semiconductor region 821, and the second conductive layer 842 is formed to connect to the first semiconductor region 822 and the connection conductive layer 813. A solution dispersed with Ag (silver) particles is discharged and dried by heating at 100° C. for 30 minutes and thereafter baked by heating at 230° C. for an hour in an atmosphere with an oxygen concentration of 10% to form the second conductive layers 841 and 842. Note that a plane structure corresponding to a longitudinal section structure taken along line A-B and line C-D shown in FIG. 18B is shown in FIG. 22, so it may be referred to as well.

A protective film 843 is formed. A silicon nitride film having a thickness of 100 nm is formed as the protective film by a sputtering method using a silicon target and argon and nitrogen (a flow ratio of Ar:N$_2$=1:1) as a sputtering gas.

Figure 18C:
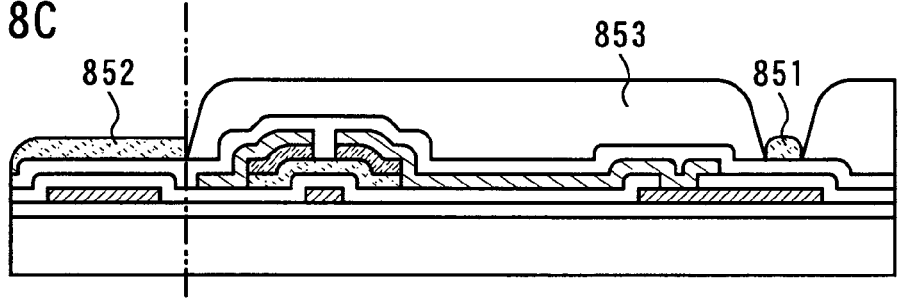

As shown in FIG. 18C, seventh mask patterns 851 and 852 are formed in a region where the protective film 843 and the connection conductive layer 813 are overlapped with each other and in a region where the gate and source wiring layers are connected to a connection terminal. Then, an interlayer insulating film 853 is formed. The seventh mask patterns are masks used to form an interlayer insulating film later. A solution which forms a liquid repellent surface (a solution of a fluorine-based silane coupling agent dissolved in a solvent) is discharged as the seventh mask patterns, and polyimide is discharged as the interlayer insulating film 853 by a droplet discharge method. Thereafter, both of them are baked by heating at 200° C. for 30 minutes and heating at 300° C. for an hour.

The interlayer insulating film 853 can be formed of an inorganic material, a low dielectric constant (low-k) material, silicon oxide, silicon nitride, silicon oxynitride, PSG (phosphosilicate glass), BPSG (borophosphosilicate glass), an alumina film, or the like as well as a heat-resistant organic resin such as polyimide, acrylic, polyamide, or siloxane.

After etching the seventh mask patterns 851 and 852 using a mixed gas of $CF_4$, $O_2$, and He (a flow ratio of $CF_4$:$O_2$:He=8:12:7), the protective film 843 and the gate insulating film 814 are partly etched to form a second contact hole. In the etching step, the protective film 843 and the gate insulating film 814 in the region where the gate and source wiring layers are to be connected to the connection terminal are also etched.

Figure 18D:
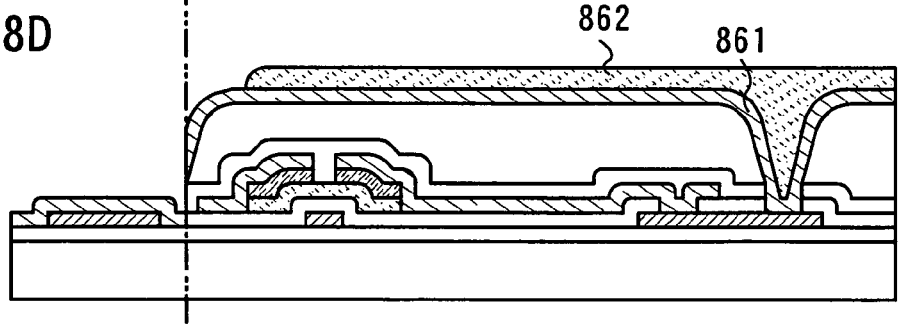

After forming a third conductive layer 861, an eighth mask pattern 862 is formed as shown in FIG. 18D. Indium tin oxide (ITO) containing silicon oxide is formed as the third conductive layer 861 by a sputtering method to have a thickness of 110 nm, and polyimide to be the eighth mask pattern is dropped by a droplet discharge method in a region where a pixel electrode is to be formed and heated at 200° C. for 30 minutes.

Since a transmissive liquid crystal display panel is manufactured in this embodiment, a pixel electrode is formed of ITO containing silicon oxide. Alternatively, the pixel electrode may be formed by forming a predetermined pattern using a solution including indium tin oxide (ITO), zinc oxide (ZnO), indium zinc oxide (IZO), gallium-added zinc oxide (GZO), indium tin oxide containing silicon oxide, or the like and by baking the pattern. In the case of manufacturing a reflective liquid crystal display panel, a solution which mainly includes particles of a metal such as Ag (silver), Au (gold), Cu (copper), W (tungsten), or Al (aluminum) can be used.

Figure 18E:
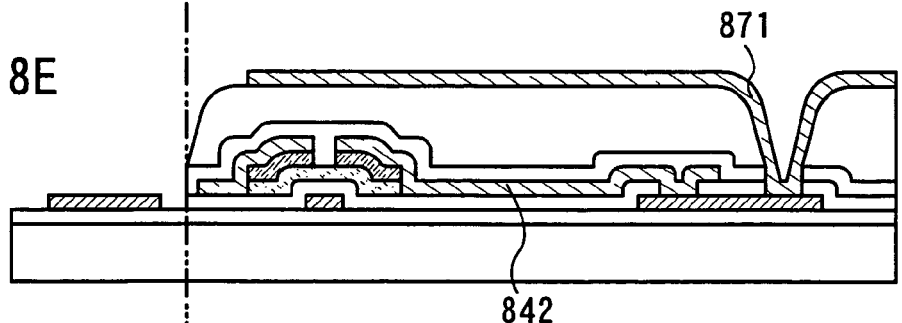
Figure 23:
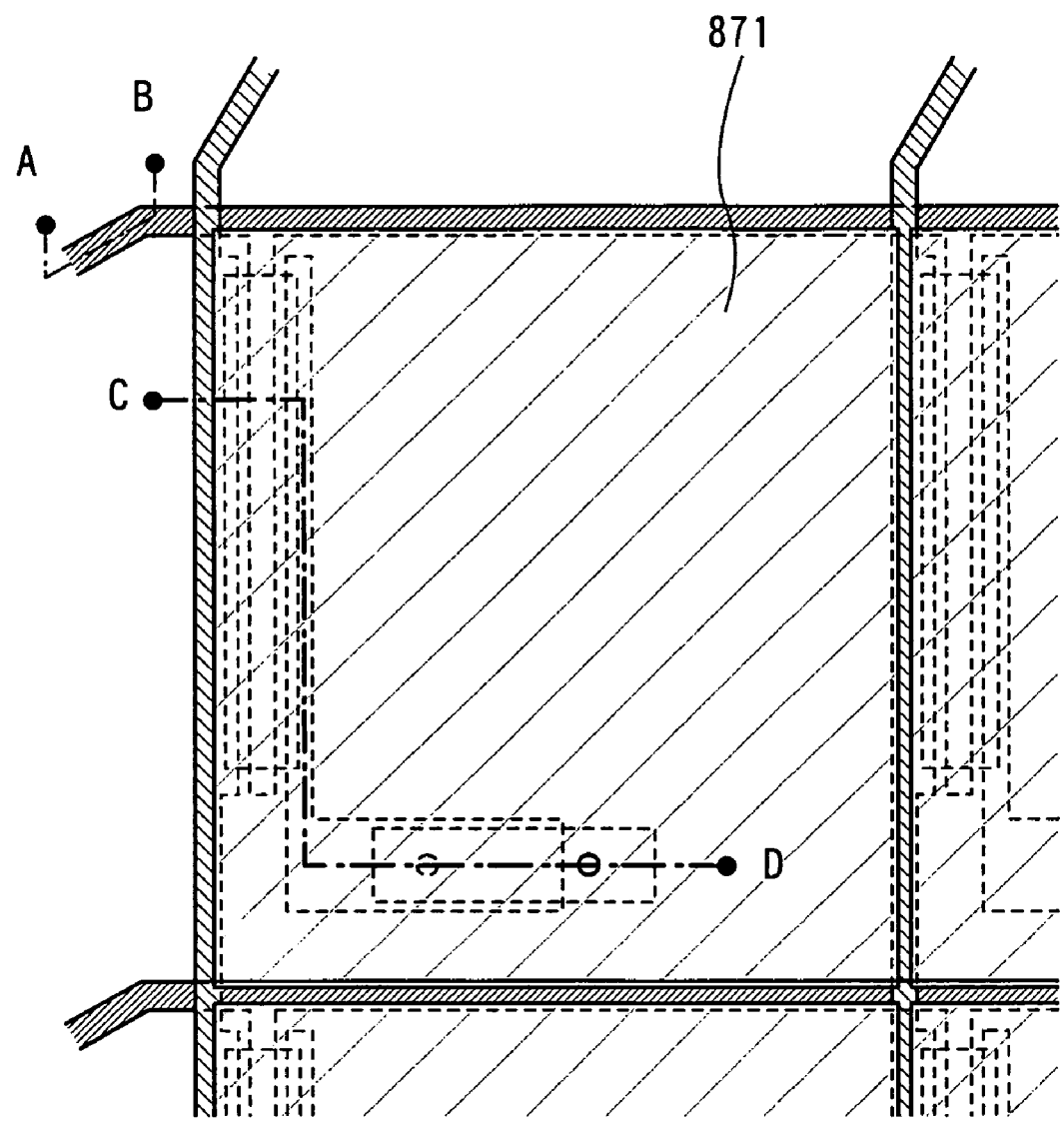
FIG. 23 is a top view showing a step of manufacturing a semiconductor device according to the present invention.

The third conductive film is etched using the eighth mask pattern to form a first pixel electrode 871. In the etching step, the third conductive layer formed in the region where the gate and source wiring layers are connected to the connection terminal is also etched. Thereafter, the eighth mask pattern is removed using a removing solution. Note that a plan view corresponding to line A-B and line C-D in FIG. 18E is shown in FIG. 23.

The first pixel electrode 871 is connected to the connection conductive layer 813 through the second contact hole. Since the connection conductive layer 813 is connected to the second conductive layer 842, the first pixel electrode 871 is electrically connected to the second conductive layer 842. In this embodiment, the second conductive layer 842 is formed of silver (Ag) and the first pixel electrode 871 is formed of ITO containing silicon oxide. However, these are not directly connected to each other, so silver is not oxidized. Thus, the drain wiring layer and the pixel electrode can be electrically connected to each other without increasing contact resistance.

Alternatively, the pixel electrode can be formed, without an etching step, by selectively dropping a solution including a conductive material by a droplet discharge method. Still alternatively, the pixel electrode can be formed by forming a solution which forms a liquid repellent surface as a mask pattern in a region where the pixel electrode is not to be formed and by discharging a conductive solution. In this case, the mask pattern can be removed by ashing using oxygen. The mask pattern may remain without being removed.

According to the above steps, an active matrix substrate can be formed.

Figure 19A:
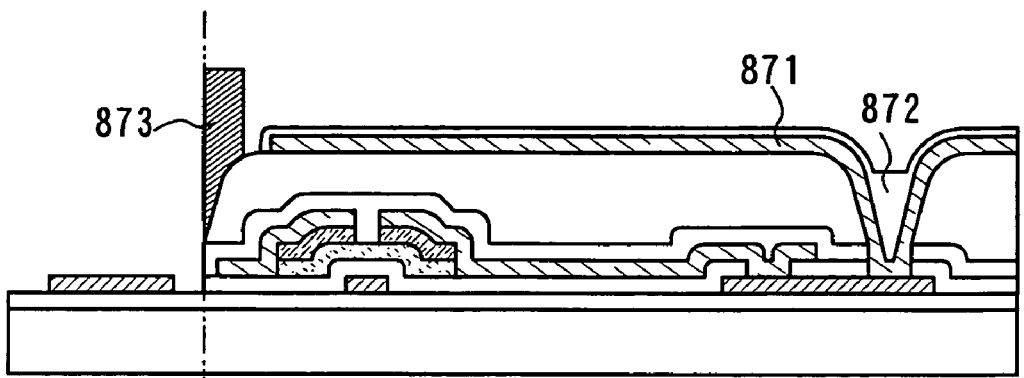
FIGS. 19A to 19C are cross-sectional views showing a step of manufacturing a semiconductor device according to the present invention.

Subsequently, an insulating film is formed by a printing method or a spin coating method to cover the first pixel electrode 871. Then, rubbing is performed on the insulating film to form an orientation film 872 as shown in FIG. 19A. Note that the orientation film 872 can be formed by an oblique evaporation method.

A sealant 873 in the shape of a closed loop is formed by a droplet discharge method in the periphery of a region where a pixel is formed. A liquid crystal material is dropped by a dispenser method (dropping method) inside the closed loop formed by the sealant 873.

Figure 25A:
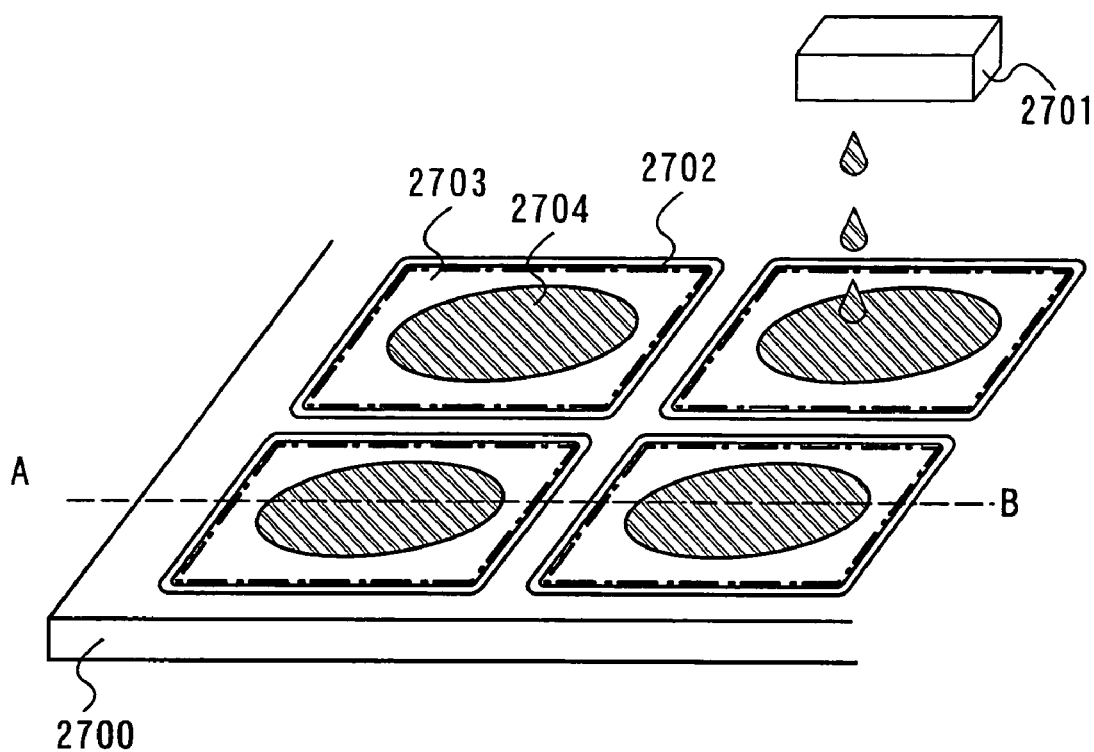
FIGS. 25A and 25B are a perspective view and a cross-sectional view of a liquid crystal dropping method which can be applied to the present invention.

Here, a step of dropping a liquid crystal material is described with reference to FIGS. 25A and 25B. FIG. 25A is a perspective view of a step of dropping a liquid crystal material with a dispenser 2701, and FIG. 25B is a cross-sectional view taken along line A-B in FIG. 25A.

A liquid crystal material 2704 is dropped or discharged from the dispenser 2701 to cover a pixel portion 2703 surrounded by a sealant 2702. A liquid crystal layer can be formed by moving the dispenser 2701 or by moving a substrate 2700 with the dispenser 2701 fixed. In addition, a plurality of dispensers 2701 may be provided to drop a liquid crystal material at a time.

Figure 25B:
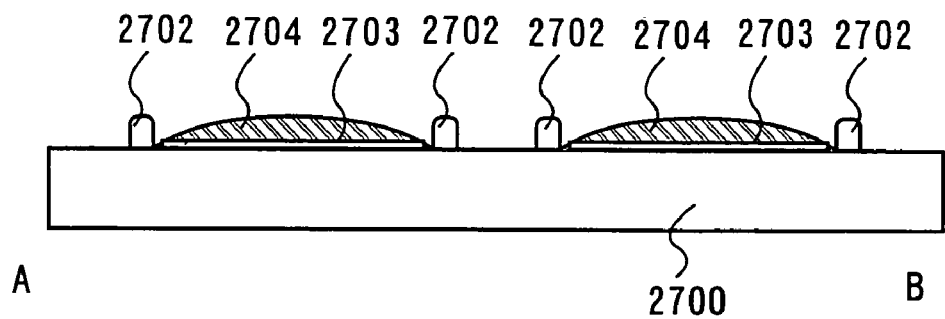

As shown in FIG. 25B, the liquid crystal material 2704 can be selectively dropped or discharged only to a region surrounded by the sealant 2702.

Figure 19B:
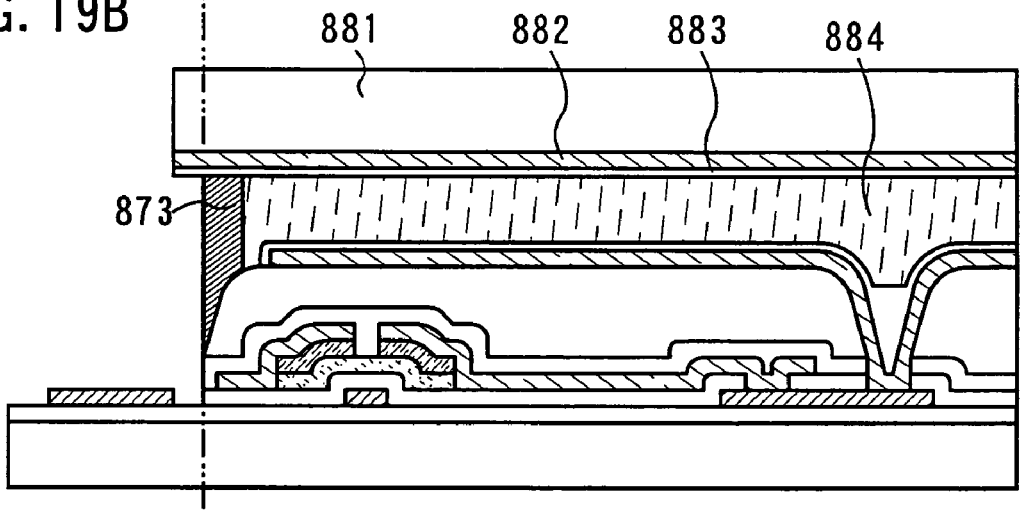

Subsequently, as shown in FIG. 19B, an opposing substrate 881 provided with an orientation film 883 and a second pixel electrode (opposite electrode) 882 is attached to the substrate 800 and ultraviolet curing is performed, in vacuo. Thus, a liquid crystal layer 884 is formed which is the liquid crystal material sandwiched between the substrate and the opposing substrate.

The sealant 873 may be mixed with a filler, and the opposing substrate 881 may be provided with a color filter, a shielding film (black matrix), or the like. Instead of a dispenser method (a dropping method), a dip method (a pumping method) that injects a liquid crystal material using a capillary phenomenon after attaching the opposing substrate can be used as a method for forming the liquid crystal layer 884.

Here, the liquid crystal material is dropped in the pixel portion. However, a liquid crystal material may be dropped on an opposing substrate side; then, a substrate having a pixel portion may be attached thereto.

Figure 19C:
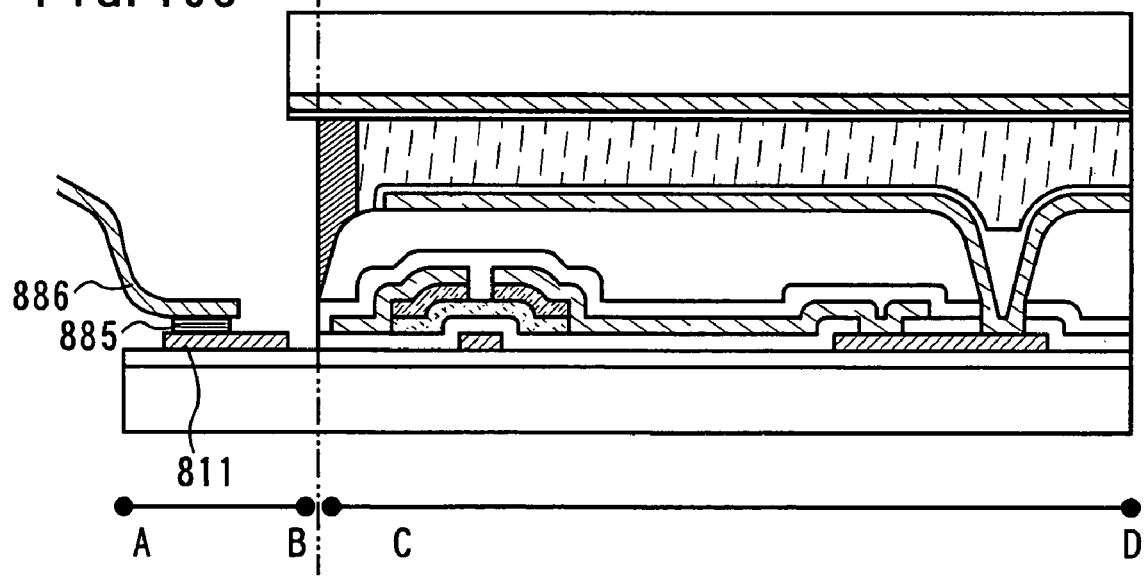

In the case where an insulating film is formed over each edge portion of the gate wiring layer 811 and a source wiring layer (not shown), after removing the insulating film, connection terminals (a connection terminal 886 to be connected to the gate wiring layer and a connection terminal to be connected to the source wiring layer which is not shown) are attached with an anisotropic conductive layer 885 therebetween as shown in FIG. 19C. Further, a connection portion of each wiring layer and connection terminal is preferably sealed with a sealing resin. This structure can prevent moisture from a section from entering and deteriorating the pixel portion. According to the above steps, a liquid crystal display panel can be formed.

According to the above steps, a liquid crystal display panel can be manufactured. Note that a protective circuit, typically, a diode or the like for preventing electrostatic damage may be provided between the connection terminal and the source wiring (gate wiring) or in the pixel portion. In this case, electrostatic damage can be prevented by manufacturing according to a similar step to that of the TFT described above and by connecting the gate wiring layer of the pixel portion to the drain or source wiring layer of the diode.

Note that any of Embodiment Modes 2 to 10 can be applied to this embodiment.

Embodiment 2

A method for manufacturing a light emitting display panel as a display panel is described in this embodiment with reference to FIGS. 27A to 34. FIGS. 27A to 27C, FIGS. 28A to 28C, FIGS. 29A to 29C, and FIGS. 30A and 30B schematically show a longitudinal section structure of a pixel portion and a connection terminal portion and FIGS. 31 to 34 show a plane structure corresponding to a portion of line C-D and line E-F thereof. In this embodiment, a step of forming a gate electrode layer is described with reference to Embodiment Mode 1. Note that A-B in FIGS. 27A to 30B shows a connection terminal portion and C-D and E-F in FIGS. 27A to 34 show regions where a switching TFT, a driving TFT, and a light emitting element are provided in each pixel of a pixel portion.

As shown in FIG. 27A, the surface of a substrate 2000 is oxidized at a temperature of 400° C. to form an insulating film 2002 having a thickness of 100 nm as in Embodiment 1. Subsequently, a first conductive layer 2003 is formed. A light transmitting material is dropped by a droplet discharge method onto a region over the first conductive layer where a gate insulating layer is to be formed, and then dried or baked to form first film patterns 2004 and 2005. An AN100 glass substrate manufactured by Asahi Glass Co., Ltd. is used as the substrate 2001. A tungsten film having a thickness of 100 nm is formed as the first conductive layer by a sputtering method. Polyimide is used for the first film patterns.

Note that a layer having a liquid repellent surface is formed over the first conductive layer 2003 before forming the first film patterns 2004 and 2005. Therefore, a material of the first film patterns is repelled by the surface, and a highly curved film pattern is formed. The layer having a liquid repellent surface is formed according to the method described in Embodiment Mode 9.

Subsequently, the first conductive layer 2003 is irradiated with laser light 2006 and 2007 through the first film patterns 2004 and 2005. Laser light emitted from a Nd:YVO$_4$ laser is used here as the laser light. Accordingly, the first film patterns are partly cured to form first mask patterns 2010 and 2011. Thereafter, the first film patterns 2004 and 2005 are removed using a removing solution. Here, part of the first film patterns is heated by light condensed by the first film patterns; thus, minute mask patterns can be formed.

Second mask patterns 2012 and 2013 are formed. The second mask patterns are formed of a similar material to the second mask pattern in Embodiment 1. The second mask patterns are formed over a region of the first conductive layer where a gate wiring layer, a gate electrode layer, and a connection conductive layer to be formed.

Part of the first conductive layer is etched using the first and second mask patterns 2010 to 2013 to form a gate wiring layer 2015, gate electrode layers 2016 and 2018, and a capacitor electrode layer 2017 as shown in FIG. 27C. Thereafter, the first and second mask patterns 2010 to 2013 are removed using a removing solution.

Figure 28A:
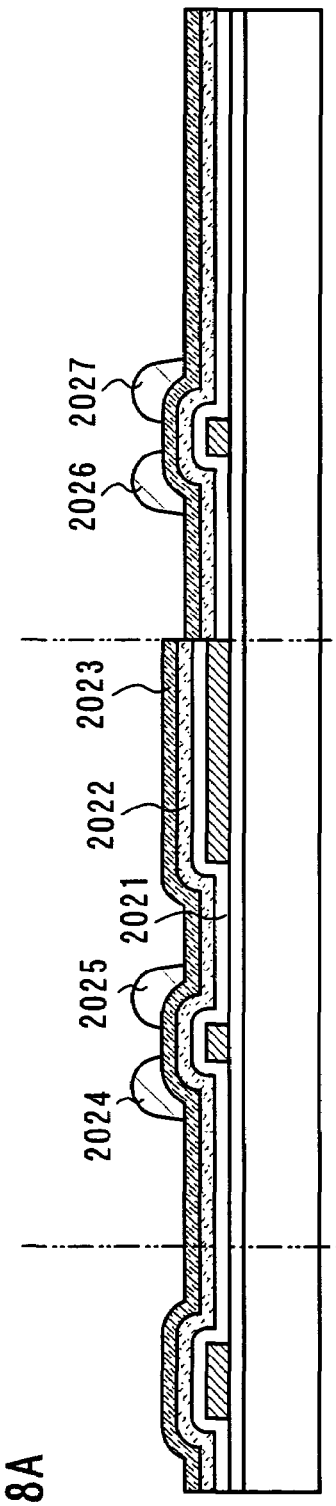
FIGS. 28A to 28C are cross-sectional views showing a step of manufacturing a semiconductor device according to the present invention.

As in Embodiment 1, a gate insulating film 2021, a first semiconductor film 2021, and a second semiconductor film 2023 having n-type conductivity are formed by a plasma CVD method as shown in FIG. 28A. Third mask patterns 2024 to 2027 are formed over the second semiconductor film in a region where first and third semiconductor regions are to be formed. The third mask patterns can be formed in a similar manner to the third mask patterns 817 and 818 in Embodiment 1.

Figure 28B:
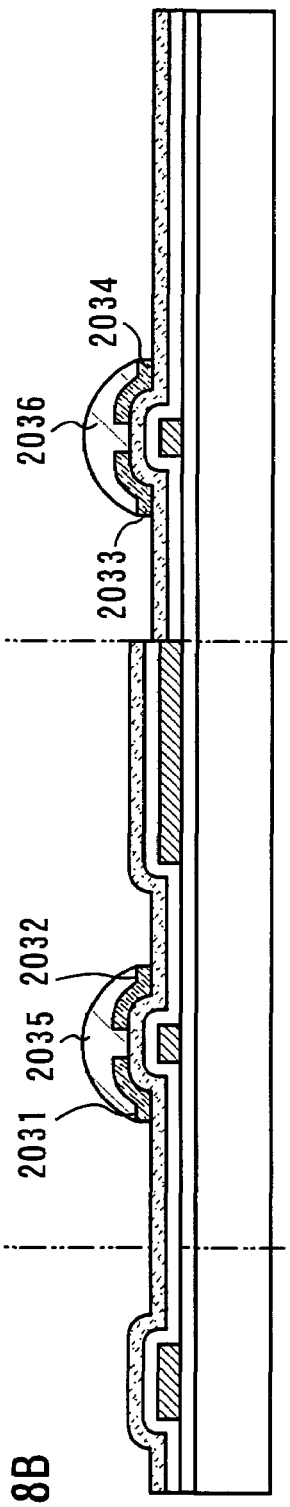

As in Embodiment 1, the second semiconductor film 2023 is etched using the third mask patterns to form first semiconductor regions 2031 to 2034 as shown in FIG. 28B. Thereafter, the third mask patterns are removed using a removing solution.

Figure 28C:
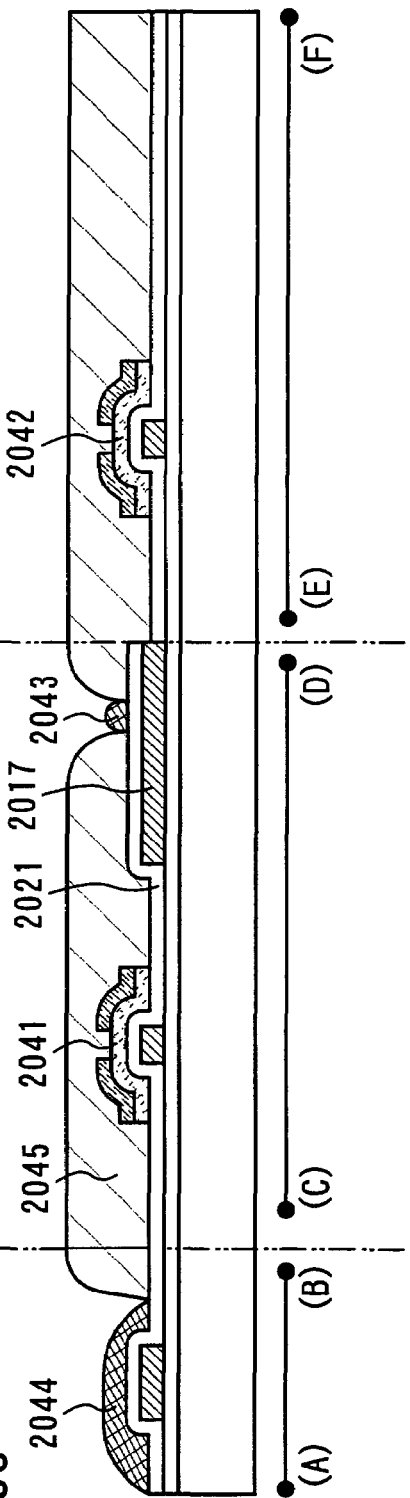
Figure 31:
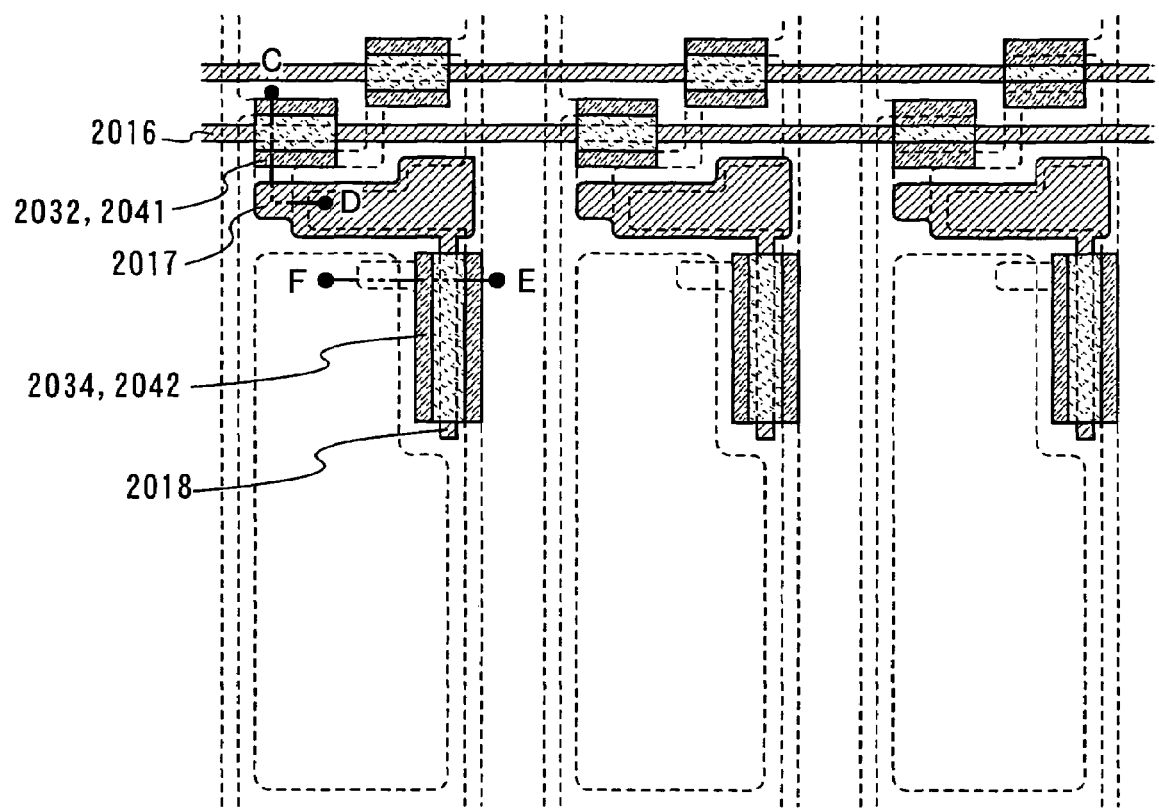
FIG. 31 is a top view showing a step of manufacturing a semiconductor device according to the present invention.

Fourth mask patterns 2035 and 2036 are formed to cover the first semiconductor regions 2031 to 2034 and the first semiconductor film 2022 formed therebetween. The first semiconductor film 2022 is etched using the fourth mask patterns to form second semiconductor regions 2041 and 2042 and to partly expose the gate insulating film 2021 as shown in FIG. 28C. Thereafter, the fourth mask patterns 2035 and 2036 are removed using a removing solution. Note that a plane structure corresponding to a longitudinal section structure taken along line C-D and line E-F at this time is shown in FIG. 31, so it may be referred to as well.

Fifth mask patterns 2043 and 2044 are formed as in Embodiment 1. A solution which forms a liquid repellent surface is discharged by a droplet discharge method to a region where the gate insulating film 2021 and the capacitor electrode layer 2017 are overlapped with each other to form the fifth mask pattern. A sixth mask pattern 2045 is formed. The sixth mask pattern is a mask used to form a first contact hole and is formed by discharging polyimide by a droplet discharge method and heating at 200° C. for 30 minutes. The fifth mask patterns 2043 and 2044 are liquid repellent and the sixth mask pattern 2045 is lyophilic. Therefore, the sixth mask pattern 2045 is not formed in a region where the fifth mask patterns are formed.

The fifth mask patterns 2043 and 2044 are removed by oxygen ashing to expose part of the gate insulating film 2021. The exposed part of the gate insulating film is etched using the sixth mask pattern 2045 as in Embodiment 1. Thereafter, the sixth mask pattern is removed by oxygen ashing and etching using a removing solution.

Figure 32:
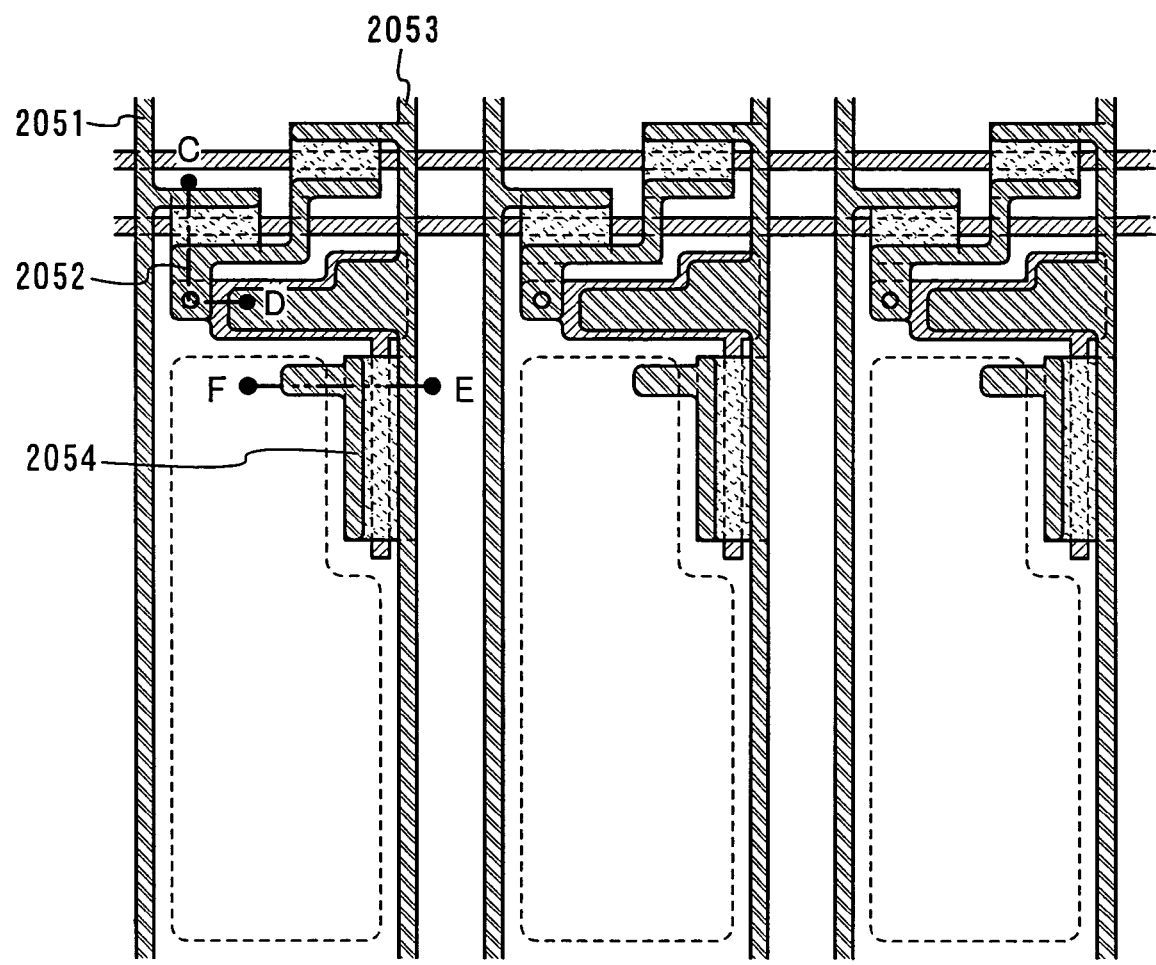
FIG. 32 is a top view showing a step of manufacturing a semiconductor device according to the present invention.

Second conductive layers 2051 to 2054 are formed by a droplet discharge method as shown in FIG. 29A. The second conductive layers serve as source and drain wiring layers. Here, the second conductive layer 2051 is formed to connect to the first semiconductor region 2031, the second conductive layer 2052 is formed to connect to the first semiconductor region 2032 and the capacitor electrode layer 2017, the second conductive layer 2053 is formed to connect to the first semiconductor region 2033, and the second conductive layer 2054 is formed to connect to the first semiconductor region 2034. Note that a plan view corresponding to line C-D and line E-F in FIG. 29A is shown in FIG. 32. The second conductive layer 2053 serves as a power supply line and a capacitor element as shown in FIG. 32.

According to the above steps, a switching TFT 2060a, a driving TFT 2060c, a capacitor element 2060b, and an active matrix substrate having them can be formed.

Subsequently, a third conductive film is formed and etched into a desired shape using a seventh mask pattern to form a first pixel electrode 2055 which is connected to the second conductive layer 2054 of the driving TFT 2060c as shown in FIG. 29B. Indium tin oxide (ITO) containing silicon oxide is formed as the third conductive film to have a thickness of 110 nm as in Embodiment 1 and is etched into a desired shape to form the first pixel electrode 2055. In the etching step, a region of the third conductive layer where the gate and source wiring layers are connected to a connection terminal may also be etched.

Alternatively, the first pixel electrode can be formed, without an etching step, by selectively dropping a solution including a conductive material by a droplet discharge method. Still alternatively, the first pixel electrode can be formed by forming a solution which forms a liquid repellent surface as a mask pattern in a region where the first pixel electrode is not to be formed and by discharging a conductive solution. In this case, the mask pattern can be removed by ashing using oxygen. The mask pattern may remain without being removed.

The first pixel electrode may be formed of indium tin oxide (ITO), zinc oxide (ZnO), indium zinc oxide (IZO), gallium-added zinc oxide (GZO), indium tin oxide containing silicon oxide, or the like instead of the above described material.

Since a light emitting display panel having a structure for emitting generated light to a substrate 2001 side, in other words, a transmissive light emitting display panel is described in this embodiment, the first pixel electrode is formed using a light transmitting conductive film. However, in the case of manufacturing a light emitting display panel having a structure for emitting generated light to the opposite side of the substrate 2001, in other words, a reflective light emitting display panel, the first pixel electrode can be formed using a solution which mainly includes particles of metal such as Ag (silver), Au (gold), Cu (copper), W (tungsten), Al (aluminum), or the like.

Figure 33:
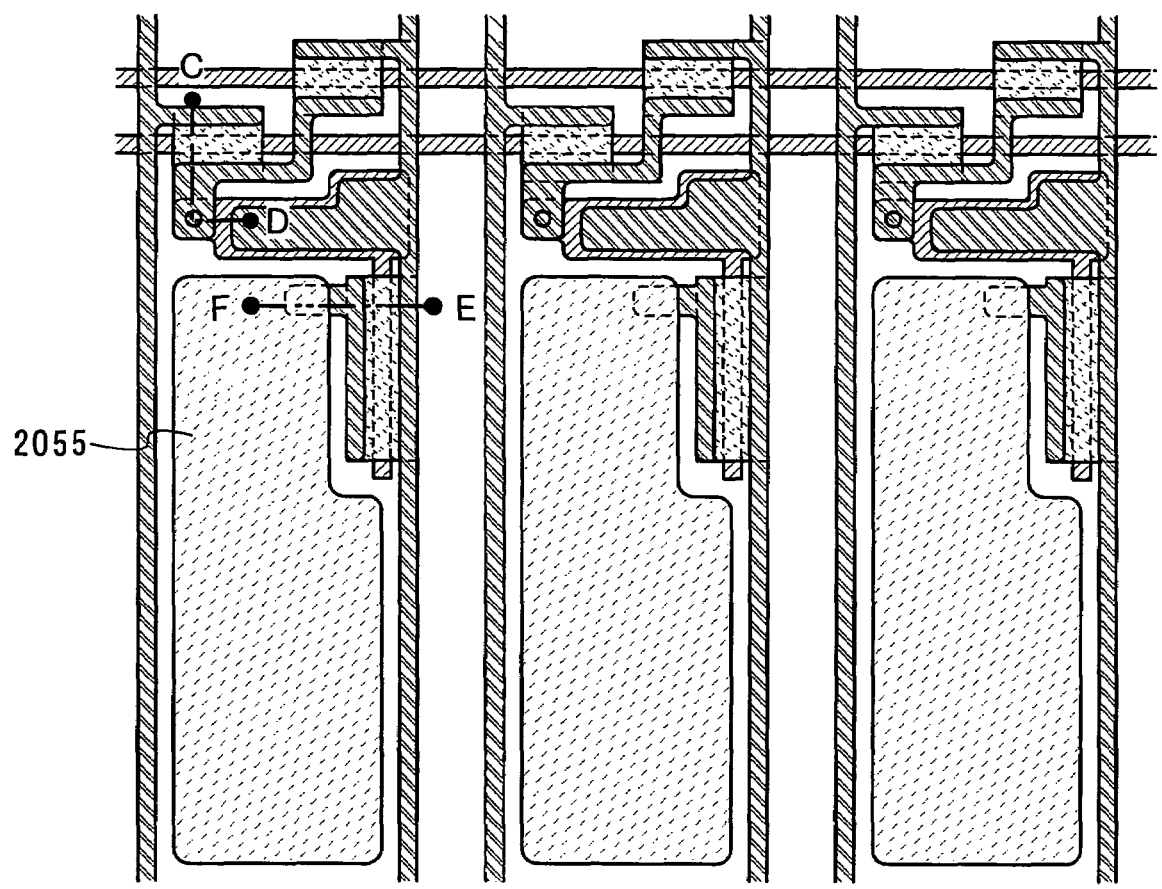
FIG. 33 is a top view showing a step of manufacturing a semiconductor device according to the present invention.

The seventh mask pattern is removed using a removing solution. Note that a plan view corresponding to line C-D and line E-F in FIG. 29B is shown in FIG. 33.

Subsequently, a protective layer 2061 of silicon nitride or silicon nitride oxide and an insulating layer 2062 are entirely formed. The insulating layer 2062 is formed through an etching process after an insulating layer is entirely formed by a spin coating method or a dipping method. An insulating layer is etched using the insulating layer 2062 as a mask so as to expose the first pixel electrode 2055 to form the protective layer 2061. The etching process is not necessarily required when the insulating layer 2062 is formed by a droplet discharge method.

Figure 34:
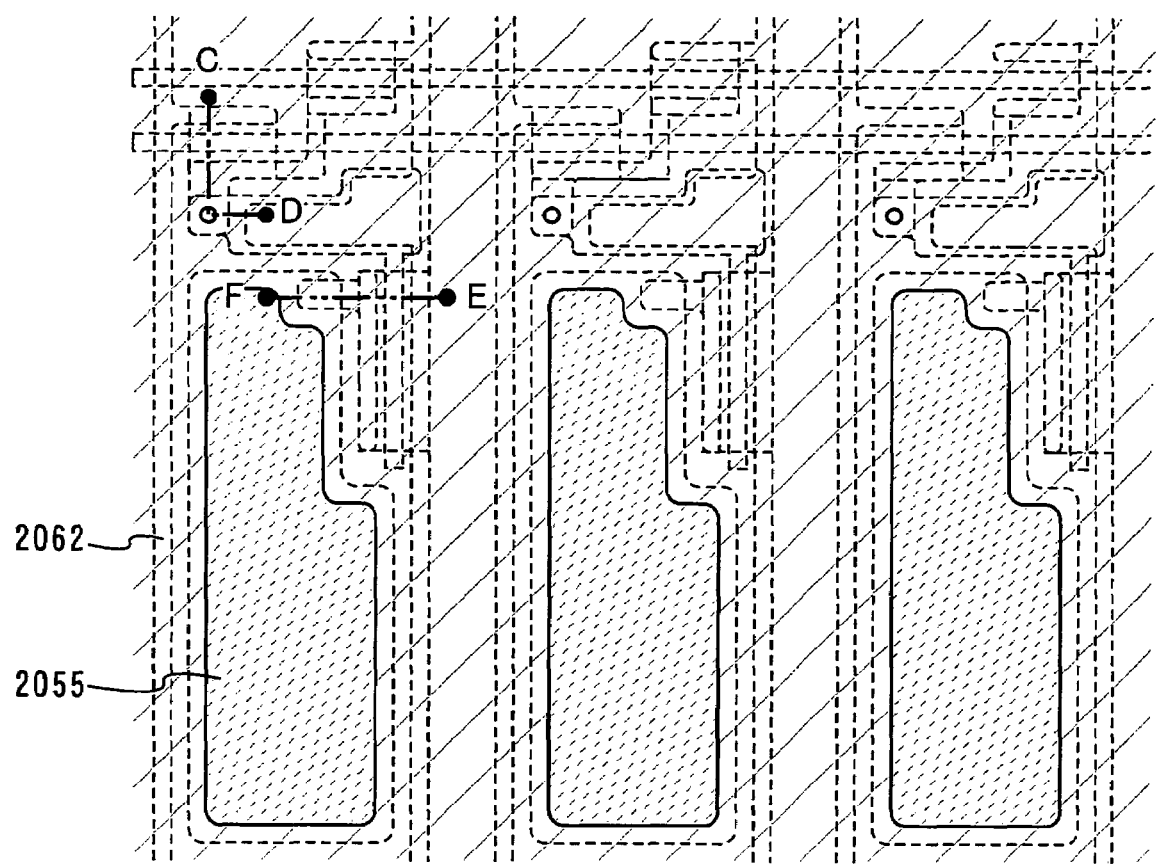
FIG. 34 is a top view showing a step of manufacturing a semiconductor device according to the present invention.

The insulating layer 2062 can be formed of an inorganic insulating material such as silicon oxide, silicon nitride, silicon oxynitride, aluminum oxide, aluminum nitride, or aluminum oxynitride; acrylic acid; methacrylic acid; a derivative of acrylic acid or methacrylic acid; a heat-resistant high molecular weight material such as polyimide, aromatic polyamide, or polybenzimidazole; an inorganic siloxane-based insulating material including a Si—O—Si bond among compounds that contain silicon, oxygen, and hydrogen and formed by using a siloxane material as a starting material; or an organosiloxane-based insulating material in which hydrogen bonded with silicon is substituted by an organic group such as methyl or phenyl. It is preferable to form the insulating layer by using a photosensitive or non-photosensitive material such as acrylic or polyimide, since a side face thereof becomes a shape in which the radius of curvature continuously changes and an upper-layer thin film is formed without break. The insulating layer can be formed of an insulating film including a color pigment, resist, or the like. Since the insulating layer serves as a light shielding film in this case, the contrast of a display device to be formed can be enhanced. Note that a plan view corresponding to line C-D and line E-F in FIG. 29C is shown in FIG. 34.

After a layer including a light emitting material 2073 is formed by an evaporation method or an application method such as a spin coating method or ink-jetting, a second pixel electrode 2074 is formed, thereby forming a light emitting element 2075. The light emitting element 2075 is connected to the driving TFT 2060c. Thereafter, a protective laminated layer is formed to seal the light emitting element 2075. The protective laminated layer is a laminated layer of a first inorganic insulating film, a stress relaxation film, and a second inorganic insulating film.

Note that moisture adsorbed inside or on the surface of the insulating layer 2062 is removed by performing heat treatment at 200° C. under atmospheric pressure before forming the layer including a light emitting material 2073. In addition, heat treatment is preferably performed at 200° C. to 400° C., preferably, 250° C. to 350° C. under reduced pressure, and the layer including a light emitting material 2073 is preferably formed by a vacuum evaporation method or a droplet discharge method under reduced pressure without being exposed to atmospheric air.

Surface treatment may be performed on the surface of the first pixel electrode 2055 by exposing the surface to oxygen plasma or irradiating the surface with ultraviolet light.

The layer including a light emitting material 2073 may be formed of a charge injection transport material and a light emitting material containing an organic compound or an inorganic compound. The layer including a light emitting material includes one or plural kinds of layers of a low molecular weight organic compound, an intermediate molecular weight organic compound typified by dendrimer, oligomer, or the like, and a high molecular weight organic compound. The layer including a light emitting material may be combined with an electron injection transport or hole injection transport inorganic compound.

As a highly electron transporting material among charge injection transport materials, a metal complex that has a quinoline skeleton or a benzoquinoline skeleton such as tris (8-quinolinolato)aluminum [Alq$_3$], tris(4-methyl-8-quinolinolato)aluminum [Almq$_3$], bis(10-hydroxy-benzo[h]quinolinato)beryllium [BeBq$_2$], or bis(2-methyl-8-quinolinolato)(4-phenylphenolato)aluminum [BAlq], and the like can be used.

As a highly hole transporting material, an aromatic amine compound (in other words, a compound having a benzene ring-nitrogen bond) such as 4,4'-bis[N-(1-naphthyl)-N-phenyl-amino]-biphenyl [α-NPD], N,N'-diphenyl-N,N'-bis(3-methylphenyl)-1,1'-biphenyl-4,4'-diamine [TPD], 4,4',4"-tris(N,N-diphenyl-amino)triphenylamine [TDATA], or 4,4', 4"-tris[N-(3-methylphenyl)-N-phenylamino]triphenylamine [MTDATA] can be used.

As a highly electron injecting material among charge injection transport materials, a compound of an alkali metal or an alkaline earth metal such as lithium fluoride (LiF), cesium fluoride (CsF), or calcium fluoride (CaF$_2$) can be specifically used. The highly electron injecting material may be a mixture of a highly electron transporting material such as Alq$_3$ and magnesium (Mg) or an alkaline earth metal.

As a highly hole injecting material among charge injection transport materials, metal oxide such as molybdenum oxide (MoO$_x$), vanadium oxide (VO$_x$), ruthenium oxide (RuO$_x$), tungsten oxide (WO$_x$), or manganese oxide (MnO$_x$) can be used. In addition, a phthalocyanine compound such as phthalocyanine [H$_2$Pc] or copper phthalocyanine (CuPc) can be used.

A light emitting layer may perform color display by providing each pixel with light emitting layers having different emission wavelength bands using a light emitting material. Typically, a light emitting layer corresponding to each color of R (red), G (green), and B (blue) is formed. In this case, color purity can be increased and a pixel portion can be prevented from having a mirror surface (glare) by providing a light emitting side of a pixel with a filter (colored layer) which transmits light of an emission wavelength band. Providing a filter (colored layer) can omit a circularly polarizing plate or the like which is conventionally required and can eliminate the loss of light emitted from the light emitting layer. Further, change in hue, which occurs when a pixel portion (display screen) is obliquely seen, can be reduced.

A light-emitting material forming the light emitting layer includes various materials. As to a low molecular weight organic light emitting material, 4-(dicyanomethylene)$_2$-methyl-6-[2-(1,1,7,7-tetramethyljulolidine-9-yl)ethenyl]-4H-pyran [DCJT], 4-dicyanomethylene-2-t-butyl-6-[2-(1,1,7,7-tetramethyl julolidine-9-yl-ethenyl)-4H-pyran [DCJTB], periflanthene, 2,5-dicyano-1,4-bis[2-(10-methoxy-1,1,7,7-tetramethyl julolidine-9-yl)ethenyl]benzene, N,N'-dimethyl quinacridon [DMQd], coumarin 6, coumarin 545T, tris(8-quinolinolate)aluminum [Alq$_3$], 9,9'-bianthryl, 9,10-diphenylanthracene [DPA], 9,10-di(2-naphthyl)anthracene [DNA], or the like can be used. In addition, another material can also be used.

On the other hand, a high molecular weight organic light emitting material is physically stronger than a low molecular weight material and is superior in durability of the element. In addition, a high molecular weight material can be used for application, and therefore, the element is relatively easily manufactured. A light emitting element using a high molecular weight organic light emitting material has basically the same structure as that of a light emitting element using a low molecular weight organic light emitting material, in other words, a cathode/a layer including a light emitting material/ an anode. However, a two-layer structure is employed in many cases when a layer including a light emitting material using a high molecular weight organic light emitting material is formed. This is because it is difficult to form such a laminated structure as in the case of using a low molecular weight organic light emitting material. Specifically, the light emitting element using a high molecular weight organic light emitting material has a structure of a cathode/a light emitting layer/a hole transport layer/an anode.

The emission color is determined by the material of the light emitting layer. Therefore, a light emitting element that emits desired light can be formed by selecting an appropriate material of the light emitting layer. A polyparaphenylene-vinylene-based material, a polyparaphenylene-based material, a polythiophen-based material, or a polyfluorene-based material can be used as a high molecular weight light emitting material that can be used to form the light emitting layer.

A derivative of poly(paraphenylene vinylene) [PPV], for example, poly(2,5-dialkoxy-1,4-phenylene vinylene) [RO-PPV], poly(2-(2'-ethyl-hexoxy)-5-metoxy-1,4-phenylene vinylene) [MEH-PPV], poly(2-(dialkoxyphenyl)-1,4-phenylene vinylene) [ROPh-PPV], or the like can be used as the polyparaphenylene-vinylene-based material. A derivative of polyparaphenylene [PPP], for example, poly(2,5-dialkoxy-1, 4-phenylene) [RO-PPP], poly(2,5-dihexoxy-1,4-phenylene), or the like can be used as the polyparaphenylene-based material. A derivative of polythiophene [PT], for example, poly(3-alkylthiophene) [PAT], poly(3-hexylthiophene) [PHT], poly (3-cyclohexylthiophene) [PCHT], poly(3-cyclohexyl-4-methilthiophene) [PCHMT], poly(3,4-dicyclohexylthiophene) [PDCHT], poly[3-(4-octylphenyl)-thiophene] [POPT], poly[3-(4-octylphenyl)-2,2 bithiophene] [PTOPT], or the like can be used as the polythiophene-based material. A derivative of polyfluorene [PF], for example, poly (9,9-dialkylfluorene) [PDAF], poly(9,9-dioctylfluorene) [PDOF], or the like can be used as the polyfluorene-based material.

Note that a property of hole injection from an anode can be enhanced by interposing a high molecular weight organic light emitting material having hole transporting properties between an anode and a high molecular weight organic light emitting material having light emitting properties. This hole transporting material is generally dissolved into water together with an acceptor material, and the solution is applied by a spin coating method or the like. Since the hole transporting material is insoluble in an organic solvent, a laminate with the above-described light emitting material having light emitting properties can be formed. A mixture of PEDOT and camphor sulfonic acid (CSA) which serves as an acceptor material, a mixture of polyaniline [PANI] and polystyrene sulfonic acid [PSS] which serves as an acceptor material, and the like can be used as the high molecular weight organic light emitting material having hole transporting properties.

In addition, the light emitting layer can be formed to emit monochrome or white light. In the case of using a white light emitting material, a filter (colored layer) which transmits light having a specific wavelength is provided on a light emitting side of a pixel, thereby performing color display.

In order to form a light emitting layer which emits white light, for example, Alq$_3$, Alq$_3$ partially doped with Nile red that is a red light emitting pigment, p-EtTAZ, and TPD (aromatic diamine) are sequentially laminated by an evaporation method to obtain white light. When the light emitting layer is formed by an application method using spin coating, the layer after application is preferably baked by vacuum heating. For example, an aqueous solution of poly(ethylene dioxythiophene)/poly(styrene sulfonic acid) (PEDOT/PSS) may be entirely applied and baked to form a film that functions as a hole injection layer. Then, a polyvinyl carbazole (PVK) solution doped with a light emitting center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) may be entirely applied and baked to form a film that functions as a light emitting layer.

The light emitting layer can be formed to be a single layer. A 1,3,4-oxadiazole derivative (PBD) having electron transporting properties may be dispersed in polyvinyl carbazole (PVK) having hole transporting properties. Another method to obtain white light emission is to disperse PBD of 30 wt % as an electron transporting agent and to disperse four kinds of pigments (TPB, coumarin 6, DCM1, and Nile red) in appropriate amounts. In addition to the light emitting elements described here that provide white light emission, a light emitting element that provides red light emission, green light emission, or blue light emission can be manufactured by appropriately selecting materials of the light emitting layer.

Further, a triplet excitation material containing a metal complex or the like as well as a singlet excitation light emitting material may be used for the light emitting layer. For example, among pixels emitting red, green, and blue light, a pixel emitting red light whose luminance is reduced by half in a relatively short time is made of a triplet excitation light emitting material and the rest are made of a singlet excitation light emitting material. A triplet excitation light emitting material has a characteristic that the material has a good luminous efficiency and consumes less power to obtain the same luminance. When a triplet excitation light emitting material is used for a red pixel, only small amount of current needs to be applied to a light emitting element. Thus, reliability can be improved. A pixel emitting red light and a pixel emitting green light may be made of a triplet excitation light emitting material and a pixel emitting blue light may be made of a singlet excitation light emitting material to achieve low power consumption. Low power consumption can be further achieved by forming a light emitting element which emits green light that has high visibility with a triplet excitation light emitting material.

A metal complex used as a dopant is an example of a triplet excitation light emitting material, and a metal complex having platinum that is a third transition series element as a metal center, a metal complex having iridium as a metal center, and the like are known. A triplet excitation light emitting material is not limited to the compounds. A compound having the above described structure and an element belonging to any of Groups 8 to 10 of the periodic table as a metal center can also be used.

The above described materials for forming the layer including a light emitting material are just examples. A light emitting element can be formed by appropriately laminating functional layers such as a hole injection transport layer, a hole transport layer, an electron injection transport layer, an electron transport layer, a light emitting layer, an electron blocking layer, and a hole blocking layer. Further, a mixed layer or a mixed junction may be formed by combining these layers. The layer structure of the light emitting layer can be varied. Instead of providing a specific electron injection region or light emitting region, modification such as providing an electrode for the purpose or providing a dispersed light emitting material is acceptable as long as it does not deviate from the scope of the invention.

A light emitting element formed with the above described material emits light by being biased in a forward direction. A pixel of a display device formed with a light emitting element can be driven by a simple matrix mode or an active matrix mode. In any event, each pixel emits light by applying a forward bias thereto in specific timing; however, the pixel is in a non-light-emitting state for a certain period. Reliability of a light emitting element can be improved by applying a backward bias at this non-light-emitting time. In a light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating driving. Thus, reliability of a light emitting device can be improved.

Subsequently, a sealant 2081 is formed and sealing is performed using a sealing substrate 2082 as shown in FIG. 30B. Subsequently, connection terminals (a connection terminal 2084 to be connected to the gate wiring layer and a connection terminal to be connected to the source wiring layer which is not shown) are attached to each edge portion of the gate wiring layer 2011 and a source wiring layer (not shown) with an anisotropic conductive layer 2083 therebetween. Further, a connection portion of each wiring layer and connection terminal is preferably sealed with a sealing resin 2085. This structure can prevent moisture from a section from entering and deteriorating the pixel portion. According to the above steps, a light emitting display panel can be formed.

According to the above steps, a light emitting display panel can be manufactured. Note that a protective circuit, typically, a diode or the like for preventing electrostatic damage may be provided between the connection terminal and the source wiring layer (gate wiring layer) or in the pixel portion. In this case, electrostatic damage can be prevented by manufacturing according to a similar step to that of the TFT described above and by connecting the gate wiring layer of the pixel portion to the drain or source wiring layer of the diode.

Note that any of Embodiment Modes 2 to 10 can be applied to this embodiment. Embodiments 1 and 2 are described using a liquid crystal display panel and a light emitting display panel, respectively, as a display panel; however, the invention is not limited thereto. The invention can be appropriately applied to an active display panel such as a DMD (Digital Micromirror Device), a PDP (Plasma Display Panel), a FED (Field Emission Display), an electrophoretic display device (electronic paper), or the like.

Embodiment 3

A mode of a light emitting element applicable to the above embodiment is described with reference to FIGS. 36A to 36D.

Figure 36A:
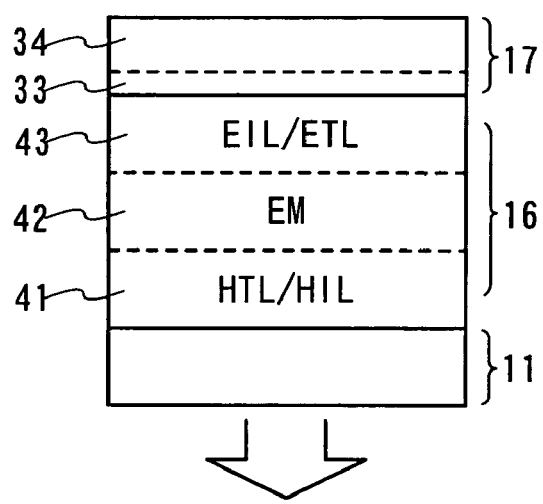
FIGS. 36A to 36D show a mode of a light emitting element which can be applied to the present invention.

FIG. 36A shows an example of a light emitting element whose first pixel electrode 11 is formed of a light transmitting oxide conductive material. The first pixel electrode 11 is formed of an oxide conductive material containing silicon oxide with a concentration of 1 atomic % to 15 atomic %. A layer including a light emitting material 16 is formed thereover, which is a laminate of a hole injection layer or hole transport layer 41, a light emitting layer 42, and an electron transport layer or electron injection layer 43. A second pixel electrode 17 is formed with a first electrode layer 33 containing an alkali metal or alkaline earth metal such as LiF, or MgAg and a second electrode layer 34 formed of a metal material such as aluminum. A pixel of this structure can emit light from the first pixel electrode 11 as indicated by an arrow in the figure.

Figure 36B:
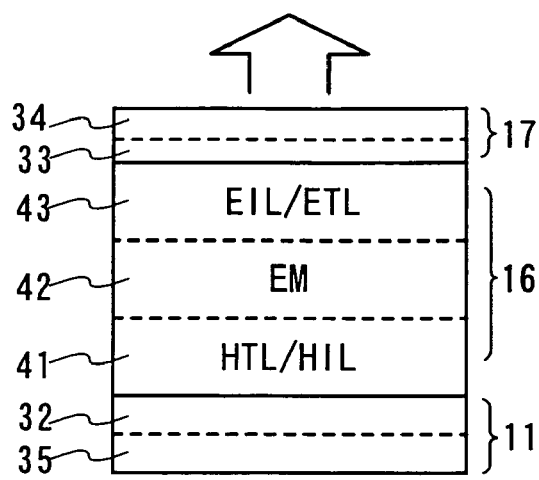

FIG. 36B shows an example of a light emitting element which emits light through a second pixel electrode 17. A first pixel electrode 11 is formed with a first electrode layer 35 formed of metal such as aluminum or titanium or the metal and a metal material containing nitrogen with concentrations of a stoichiometric composition ratio or less and a second electrode layer 32 formed of an oxide conductive material containing silicon oxide with a concentration of 1 atomic % to 15 atomic %. A layer including a light emitting material 16 is formed thereover, which is a laminate of a hole injection layer or hole transport layer 41, a light emitting layer 42, and an electron transport layer or electron injection layer 43. A second pixel electrode 17 is formed with a third electrode layer 33 containing alkali metal or alkaline earth metal such as LiF or CaF and a fourth electrode layer 34 formed of a metal material such as aluminum. Each layer is formed to have a thickness of 100 nm or less so that the layer can transmit light. Accordingly, light can be emitted through the second pixel electrode 17.

In the case of emitting light from both sides, from the first pixel electrode and the second pixel electrode in a light emitting element having the structure of FIG. 36A or 36B, a light transmitting conductive film having high work function is used for the first pixel electrode 11. A light transmitting conductive film having low work function is used for the second pixel electrode 17. Typically, the first pixel electrode 11 is formed of an oxide conductive material containing silicon oxide with a concentration of 1 atomic % to 15 atomic %, and the second pixel electrode 17 is formed of the third conductive layer 33 containing an alkali metal or alkaline earth metal such as LiF or CaF and the fourth electrode layer 34 formed of a metal material such as aluminum, each of which has a thickness of 100 nm or less.

Figure 36C:
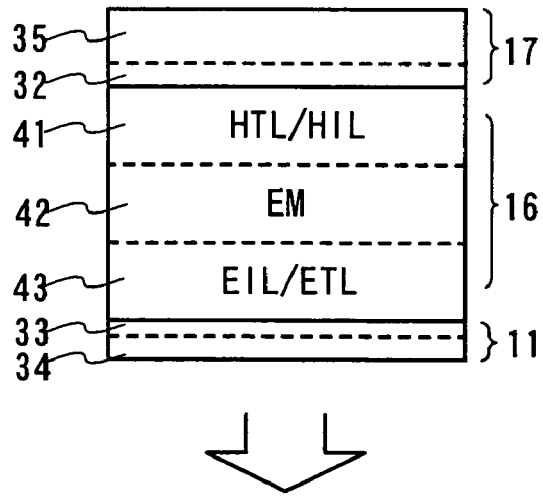

FIG. 36C shows an example of a light emitting element which emits light through a first pixel electrode 11 and a structure in which a layer containing a light emitting material 16 is formed by sequentially laminating an electron transport layer or electron injection layer 43, a light emitting layer 42, and a hole injection layer or hole transport layer 41. A second pixel electrode 17 is formed, from the side of the layer containing a light emitting material 16, with a second electrode layer 32 formed of an oxide conductive material containing silicon oxide with concentrations of 1 atomic % to 15 atomic % and a first electrode layer 35 formed of a metal such as aluminum or titanium or the metal and a metal material containing nitrogen with a concentration of a stoichiometric composition ratio or less. The first pixel electrode 11 is formed with a third electrode layer 33 containing alkali metal or alkaline earth metal such as LiF or CaF and a fourth electrode layer 34 formed of a metal material such as aluminum. Each layer is formed to have a thickness of 100 nm or less so that the layer can transmit light. Accordingly, light can be emitted through the first pixel electrode 11.

Figure 35A:
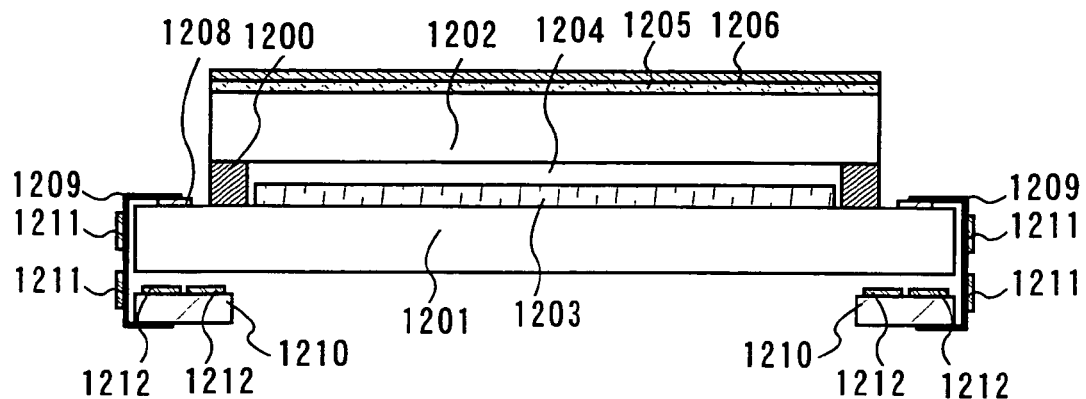
FIGS. 35A to 35C show a structure of a light emitting display module according to the present invention.
Figure 36D:
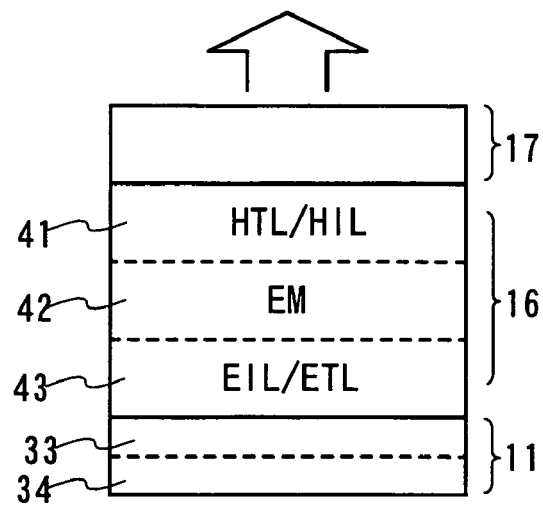

FIG. 36D shows an example of a light emitting element which emits light through a second pixel electrode 17 and a structure in which a layer including a light emitting material 16 is formed by sequentially laminating an electron transport layer or electron injection layer 43, a light emitting layer 42, and a hole injection layer or hole transport layer 41. The first pixel electrode 11 is formed to have a similar structure to that shown in FIG. 35A and to be thick to the extent that the first pixel electrode can reflect light emitted from the layer including a light emitting material. The second pixel electrode 17 is formed of an oxide conductive material containing silicon oxide with a concentration of 1 atomic % to 15 atomic %. In this structure, the hole injection layer or hole transport layer 41 is formed of inorganic metal oxide (typically, molybdenum oxide or vanadium oxide). Accordingly, oxygen to be introduced in forming the second pixel electrode 17 is supplied and hole injection properties are improved. Thus, drive voltage can be lowered.

In the case of emitting light from both sides, from the first pixel electrode and the second pixel electrode in a light emitting element having the structure of FIG. 36C or 36D, a light transmitting conductive film having low work function is used for the first pixel electrode 11. A light transmitting conductive film having high work function is used for the second pixel electrode 17. Typically, the first pixel electrode 11 is formed with the third conductive layer 33 containing an alkali metal or alkaline earth metal such as LiF or CaF and the fourth electrode layer 34 formed of a metal material such as aluminum, each of which has a thickness of 100 nm or less, and the second pixel electrode 17 may be formed of an oxide conductive material containing silicon oxide with a concentration of 1 atomic % to 15 atomic %.

Embodiment 4

A pixel circuit of a light emitting display panel described in the above embodiments and an operating method thereof are described with reference to FIGS. 37A to 37F. In a light emitting device in which a video signal is digital, a method for operating a light emitting display panel includes a method in which a video signal inputted to a pixel is regulated by voltage and a method in which a video signal is regulated by current. The method in which a video signal is regulated by voltage includes a method in which voltage applied to a light emitting element is constant (CVCV) and a method in which current applied to a light emitting element is constant (CVCC). In addition, the method in which a video signal is regulated by current includes a method in which voltage applied to a light emitting element is constant (CCCV) and a method in which current applied to a light emitting element is constant (CCCC). In this embodiment, a pixel which performs CVCV operation is described with reference to FIGS. 37A and 37B. A pixel which performs CVCC operation is described with reference to FIGS. 37C to 37F.

Figure 37A:
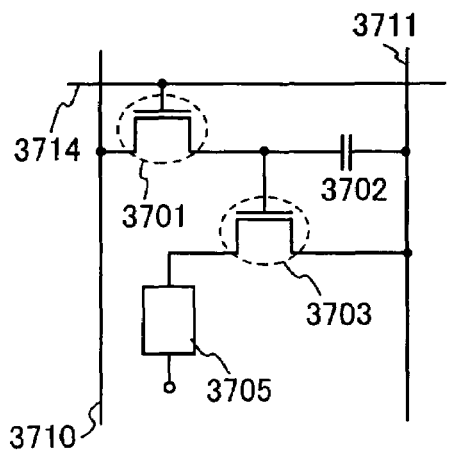
FIGS. 37A to 37F are cross-sectional views showing a structure of a pixel which can be applied to a light emitting display panel of the present invention.
Figure 37B:
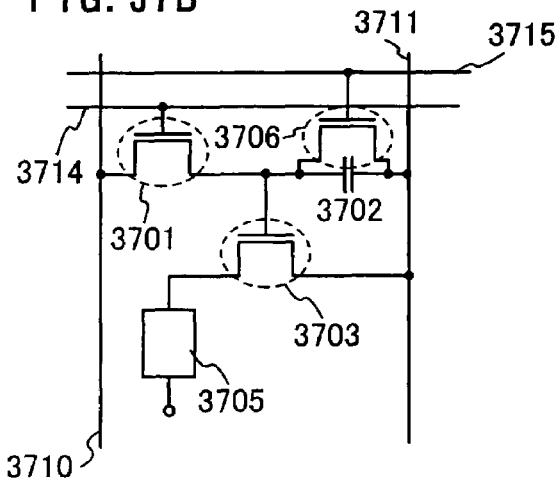

In a pixel shown in FIGS. 37A and 37B, a signal line 3710 and a power supply line 3711 are arranged in a column direction and a scanning line 3714 is arranged in a row direction. In addition, the pixel includes a switching TFr 3701, a driving TFT 3703, a capacitor element 3702, and a light emitting element 3705.

Note that the switching TFT 3701 and the driving TFT 3703 operate in a linear region when they are turned on. The driving TFT 3703 has a role of controlling voltage application to the light emitting element 3705. It is preferable from the viewpoint of manufacturing steps that both of the TFTs have the same conductivity. In this embodiment, the TFTs are formed to be n-channel TFTs. Further, the driving TFT 3703 may be a depletion mode TFr as well as an enhancement mode TFT. In addition, a ratio of a channel width W to a channel length L (W/L) of the driving TFT 3703 preferably ranges from 1 to 1000, although it depends on the mobility of the TFr. The higher the W/L is, the more electric characteristics of the TFT are improved.

In the pixels shown in FIGS. 37A and 37B, the TFT 3701 is a TFT for controlling input of a video signal to the pixel. When the TFT 3701 is turned on, the video signal is inputted to the pixel. Then, voltage of the video signal is stored in the capacitor element 3702.

In FIG. 37A, an opposing electrode of the light emitting element is an anode and an electrode connected to the driving TFT 3703 is a cathode, in the case where the power supply line 3711 is Vss and the opposing electrode of the light emitting element 3705 is Vdd, in other words, in the case of FIGS. 36C and 36D. In this case, luminance variation due to variation in characteristics of the driving TFT 3703 can be suppressed.

In FIG. 37A, an opposing electrode of the light emitting element is a cathode and an electrode connected to the driving TFT 3703 is an anode, in the case where the power supply line 3711 is Vdd and the opposing electrode of the light emitting element 3705 is Vss, in other words, in the case of FIGS. 36A and 36B. In this case, voltage of the video signal is held in the capacitor element 3702 and the driving TFT 3703 operates in a linear region by inputting the video signal having higher voltage than Vdd to the signal line 3710. Therefore, luminance variation due to variation in characteristics of the TFT can be suppressed.

The pixel shown in FIG. 37B has a similar structure to the pixel shown in FIG. 37A except that a TFT 3706 and a scanning line 3715 are added.

In the TFT 3706, ON or OFF is controlled by the scanning line 3715 that is newly arranged. When the TFr 3706 is turned ON, an electric charge held in the capacitor element 3702 is discharged, and the TFT 3703 is turned OFF. In other words, it is possible to make a state in which current is forced not to flow through the light emitting element 3705 by disposing the TFT 3706. Therefore, the TFT 3706 can be referred to as an erasing TFT. Accordingly, in the structure in FIG. 37B, a lighting period can be started simultaneously with or immediately after a start of a writing period without waiting for writing of signals in all pixels. Consequently, a duty ratio of light emission can be improved.

In the pixel having the above operation structure, the amount of electric current of the light emitting element 3705 can be determined by the driving TFT 3703 which operates in a linear region. According to the above-described structure, luminance variation of the light emitting element, which is caused by variation in characteristics of the TFT, can be improved, and a display device with improved image quality can be provided.

Subsequently, a pixel which performs CVCC operation is described with reference to FIGS. 37C to 37F. The pixel shown in FIG. 37C is provided with a power supply line 3712 and a current control TFT 3704 in addition to the pixel structure shown in FIG. 37A.

Figure 37C:
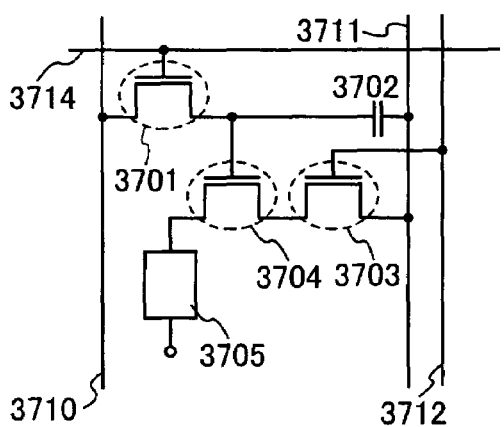
Figure 37D:
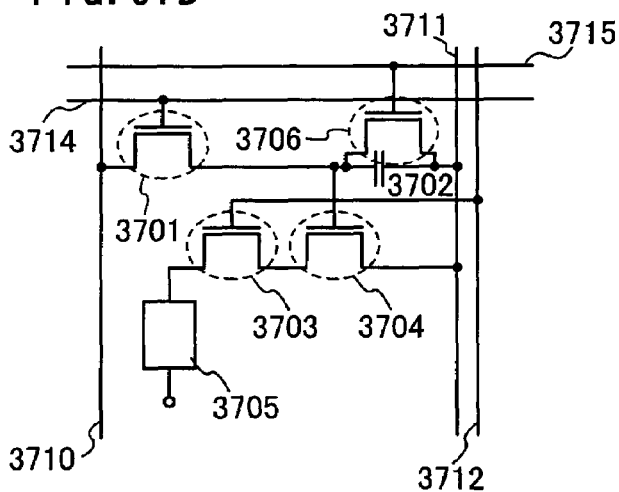
Figure 37E:
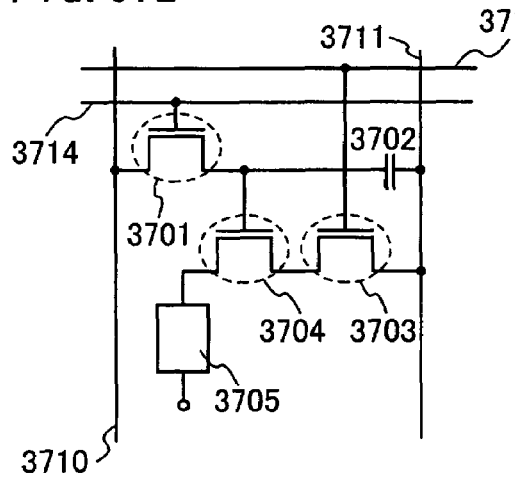

A pixel shown in FIG. 37E is different in the way that a gate electrode of a driving TFT 3703 is connected to a power supply line 3712 arranged in a row direction, but other than that, the pixel has a similar structure to the pixel shown in FIG. 37C. In other words, equivalent circuit diagrams of both of the pixels shown in FIGS. 37C and 37E are the same. However, each power supply line is formed using a conductive layer in a different layer when the power supply line 3712 is arranged in a column direction (FIG. 37C) and when the power supply line 3712 is arranged in a row direction (FIG. 37E). Here, a wiring connected to the gate electrode of the driving TFT 3703 is focused and the figures are separately shown in FIGS. 37C and 37E to show that the wirings are formed in different layers.

Note that the switching TFT 3701 operates in a linear region and the driving TFT 3703 operates in a saturation region. In addition, the driving TFT 3703 has a role of controlling the amount of electric current flowing through the light emitting element 3705, and the TFT 3704 operates in a saturation region and has a role of controlling supply of electric current to the light emitting element 3705.

Figure 37F:
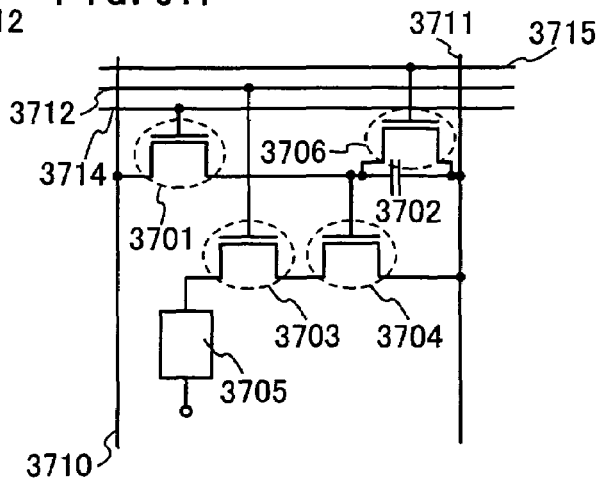

Pixels shown in FIGS. 37D and 37F has the same structure as the pixels shown in FIGS. 37C and 37E except that an erasing TFT 3706 and a scanning line 3715 are added.

Note that even the pixels shown in FIGS. 37A and 37B can perform CVCC operation. In the pixels having the operation structures shown in FIGS. 37C to 37F, Vdd and Vss can be appropriately changed as in the pixels shown in FIGS. 37A and 37B, depending on a current flowing direction through the light emitting element.

In the pixel having the above structure, the TFT 3704 operates in a linear region, so that slight variation in Vgs (gate-source voltage) of the TFT 3704 does not affect the amount of electric current of the light emitting element 3705. In other words, the amount of electric current of the light emitting element 3705 is determined by the driving TFT 3703 which operates in a saturation region. According to the above-described structure, luminance variation of the light emitting element, which is caused by variation in characteristics of the TFT, can be improved, and a display device with improved image quality can be provided.

It is preferable to make a semiconductor film of a driving TFT large specifically in the case of forming a thin film transistor having an amorphous semiconductor film or the like, since variation of the TFT can be reduced. Since the pixels shown in FIGS. 37A and 37B have a small number of TFTs, an aperture ratio can be increased.

The structure in which the capacitor element 3702 is provided is shown; however, the invention is not limited thereto. When a gate capacitor or the like can be used as the capacitor that can hold a video signal, the capacitor element 3702 may not be provided.

In the thin film transistor formed of an amorphous semiconductor film, a threshold value is easily shifted. Therefore, a circuit which compensates the threshold value is preferably provided in the pixel or in the periphery of the pixel.

Such an active matrix light emitting device is considered to be advantageous to low voltage driving when a pixel density is increased since each pixel is provided with TFTs. On the other hand, a passive matrix light emitting device in which TFTs are provided for every column can be formed. In the passive matrix light emitting device, TFTs are not provided for each pixel; therefore, a high aperture ratio can be obtained.

In the display device according to the invention, a driving method for screen display is not particularly limited. For example, a dot-sequential driving method, a line-sequential driving method, a plane-sequential driving method, or the like can be used as the driving method. Typically, the line-sequential driving method is employed, and a time gray scale driving method or an area gray scale driving method may appropriately be used. In addition, a video signal inputted to a source line of the display device may be an analog signal or a digital signal. A driving circuit or the like may appropriately be designed in accordance with the video signal.

As described above, various pixel circuits can be adopted.

Embodiment 5

Figure 9A:
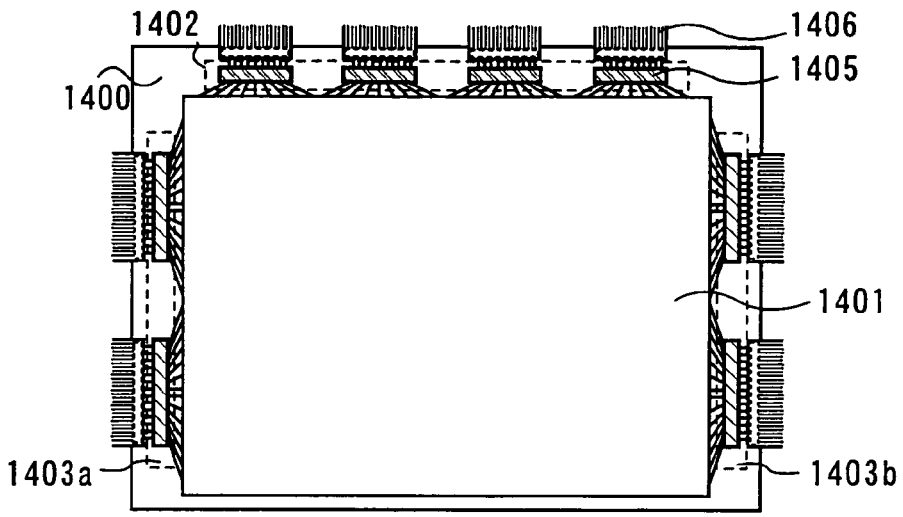
FIGS. 9A to 9C are top views showing a method for mounting a driver circuit of a display device according to the present invention.
Figure 9B:
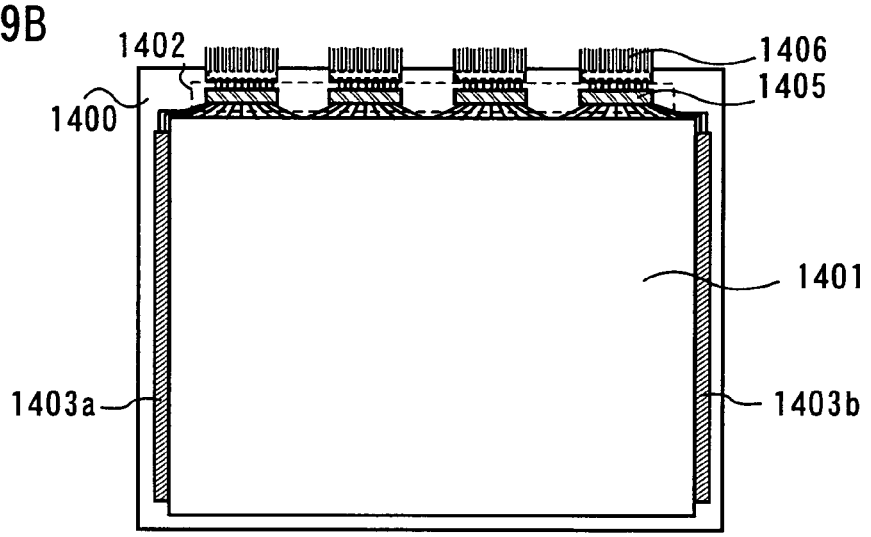
Figure 9C:
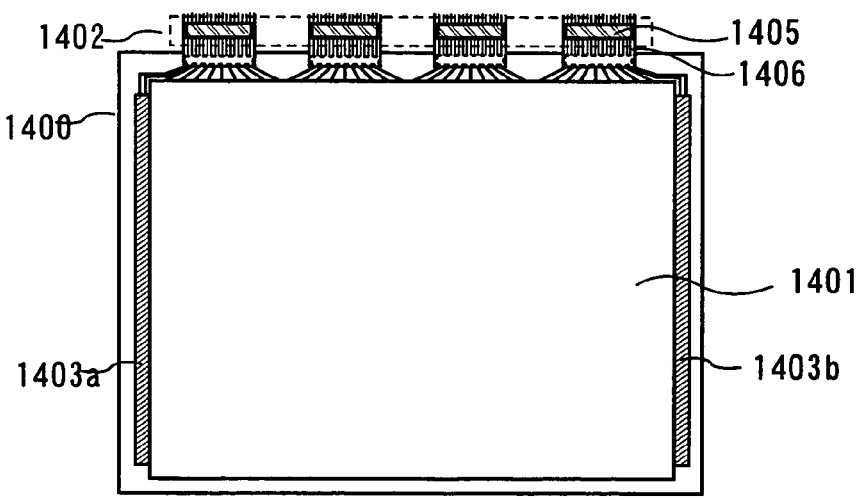

Mounting of driver circuits (a signal line driver circuit 1402 and scanning line driver circuits 1403*a* and 1403*b*) on the display panel described in the above embodiment is described in this embodiment with reference to FIGS. 9A to 9C.

As shown in FIG. 9A, the signal line driver circuit 1402 and the scanning line driver circuits 1403*a* and 1403*b* are mounted on the periphery of a pixel portion 1401. In FIG. 9A, an IC chip 1405 is mounted on a substrate 1400 by a COG method as the signal line driver circuit 1402, the scanning line driver circuits 1403*a* and 1403*b*, and the like. Then, the IC chip is connected to an external circuit through an FPC (flexible printed circuit) 1406.

As shown in FIG. 9B, in the case of forming a TFT of a SAS or a crystalline semiconductor, a pixel portion 1401, scanning line driver circuits 1403*a* and 1403*b*, and the like may be integrally formed over a substrate, and a signal line driver circuit 1402 and the like may be separately mounted as an IC chip. In FIG. 9B, an IC chip 1405 is mounted on a substrate 1400 by a COG method as the signal line driver circuit 1402. Then, the IC chip is connected to an external circuit through an FPC 1406.

Further, as shown in FIG. 9C, a signal line driver circuit 1402 and the like may be mounted by a TAB method instead of the COG method. Then, an IC chip is connected to an external circuit through an FPC 1406. In FIG. 9C, the signal line driver circuit is mounted by a TAB method; however, a scanning line driver circuit may be mounted by a TAB method.

When the IC chip is mounted by a TAB method, a pixel portion can be largely provided with respect to a substrate, and a frame can be narrowed.

The IC chip is formed using a silicon wafer, but an IC formed over a glass substrate (hereinafter referred to as a driver IC) may be provided in place of the IC chip. Since the IC chip is taken out of a circular silicon wafer, there is limitation on the shape of a mother substrate. On the other hand, the driver IC has a glass mother substrate and there is no limitation on the shape. Thus, productivity can be improved. Therefore, the geometry of the driver IC can be freely set. For example, when the driver IC is formed to have a long side of 15 mm to 80 mm in length, the necessary number of the driver ICs can be reduced compared with the case of mounting the IC chip. Accordingly, the number of connection terminals can be reduced and a yield in manufacturing can be improved.

The driver IC can be formed by using a crystalline semiconductor formed over a substrate, and the crystalline semiconductor may be formed by continuous wave laser light irradiation. A semiconductor film formed by continuous wave laser light irradiation has few crystal defects and has crystal grains with large grain diameters. Accordingly, a transistor having such a semiconductor film has favorable mobility and response speed and high-speed drive can be performed, which is suitable for the driver IC.

Embodiment 6

A method for mounting driver circuits (a signal line driver circuit 1402 and scanning line driver circuits 1403a and 1403b) on the display panel described in the above embodiment is described in this embodiment with reference to FIGS. 10A to 10D. A connection method with the use of an anisotropic conductive material, a wire bonding method, or the like may be employed as the mounting method, and an example thereof is described with reference to FIGS. 10A to 10D. Note that an example of using a driver IC as the signal line driver circuit 1402 and the scanning line driver circuits 1403a and 1403b is described in this embodiment. An IC chip can be appropriately used in place of the driver IC.

Figure 10A:
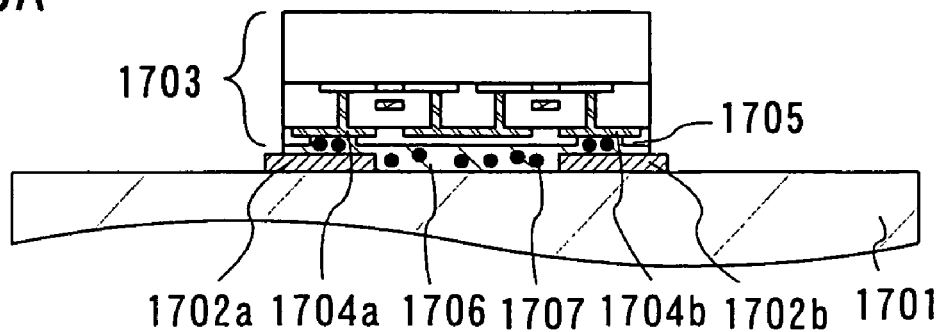
FIGS. 10A to 10D are cross-sectional views showing a method for mounting a driver circuit of a display device according to the present invention.

FIG. 10A shows an example in which a driver IC 1703 is mounted on an active matrix substrate 1701 by using an anisotropic conductive material. Each wiring such as a source wiring or a gate wiring (not shown) and electrode pads 1702a and 1702b of the wiring are formed over the active matrix substrate 1701.

Connection terminals 1704a and 1704b are provided on the surface of the driver IC 1703, and a protective insulating film 1705 is formed in the periphery thereof.

The driver IC 1703 is fixed to the active matrix substrate 1701 with an anisotropic conductive adhesive 1706. The connection terminals 1704a and 1704b and the electrode pads 1702a and 1702b are electrically connected to one another with conductive particles 1707 contained in the anisotropic conductive adhesive. The anisotropic conductive adhesive is an adhesive resin in which the conductive particles (with grain diameters of approximately 3 μm to 7 μm) are dispersed and contained. An epoxy resin, a phenol resin, and the like can be given as examples of the anisotropic conductive adhesive. The conductive particles (with grain diameters of approximately several μm to several hundred μm) are formed of an element of gold, silver, copper, palladium, and platinum, or alloy particles including the plural elements. Alternatively, particles having a multilayer structure of the above-mentioned elements may be used. Further, resin particles coated with one element of gold, silver, copper, palladium, and platinum or an alloy of the plural elements may also be used.

As a substitute for the anisotropic conductive adhesive, an anisotropic conductive film that is transferred to a base film can be used. The conductive particles similar to those in the anisotropic conductive adhesive are dispersed in the anisotropic conductive film. The size and concentration of the conductive particles 1707 mixed in the anisotropic conductive adhesive 1706 are adjusted adequately, so that the driver IC can be mounted on the active matrix substrate in this mode. This mounting method is suitable for methods for mounting the driver ICs in FIGS. 9A and 9B.

Figure 10B:
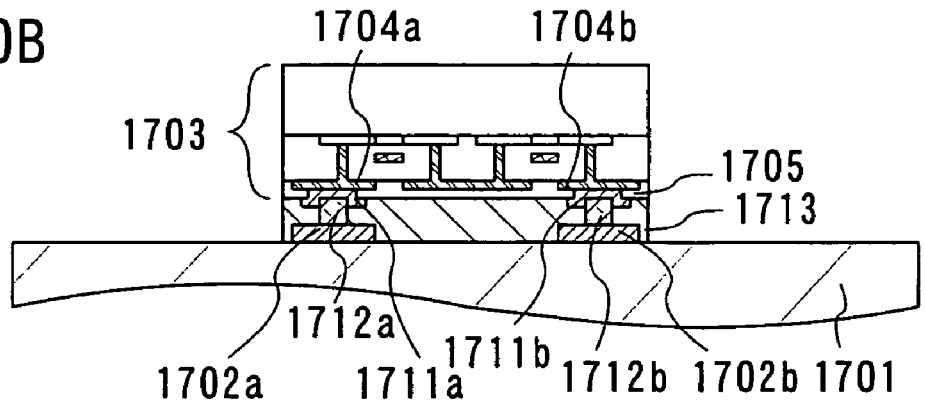

FIG. 10B shows an example of a mounting method that utilizes shrinkage of an organic resin. Buffer layers 1711a and 1711b are formed on the surface of connection terminals 1704a and 1704b of a driver IC by using Ta, Ti, or the like, and Au is formed to be approximately 20 μm in thickness thereover by an electroless plating method or the like so as to be bumps 1712a and 1712b. The driver IC can be mounted by interposing a light curable insulating resin 1713 between the driver IC and the active matrix substrate and by welding electrodes with pressure with the use of the shrinkage of the light curable resin. This mounting method is suitable for methods for mounting the driver ICs in FIGS. 9A and 9B.

Figure 10C:
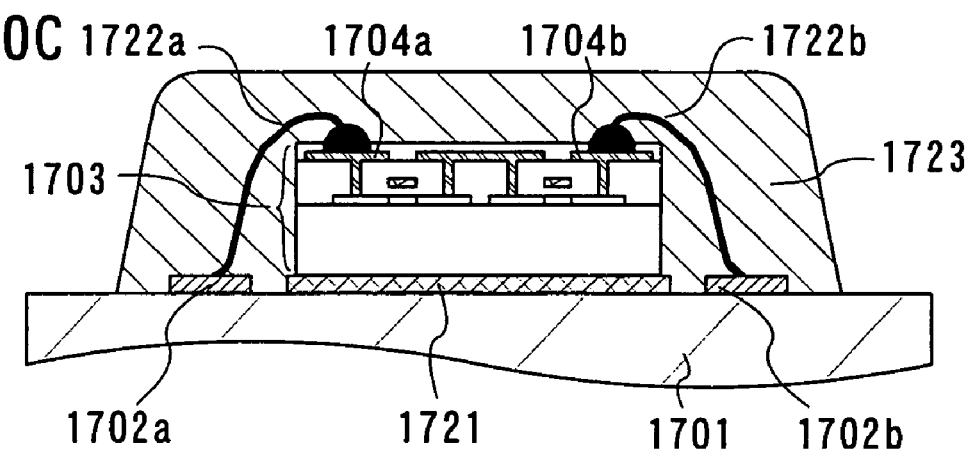

As shown in FIG. 10C, a driver IC 1703 may be fixed to an active matrix substrate 1701 by using an adhesive 1721, and connection terminals 1704a and 1704b of a CPU and electrode pads 1702a and 1702b over the wiring substrate are connected to each other by wirings 1722a and 1722b. Then, sealing is performed with an organic resin 1723. This mounting method is suitable for a method for mounting the driver IC in FIGS. 9A and 9B.

Figure 10D:
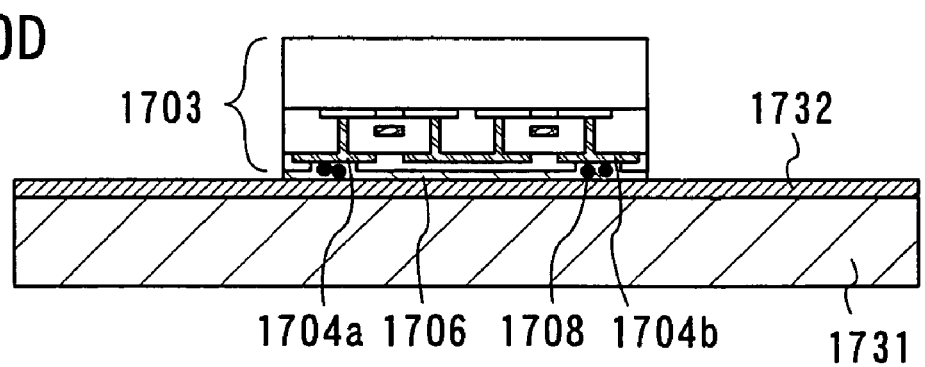

As shown in FIG. 10D, a driver IC 1703 may be provided over an FPC (flexible printed circuit) 1731 with a wiring 1732 and an anisotropic conductive adhesive 1706 containing conductive particles 1707 therebetween. This structure is extremely effective when used for an electronic device that is limited in the size of a chassis such as a portable terminal. This mounting method is suitable for a method for mounting the driver IC in FIG. 9C.

Note that a method for mounting the driver IC is not particularly limited thereto, and a known COG method, wire bonding method, TAB method, or reflow processing with the use of solder bumps can be employed. When reflow processing is performed, it is preferable that a substrate used for a driver IC or an active matrix substrate is formed of highly heat-resistant plastic, typically, a polyimide substrate, an HT substrate (manufactured by Nippon Steel Chemical Co., Ltd.), ARTON formed of a norbornene resin with a polar group (manufactured by JSR Corporation), or the like.

Embodiment 7

This embodiment describes a driver circuit in the case of forming a scanning line side driving circuit over a substrate 1400 as shown in FIGS. 9B and 9C by forming a semiconductor layer of a SAS in the light emitting display panel described in Embodiment 6.

Figure 14:
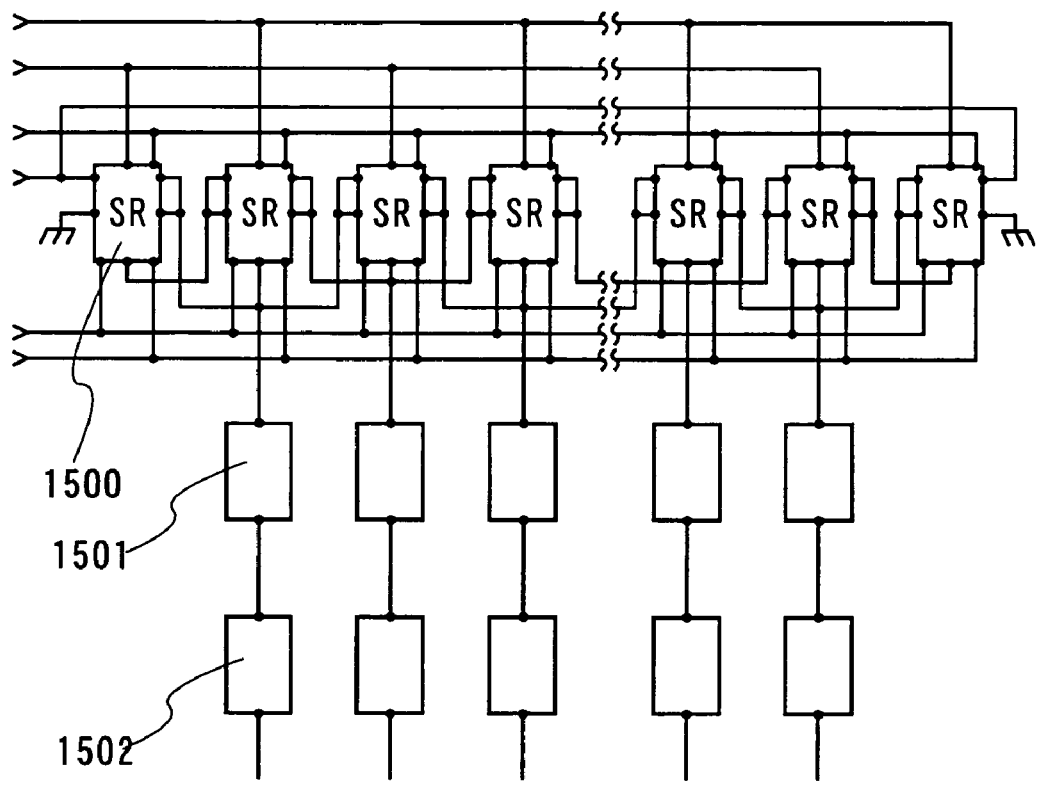
FIG. 14 shows a circuit configuration in the case of forming a scanning line side driver circuit by a TFT in a liquid crystal display panel according to the present invention.

FIG. 14 is a block diagram of a scanning line side driver circuit including an n-channel TFT using a SAS in which field effect mobility of 1 $cm^2/V \cdot sec$ to 15 $cm^2/V \cdot sec$ is obtained.

A block denoted by reference numeral 1500 in FIG. 14 corresponds to a pulse output circuit for outputting a sampling pulse for one stage, and a shift register includes n pulse output circuits. A pixel is connected at the end of buffer circuits 1501.

Figure 15:
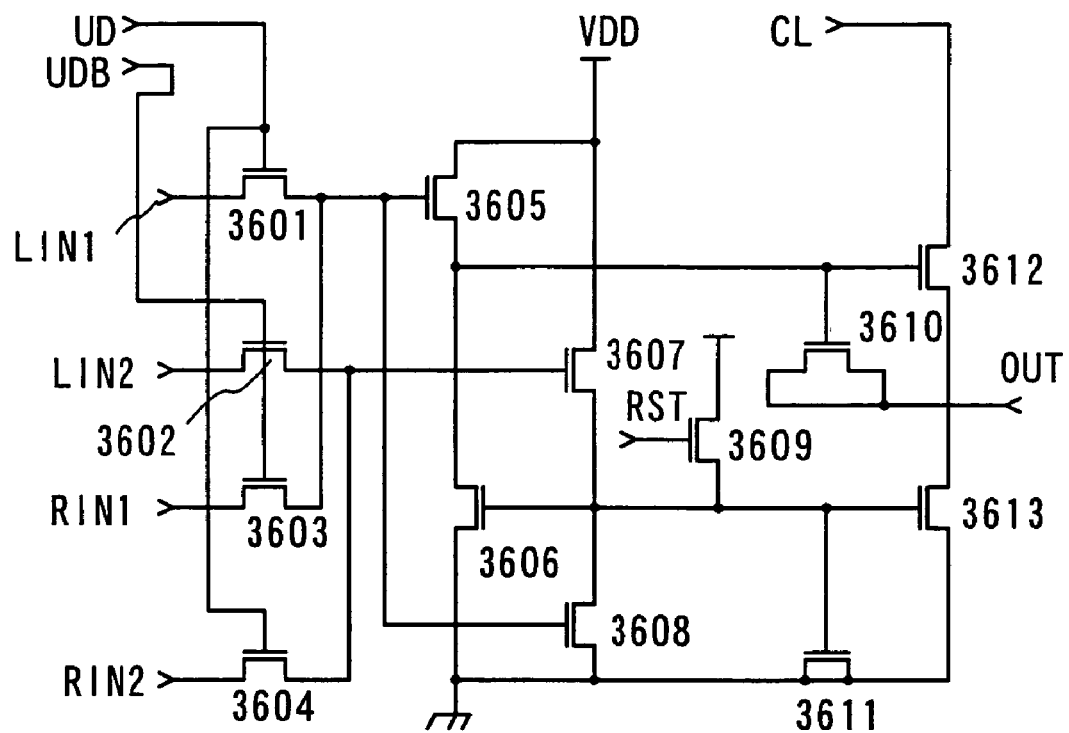
FIG. 15 shows a circuit configuration in the case of forming a scanning line side driver circuit by a TFT in a liquid crystal display panel according to the present invention (a shift register circuit).

FIG. 15 shows a specific structure of the pulse output circuit 1500, and the circuit includes n-channel TFTs 3601 to 3613. The size of the TFT may be determined in consideration of operating characteristics of the n-channel TFT using a SAS. When a channel length is set to be 8 μm, for example, a channel width can be set in the range of from 10 μm to 80 μm.

Figure 16:
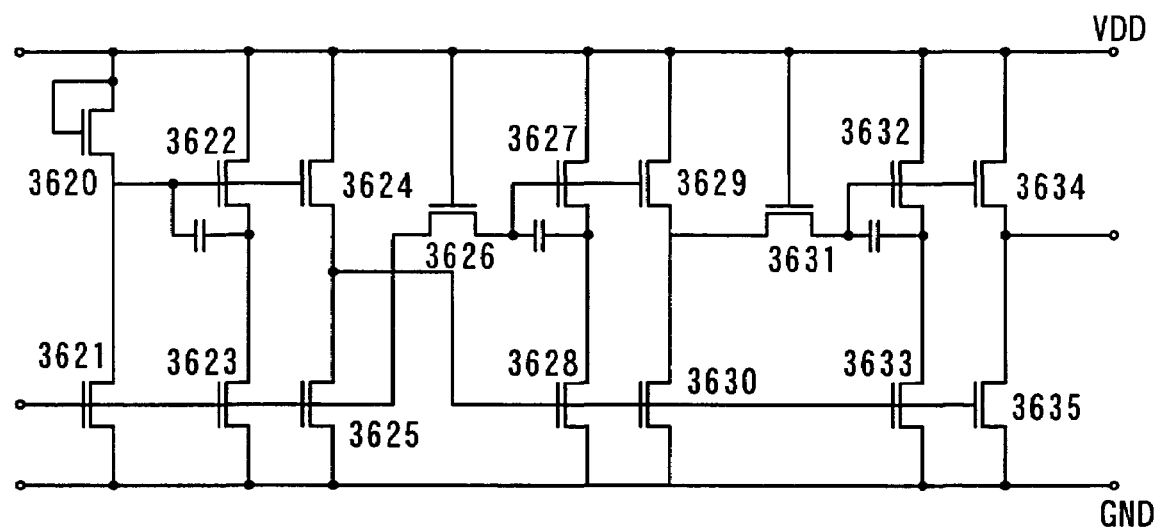
FIG. 16 shows a circuit configuration in the case of forming a scanning line side driver circuit by a TFT in a liquid crystal display panel according to the present invention (a buffer circuit).

FIG. 16 shows a specific structure of the buffer circuit 1501. The buffer circuit similarly includes n-channel TFTs 3621 to 3635. The size of the TFT may be determined in consideration of operating characteristics of the n-channel TFT using a SAS. When a channel length is set to be 10 μm, for example, a channel width can be set in the range of from 10 μm to 1800 μm.

Embodiment 8

Figure 26:
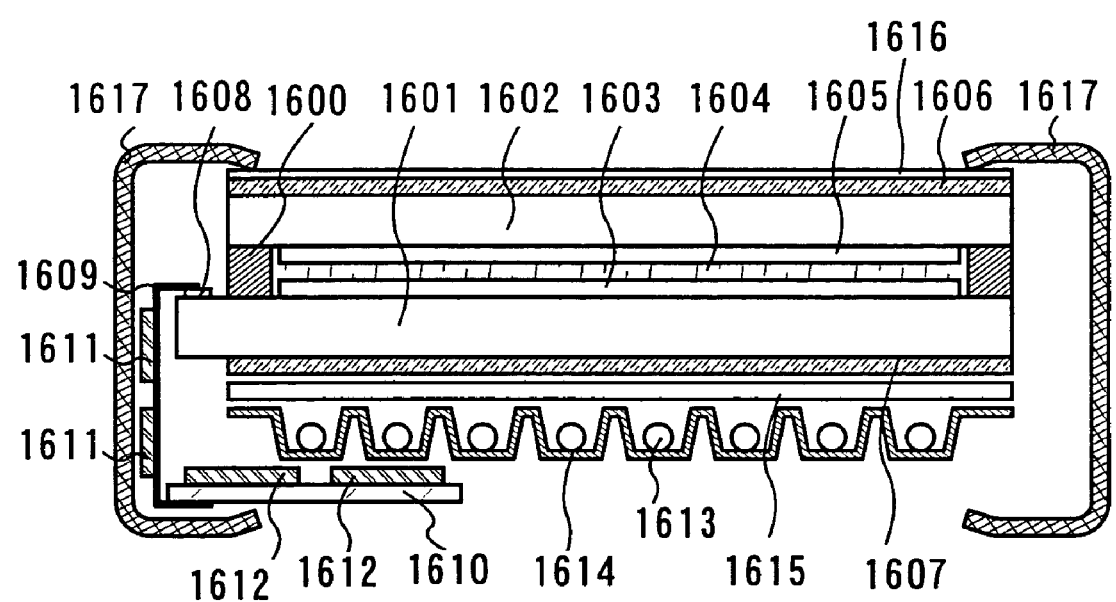
FIG. 26 shows a structure of a liquid crystal display module according to the present invention.

A display module is described in this embodiment. Here, a liquid crystal module is described as an example of a display module with reference to FIG. 26.

An active matrix substrate 1601 and an opposing substrate 1602 are fixed to each other with a sealant 1600, and a pixel portion 1603 and a liquid crystal layer 1604 are provided therebetween to form a display region.

A colored layer 1605 is necessary to perform color display. In the case of an RGB system, a colored layer corresponding to each color of red, green, and blue is provided corresponding to each pixel. Polarizing plates 1606 and 1607 are provided outside the active matrix substrate 1601 and the opposing substrate 1602. In addition, a protective film 1616 is formed on the surface of the polarizing plate 1606, which relieves impact from outside.

A connection terminal 1608 provided for the active matrix substrate 1601 is connected with a wiring substrate 1610 through an FPC 1609. The FPC or a connection wiring is provided with a pixel driver circuit (an IC chip, a driver IC, or the like) 1611, and an external circuit 1612 such as a control circuit or a power supply circuit is incorporated in the wiring substrate 1610.

A cold cathode fluorescent tube 1613, a reflecting plate 1614, and an optical film 1615 are a backlight unit and serve as a light source to project light on a liquid crystal display panel. The liquid crystal panel, the light source, the wiring substrate, the FPC, and the like are held and protected by a bezel 1617.

Note that any of Embodiment Modes 1 to 9 can be applied to this embodiment.

Embodiment 9

Figure 35B:
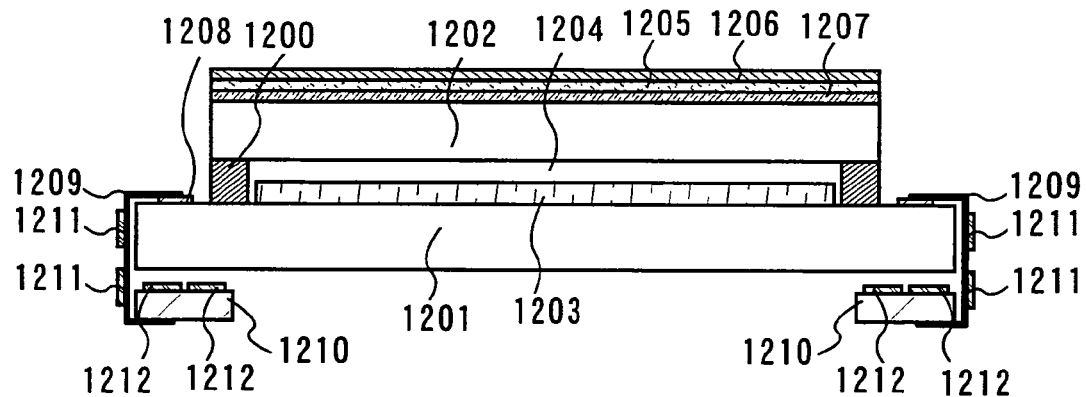
Figure 35C:
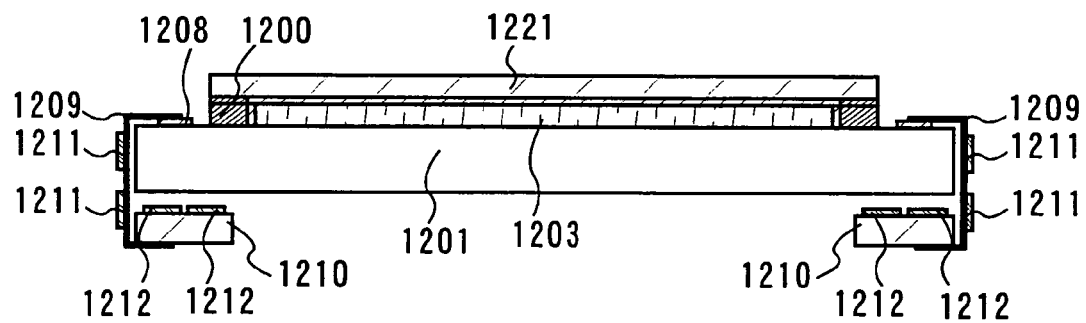

In this embodiment, a cross sectional view of a light emitting display module as an example of a display module is shown in FIGS. 35A to 35C.

FIG. 35A shows a cross section of a light emitting display module in which an active matrix substrate 1201 and an opposing substrate 1202 are fixed to each other with a sealant 1200. A pixel portion 1203 is provided therebetween to form a display region.

A space 1204 is provided between the opposing substrate 1202 and the pixel portion 1203. The entry of moisture or oxygen can be further prevented by filling the space with an inert gas, for example, a nitrogen gas or forming a light-transmitting resin having a highly water absorbing material in the space. Alternatively, a light-transmitting and highly water absorbing resin may be formed. Even when light from a light emitting element is emitted to a second substrate side, a light emitting display module can be formed without decreasing transmittance due to a light-transmitting resin.

In addition, at least a pixel portion of a module is preferably provided with a polarizing plate or a circularly polarizing plate (a polarizing plate, a quarter-wave plate, and a half-wave plate) to enhance contrast. When display is recognized from the opposing substrate 1202 side, a quarter-wave plate and a half-wave plate 1205, and a polarizing plate 1206 may be sequentially provided over the opposing substrate 1202. Further, an anti-reflective film may be provided over the polarizing plate.

When display is recognized from both sides, the opposing substrate 1202 side and the active matrix substrate 1201 side, the surface of the active matrix substrate is preferably provided with a quarter-wave plate and a half-wave plate, and a polarizing plate in the same manner.

A connection terminal 1208 provided for the active matrix substrate 1201 is connected with a wiring substrate 1210 through an FPC 1209. The FPC or a connection wiring is provided with a pixel driver circuit 1211 (an IC chip, a driver IC, or the like), and an external circuit 1212 such as a control circuit or a power supply circuit is incorporated in the wiring substrate 1210.

As shown in FIG. 35B, a colored layer 1207 can be provided between a pixel portion 1203 and a polarizing plate or between the pixel portion and a circularly polarizing plate. In this case, full color display can be performed by providing the pixel portion with a light emitting element which can emit white light and by separately providing with colored layers showing RGB. In addition, full color display can be performed by providing the pixel portion with a light emitting element which can emit blue light and by separately providing a color conversion layer or the like. In addition, each pixel portion can be provided with light emitting elements which emit red, green, and blue light, and the colored layer can be used. Such a display module has high color purity of each RBG and can perform high-definition display.

FIG. 35C shows the case of sealing an active matrix substrate and a light emitting element with the use of a protective film 1221 of a film, a resin, or the like without using an opposing substrate, different from FIG. 35A. The protective film 1221 is provided to cover a pixel electrode in a pixel portion 1203. As the protective film, an organic material such as an epoxy resin, a urethane resin, or a silicone resin can be used. In addition, the protective film may be formed by dropping a polymer material with a droplet discharge method. In this embodiment, an epoxy resin is discharged using a dispenser and is dried. Further, an opposing substrate may be provided over the protective film. The rest of the structure is similar to that of FIG. 35A.

A display device can be reduced in weight, size, and thickness by sealing without using an opposing substrate as described above.

In the module of this embodiment, the wiring substrate 1210 is mounted with the use of the FPC 1209; however, the invention is not necessarily limited to the structure. The pixel driver circuit 1211 and the external circuit 1212 may be directly mounted on the substrate by using a COG (Chip on Glass) method.

Note that any of Embodiment Modes 1 to 9 can be applied to this embodiment. A liquid crystal display module and a light emitting display module are described as a display module in this embodiment; however, the invention is not limited thereto. The invention can be appropriately applied to a display module such as a DMD (Digital Micromirror Device), a PDP (Plasma Display Panel), a FED (Field Emission Display), an electrophoretic display device (electronic paper), and the like.

Embodiment 10

Figure 38A:
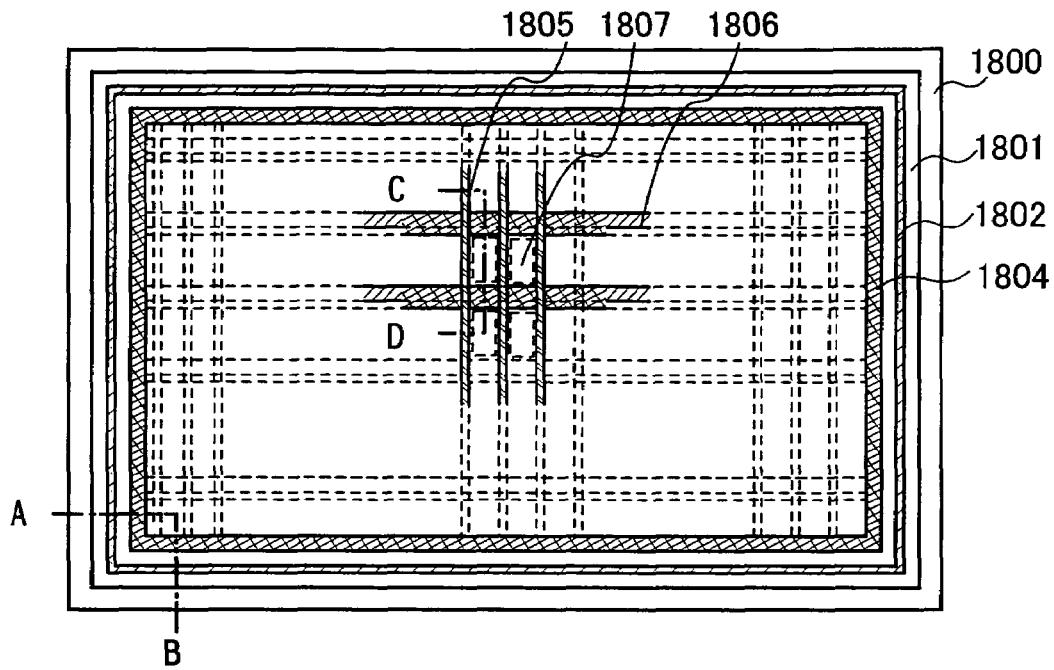
FIGS. 38A to 38C are a top view and cross-sectional views showing a structure of a light emitting display panel of the present invention.
Figure 38B:
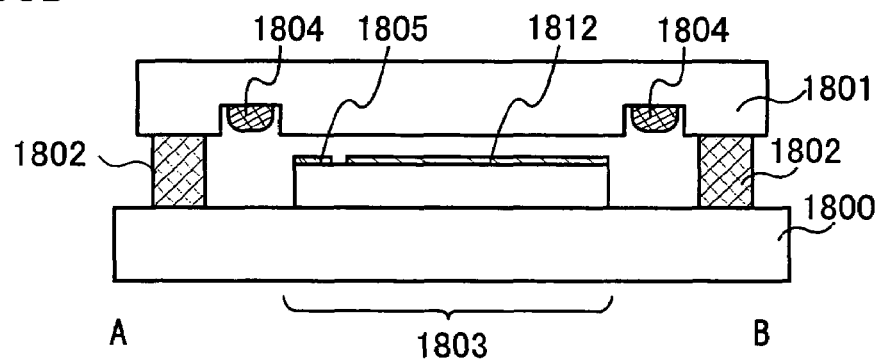
Figure 38C:
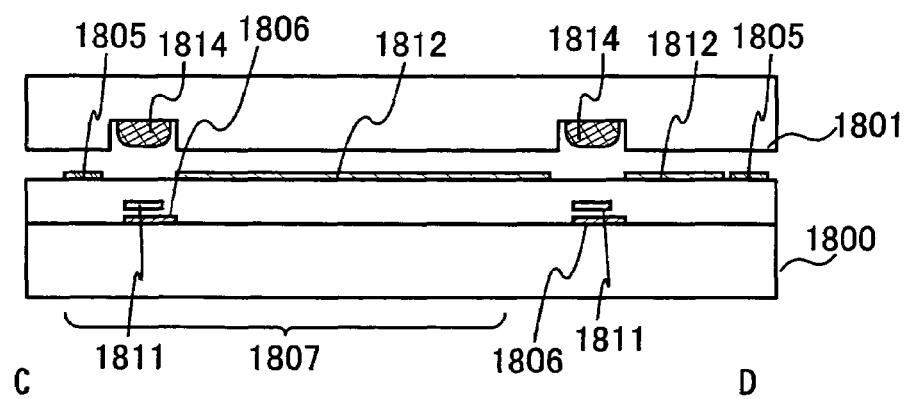

A drying agent of the display panel described in the above embodiment is described in this embodiment with reference to FIGS. 38A to 38C.

FIG. 38A is a surface view of a display panel. FIG. 38B is a cross-sectional view taken along line A-B in FIG. 38A, and FIG. 38C is a cross-sectional view taken along line C-D in FIG. 38A.

As shown in FIG. 38A, an active matrix substrate 1800 and an opposing substrate 1801 are sealed with a sealant 1802. A pixel region is provided between the active matrix substrate and the opposing substrate. The pixel region is provided with a pixel 1807 in a region at the intersection of a source wiring 1805 and a gate wiring 1806. A drying agent 1804 is provided between the pixel region and the sealant 1802. In the pixel region, a drying agent 1814 is provided over the gate wiring or the source wiring. Here, the drying agent 1814 is provided over the gate wiring, but it can be provided over the gate wiring and the source wiring.

It is preferable to use a substance that adsorbs water ($H_2O$) by chemical adsorption like oxide of alkaline earth metal such as calcium oxide (CaO) or barium oxide (BaO) as the drying agent 1804. However, not limiting thereto, a substance that adsorbs water by physical adsorption such as zeolite or silica gel can also be used.

The drying agent can be fixed to the substrate with a granular drying agent contained in a highly moisture permeable resin. As the highly moisture permeable resin, an acrylic resin can be used, such as ester acrylate, ether acrylate, ester urethane acrylate, ether urethane acrylate, butadiene urethane acrylate, special urethane acrylate, epoxy acrylate, amino resin acrylate, or acrylic resin acrylate. In addition, an epoxy resin can be used, such as a bisphenol A type liquid resin, a bisphenol A type solid resin, a resin containing bromo-epoxy, a bisphenol F type resin, a bisphenol AD type resin, a phenol type resin, a cresol type resin, a novolac type resin, a cyclic aliphatic epoxy resin, an epibis type epoxy resin, a glycidyl ester resin, a glycidyl amine resin, a heterocyclic epoxy resin, or a modified epoxy resin. In addition, other substances may be used. For example, an inorganic substance such as siloxane, or the like may be used.

Further, a solidified solution in which a molecule that can absorb water by chemical absorption is mixed in an organic solvent, or the like can be used as a water absorbing substance.

Note that a more highly moisture permeable substance than a substance used as the sealant is preferably selected as the highly moisture permeable resin or the inorganic substance.

In the light emitting device according to the invention as described above, external water mixed in the light emitting device can be absorbed before the water reaches a region provided with a light emitting element. Accordingly, the deterioration of an element provided for the pixel, typically, a light emitting element due to water can be suppressed.

As shown in FIG. 38B, the drying agent 1804 is provided between the sealant 1802 and the pixel region 1803 in the periphery of the display panel. In addition, the display panel can be thinned by providing the opposing substrate or the active matrix substrate with a depression and providing the depression with the drying agent 1804.

As shown in FIG. 38C, a semiconductor region 1811 that is part of a semiconductor element for driving a display element, a gate wiring 1806, a source wiring 1805, and a pixel electrode 1812 are formed in the pixel 1807. In the pixel portion of a display panel, the drying agent 1814 is provided for a region of the opposing substrate overlapped with the gate wiring 1806. The gate wiring is two to four times as wide as the source wiring. Therefore, an aperture ratio is not decreased by providing the drying agent 1814 over the gate wiring 1806 that is a non display region, and entry of moisture into the display element and the deterioration caused thereby can be suppressed. In addition, a display panel can be thinned by providing the opposing substrate with a depression and providing the depression with the drying agent.

Embodiment 11

According to the invention, it is possible to form a semiconductor device having a circuit in which semiconductor elements with a minute structure are highly integrated, typically, a signal line driver circuit, a controller, a CPU, a converter of an audio processing circuit, a power supply circuit, a transmit and receive circuit, a memory, an amplifier of an audio processing circuit, or the like. Further, a system-on-chip can be manufactured, in which circuits such as an MPU (microcomputer), a memory, and an I/O interface constituting a system (function circuit) are mounted on one chip in monolithic, and which can realize high speed, high reliability, and low power consumption.

Embodiment 12

Various electronic devices can be manufactured by incorporating the semiconductor device described in the above embodiment into a chassis. Examples of electronic devices can be given as follows: a television set, a camera such as a video camera or a digital camera, a goggle type display (head mounted display), a navigation system, an audio reproducing device (a car audio, an audio component, or the like), a personal computer, a game machine, a personal digital assistant (a mobile computer, a cellular phone, a portable game machine, an electronic book, or the like), an image reproducing device including a recording medium (specifically, a device capable of processing data in a recording medium such as a Digital Versatile Disc (DVD) and having a display that can display the image of the data), and the like. Here, a television set and a block diagram thereof are shown in FIG. 12 and FIG. 11, respectively and a digital camera is shown in FIG. 13 as typical examples of the electronic devices.

Figure 11:
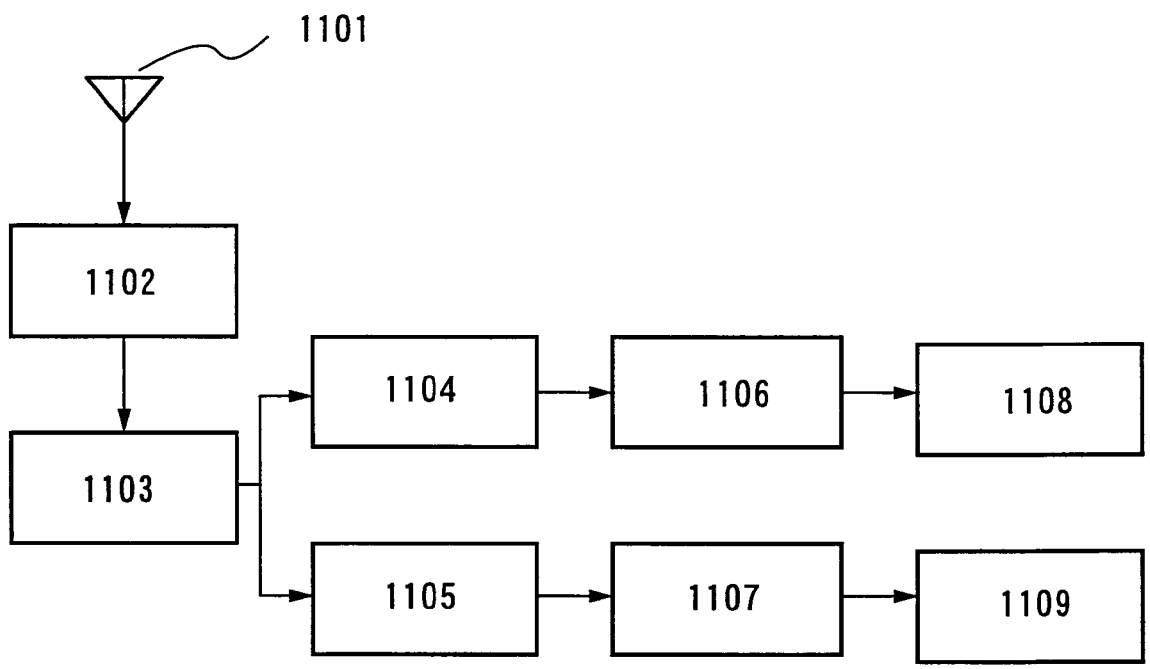
FIG. 11 is a block diagram showing a structure of an electronic device.
Figure 12:
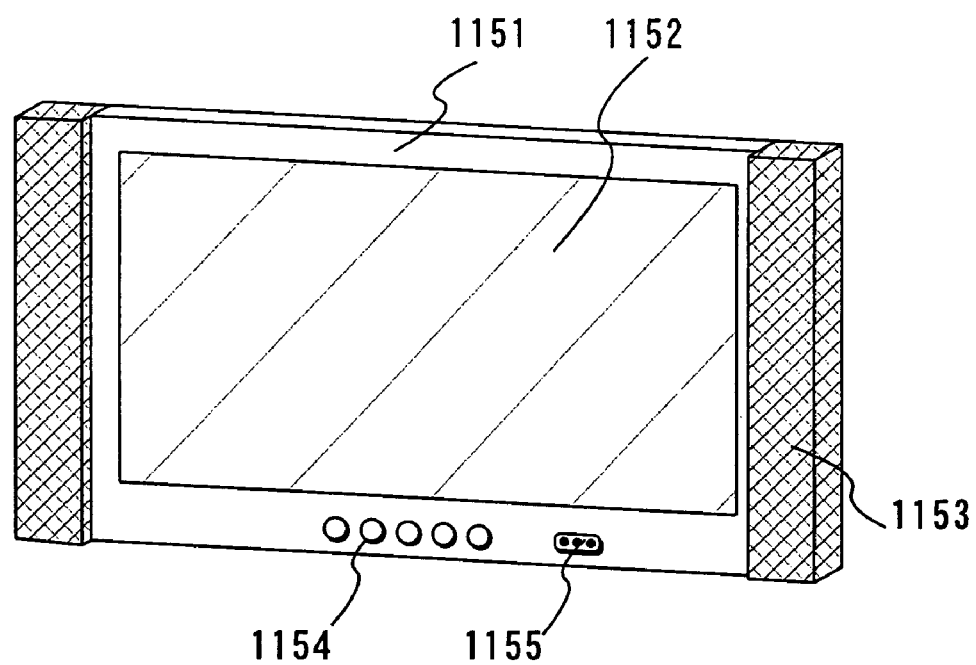
FIG. 12 shows an example of electronic devices.

FIG. 11 is a block diagram showing a general structure of a television set that receives analog television broadcasting. In FIG. 11, the airwaves for television broadcasting received by an antenna 1101 are inputted to a tuner 1102. The tuner 1102 generates and outputs intermediate frequency (IF) signals by mixing the high frequency television signals inputted from the antenna 1101 with local repetition frequency signals that are controlled in accordance with the desired reception frequency.

The IF signals taken out by the tuner 1102 are amplified to the required voltage by an intermediate frequency amplifier (IF amplifier) 1103. Thereafter, the amplified IF signals are detected by a image detection circuit 1104 and an audio detection circuit 1105. The image signals outputted from the image detection circuit 1104 are separated into luminance signals and chrominance signals by an image processing circuit 1106. Further, the luminance signals and the chrominance signals are subjected to the predetermined image signal processing to be image signals, so that the image signals are outputted to an image output portion 1108 of a display device that is a semiconductor device of the invention, typically, a liquid crystal display device, a light emitting device, a DMD (digital micromirror device), a PDP (plasma display panel), an FED (field emission display), an electrophoretic display device (an electronic paper), or the like. Note that the one using a liquid crystal display device as a display device is a liquid crystal television, and the one using a light emitting display device is an EL television. The same applies to the case of using another display device.

The signals outputted from the audio detection circuit 1105 are subjected to processing such as FM demodulation in an audio processing circuit 1107 to be audio signals. The audio signals are then amplified appropriately to be outputted to an audio output portion 1109 of a speaker or the like.

The television set according to the invention may be applicable to digital broadcastings such as terrestrial digital broadcasting, cable digital broadcasting, and BS digital broadcasting as well as analog broadcastings such as terrestrial broadcasting in a VHF band, a UHF band, or the like, cable broadcasting, and BS broadcasting.

FIG. 12 is a front perspective view of the television set, which includes a chassis 1151, a display portion 1152, a speaker portion 1153, an operational portion 1154, a video input terminal 1155, and the like. The television set shown in FIG. 12 has the structure as shown in FIG. 11.

The display portion 1152 is an example of the image output portion 1108 in FIG. 11, which displays images.

The speaker portion 1153 is an example of the audio output portion in FIG. 11, which outputs sound.

The operational portion 1154 is provided with a power source switch, a volume switch, a channel select switch, a tuning switch, a selection switch, and the like to turn on and off the television set, select images, control sound, select a tuner, and the like, respectively by holding the switches down. Note that the above-described selections can be carried out also by a remote-control operation unit, though not shown in the drawing.

The video input terminal 1155 inputs image signals into the television set from an external portion such as a VTR, a DVD, or a game machine.

In the case of a wall-mounted television set, a portion for hanging on walls is provided on the rear of the body thereof.

A television set can be manufactured at low cost with high throughput and yield by applying the display device that is an example of a semiconductor device according to the invention to the display portion of the television set. In addition, a television set can be manufactured at low cost with high throughput and yield by applying a semiconductor device according to the invention to a CPU for controlling an image detection circuit, an image processing circuit, an audio detection circuit, and an audio processing circuit of a television set. Consequently, such a television is widely applicable particularly to large area display mediums such as wall-mounted television set, information display boards used in railway stations, airports, and the like, and advertisement display boards on the streets.

Figure 13A:
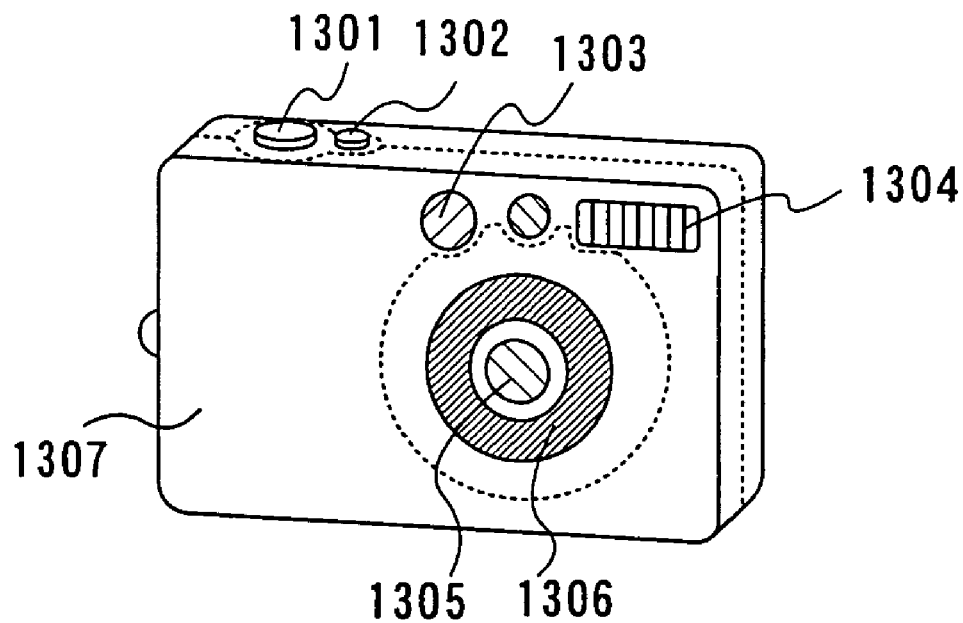
FIGS. 13A and 13B show an example of electronic devices.
Figure 13B:
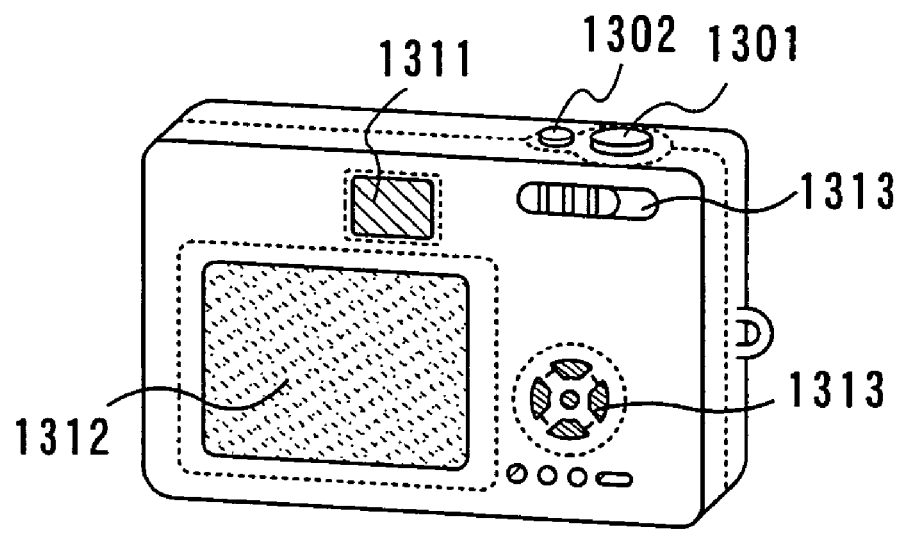

FIGS. 13A and 13B show an example of a digital camera. FIG. 13A is a front perspective view of the digital camera, and FIG. 13B is a rear perspective view thereof. In FIG. 13A, a digital camera is provided with a release button 1301, a main switch 1302, a viewfinder window 1303, flash 1304, a lens 1305, a lens barrel 1306, and a chassis 1307.

In FIG. 13B, the digital camera is provided with a viewfinder eyepiece 1311, a monitor 1312, and an operational button 1313.

When the release button 1301 is held halfway down, a focus adjustment mechanism and an exposure adjustment mechanism are operated. Subsequently, holding the release button all the way down releases a shutter.

The digital camera is turned on or off by pressing or rotating the main switch 1302.

The viewfinder window 1303 is disposed above the lens 1305 on the front face of the digital camera, and is used to check a shooting range and a focusing point through the viewfinder eyepiece shown in FIG. 13B.

The flash 1304 is disposed at the upper portion of the front face of the digital camera body. In the case of photographing a subject of the low luminance level, auxiliary light is emitted simultaneously when the release button is held down and the shutter is released.

The lens 1305 is disposed on the front of the digital camera. The lens is made of a focusing lens, a zoom lens, and the like. An optical shooting system includes the lens along with a shutter and an aperture, which are not shown in the drawing. An image sensing device such as a CCD (charge coupled device) is provided at the rear of the lens.

The lens barrel 1306 is used for shifting the lens position to focus the focusing lens, the zoom lens, and the like on a subject. When taking a picture, the lens barrel is protruded from the body so that the lens 1305 is shifted toward a subject. When carrying the digital camera, the lens 1305 is stored inside the main body to be reduced in size. Note that, although the lens can be zoomed in to enlarge a subject by shifting the lens barrel in this embodiment, the invention is not limited to the structure. The invention is applicable to a digital camera that can take close-up pictures without zooming a lens due to a structure of an optical shooting system inside the chassis 1307.

The viewfinder eyepiece 1311 is provided at the upper portion of the rear of the digital camera, through which the shooting range and the focusing point are checked by sight.

The operational button 1313 is a button for various kinds of functions and is provided on the rear of the digital camera. The operational button includes a setup button, a menu button, a display button, a functional button, a selection button, and the like.

A digital camera can be manufactured at low cost with high throughput and yield by applying the display device that is one embodiment of a semiconductor device according to the invention to a monitor of the digital camera. A digital camera can be manufactured at low cost with high throughput and yield by applying the semiconductor device according to the invention to a CPU for processing in response to input operation of various functional buttons, a main switch, a release button, and the like, a CPU for controlling various circuits such as a circuit for autofocusing and autofocusing adjustment, a timing control circuit for controlling electric flash drive and CCD drive, an imaging circuit for generating an image signal from a signal that is photoelectrically converted by an imaging device such as a CCD, an A/D converter circuit for converting an image signal generated in an imaging circuit into a digital signal, and a memory interface for writing and reading image data in a memory, and the like.

What is claimed is:

1. A method for forming a film pattern, comprising the steps of:
    forming a first film pattern over a substrate;
    forming a second film pattern which is curved on the surface of the first film pattern;
    irradiating the second film pattern with light to condense the light;
    generating heat by irradiating the first film pattern with the condensed light;
    modifying the second film pattern by the heat;
    forming a third film pattern by removing an unmodified region of the second film pattern; and
    forming a fourth film pattern by etching the first film pattern using the third film pattern as a mask.

2. The method for forming the film pattern according to claim 1, wherein the second film pattern is formed of a thermosetting material.

3. The method for forming the film pattern according to claim 1, wherein the first film pattern absorbs light.

4. The method for forming the film pattern according to claim 1, wherein the second film pattern transmits light.

5. The method for forming the film pattern according to claim 1, wherein the light is emitted from the side of the second film pattern.

6. A method for forming a film pattern, comprising the steps of:
    forming a first film pattern over a substrate;
    forming a second film pattern which is curved on the surface of the first film pattern;
    irradiating the second film pattern with light to condense the light;
    generating heat by irradiating the first film pattern with condensed light;
    modifying the second film pattern by the heat;
    forming a third film pattern by removing the modified region; and forming a fourth film pattern by etching the first film pattern using the third film pattern as a mask.

7. The method for forming the film pattern according to claim 6, wherein the second film pattern is formed of a thermoplastic material.

8. The method for forming the film pattern according to claim 6, wherein the first film pattern absorbs light.

9. The method for forming the film pattern according to claim 6, wherein the second film pattern transmits light.

10. The method for forming the film pattern according to claim 6, wherein the light is emitted from the side of the second film pattern.

11. A method for forming a film pattern, comprising the steps of:
   forming a first film pattern over a substrate;
   forming a second film pattern which is curved on the surface of the first film pattern by a droplet discharge method;
   irradiating the second film pattern with light to condense the light;
   generating heat by irradiating the first film pattern with the condensed light;
   modifying the second film pattern by the heat;
   forming a third film pattern by removing an unmodified region of the second film pattern; and
   forming a fourth film pattern by etching the first film pattern using the third film pattern as a mask.

12. The method for forming the film pattern according to claim 11, wherein the first film pattern absorbs light.

13. The method for forming the film pattern according to claim 11, wherein the second film pattern transmits light.

14. The method for forming the film pattern according to claim 11, wherein the fourth film pattern has a width of 0.1 μm to 10 μm.

15. The method for forming the film pattern according to claim 11, wherein the light is emitted from a lamp.

16. The method for forming the film pattern according to claim 11, wherein the light is emitted from a laser oscillator.

17. The method for forming the film pattern according to claim 11, wherein the first film pattern is formed of a negative-type photosensitive material.

18. A method for forming a film pattern, comprising the steps of:
   forming a first film pattern over a substrate;
   forming a second film pattern which is curved on the surface of the first film pattern by a droplet discharge method;
   irradiating the second film pattern with light to condense the light;
   generating heat by irradiating the first film pattern with the condensed light;
   modifying the second film pattern by the heat;
   forming a third film pattern by removing the modified region of the second film pattern; and
   forming a fourth film pattern by etching the first film pattern using the third film pattern as a mask.

19. The method for forming the film pattern according to claim 18, wherein, the first film pattern is formed of a positive-type photosensitive material.

20. The method for forming the film pattern according to claim 18, wherein the first film pattern absorbs light.

21. The method for forming the film pattern according to claim 18, wherein the second film pattern transmits light.

22. The method for forming the film pattern according to claim 18, wherein the fourth film pattern has a width of 0.1 μm to 10 μm.

23. The method for forming the film pattern according to claim 18, wherein the light is emitted from a lamp.

24. The method for forming the film pattern according to claim 18, wherein the light is emitted from a laser oscillator.

25. A method for manufacturing a semiconductor device comprising a gate electrode, a gate insulating film, a semiconductor region, a source electrode and a drain electrode, comprising the steps of:
   forming a light absorbing conductive film over a substrate;
   forming a first film pattern which is curved and transmits light on the surface of the conductive film;
   irradiating the first film pattern with light to condense the light;
   generating heat by irradiating the conductive film with the condensed light;
   modifying the first film pattern by the heat;
   forming a second film pattern by removing an unmodified region of the first film pattern;
   forming the gate electrode by etching the conductive film using the second film pattern as a mask.

26. The method for manufacturing the semiconductor device according to claim 25, wherein the light is emitted from a lamp.

27. The method for manufacturing the semiconductor device according to claim 25, wherein the light is emitted from a laser oscillator.

28. The method for manufacturing the semiconductor device according to claim 25, wherein the second film pattern is formed of a thermosetting material.

29. The method for manufacturing the semiconductor device according to claim 25, wherein the gate electrode has a width of 0.1 μm to 10 μm.

30. The method for manufacturing the semiconductor device according to claim 25, wherein the gate electrode is formed over the semiconductor region.

31. The method for manufacturing the semiconductor device according to claim 25, wherein the gate electrode is formed under the semiconductor region.

32. A method for manufacturing a semiconductor device comprising the steps of:
   forming a light absorbing conductive film over a substrate;
   forming a first film pattern which is curved and transmits light on the surface of the conductive film or the substrate;
   irradiating the first film pattern with light to condense the light;
   generating heat by irradiating the conductive film with the condensed light;
   modifying the first film pattern by the heat;
   forming a second film pattern by removing the modified region of the first film pattern;
   forming a source electrode and a drain electrode by etching the conductive film using the second film pattern; and
   forming a semiconductor region, a gate insulating film, and a gate electrode over the source electrode and the drain electrode.

33. The method for manufacturing the semiconductor device according to claim 32, wherein the second film pattern is formed of a thermoplastic material.

34. The method for manufacturing the semiconductor device according to claim 32, wherein a space between the source electrode and the drain electrode is 0.1 μm to 10 μm.

35. The method for manufacturing the semiconductor device according to claim 32, wherein the light is emitted from a lamp.

36. The method for manufacturing the semiconductor device according to claim 32, wherein the light is emitted from a laser oscillator.

37. A method for manufacturing a semiconductor device comprising a gate electrode, a gate insulating film, a semiconductor region, a source electrode and a drain electrode, comprising the steps of:
- forming a light absorbing conductive film over a substrate;
- forming a first film pattern which is curved and transmits light on the surface of the conductive film by a droplet discharge method;
- irradiating the first film pattern with light to condense the light;
- generating heat by irradiating the conductive film with the condensed light;
- modifying the first film pattern by the heat;
- forming a second film pattern by removing an unmodified region of the first film pattern; and
- forming the gate electrode by etching the conductive film using the second film pattern as a mask.

38. The method for manufacturing the semiconductor device according to claim 37, wherein the light is emitted from a lamp.

39. The method for manufacturing the semiconductor device according to claim 37, wherein the light is emitted from a laser oscillator.

40. The method for manufacturing the semiconductor device according to claim 37, wherein the first film pattern is formed of a negative-type photosensitive material.

41. The method for manufacturing the semiconductor device according to claim 37, wherein the gate electrode has a width of 0.1 .mu.m to 10 .mu.m.

42. The method for manufacturing the semiconductor device according to claim 37, wherein the gate electrode is formed over the semiconductor region.

43. The method for manufacturing the semiconductor device according to claim 37, wherein the gate electrode is formed under the semiconductor region.

44. A method for manufacturing a semiconductor device, comprising the steps of:
- forming a light absorbing conductive film over a substrate;
- forming a first film pattern which is curved and transmits light on the surface of the conductive film by a droplet discharge method;
- irradiating the first film pattern with light to condense the light;
- generating heat by irradiating the conductive film with the condensed light;
- modifying the first film pattern by the heat;
- forming a second film pattern by removing the modified region of the first film pattern;
- forming a source electrode and a drain electrode by etching the conductive film using the second film pattern; and
- forming a gate insulating film, a semiconductor region, and a gate electrode over the source electrode and the drain electrode.

45. The method for manufacturing the semiconductor device according to claim 44, wherein the first film pattern is formed of a positive-type photosensitive material.

46. The method for manufacturing the semiconductor device according to claim 44, wherein a space between the source electrode and the drain electrode is 0.1 μm to 10 μm.

47. The method for manufacturing the semiconductor device according to claim 44, wherein the light is emitted from a lamp.

48. The method for manufacturing the semiconductor device according to claim 44, wherein the light is emitted from a laser oscillator.

* * * * *